United States Patent
Ko et al.

(10) Patent No.: US 10,116,416 B2
(45) Date of Patent: *Oct. 30, 2018

(54) APPARATUS FOR TRANSMITTING AND RECEIVING A SIGNAL AND METHOD OF TRANSMITTING AND RECEIVING A SIGNAL

(71) Applicant: LG ELECTRONICS INC., Seoul (KR)

(72) Inventors: Woo Suk Ko, Seoul (KR); Sang Chul Moon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/480,891

(22) Filed: Apr. 6, 2017

(65) Prior Publication Data
US 2017/0214490 A1 Jul. 27, 2017

Related U.S. Application Data

(63) Continuation of application No. 14/141,333, filed on Dec. 26, 2013, now Pat. No. 9,647,795, which is a (Continued)

(51) Int. Cl.
*H04L 27/36* (2006.01)
*H04L 1/00* (2006.01)
(Continued)

(52) U.S. Cl.
CPC ....... *H04L 1/0041* (2013.01); *H03M 13/1165* (2013.01); *H03M 13/152* (2013.01);
(Continued)

(58) Field of Classification Search
CPC ....... H04L 1/0041; H04L 27/04; H04L 27/34; H04L 5/0053; H04L 5/0048;
(Continued)

(56) References Cited

U.S. PATENT DOCUMENTS 6,704,366 B1 3/2004 Combes et al.
7,519,895 B2 4/2009 Kyung et al.
(Continued)

FOREIGN PATENT DOCUMENTS

CN 1394418 1/2003
DE 10127346 1/2003
(Continued)

OTHER PUBLICATIONS

Jaeger et al., "The Second Generation Transmission Technology for Broadband Cable", The complete technical session proceedings from The Cable Show, Washington D. C., Apr. 2009.
(Continued)

*Primary Examiner* — Dhaval Patel
(74) *Attorney, Agent, or Firm* — Dentons US LLP

(57) ABSTRACT

The present invention relates to a method of transmitting and receiving signals and a corresponding apparatus. One aspect of the present invention relates to a method of extracting PLP from data slices.

16 Claims, 77 Drawing Sheets

Related U.S. Application Data continuation of application No. 13/143,906, filed as application No. PCT/KR2009/002512 on May 12, 2009, now Pat. No. 8,644,406.

(60) Provisional application No. 61/143,423, filed on Jan. 9, 2009.

(51) Int. Cl.

| | | |
|---|---|---|
| *H03M 13/11* | (2006.01) | |
| *H03M 13/25* | (2006.01) | |
| *H03M 13/27* | (2006.01) | |
| *H03M 13/35* | (2006.01) | |
| *H03M 13/00* | (2006.01) | |
| *H04H 20/76* | (2008.01) | |
| *H04L 5/00* | (2006.01) | |
| *H04L 27/26* | (2006.01) | |
| *H04L 27/34* | (2006.01) | |
| *H04L 27/04* | (2006.01) | |
| *H03M 13/15* | (2006.01) | |
| *H03M 13/29* | (2006.01) | |

(52) U.S. Cl.
CPC ..... *H03M 13/255* (2013.01); *H03M 13/2707* (2013.01); *H03M 13/2721* (2013.01); *H03M 13/356* (2013.01); *H03M 13/618* (2013.01); *H03M 13/6362* (2013.01); *H03M 13/6552* (2013.01); *H03M 13/6555* (2013.01); *H04H 20/76* (2013.01); *H04L 1/0057* (2013.01); *H04L 1/0071* (2013.01); *H04L 5/0048* (2013.01); *H04L 5/0053* (2013.01); *H04L 27/04* (2013.01); *H04L 27/2613* (2013.01); *H04L 27/34* (2013.01); *H03M 13/15* (2013.01); *H03M 13/2906* (2013.01); *H04L 1/0001* (2013.01)

(58) Field of Classification Search
CPC . H04L 1/0071; H04L 1/0057; H04L 27/2613; H03M 13/6362; H03M 13/152; H03M 13/6555; H03M 13/1165; H03M 13/618; H04H 20/76
USPC ....... 375/260, 261, 262, 265, 267, 340, 343, 375/346, 347; 370/203, 205, 206, 208, 370/209, 210
See application file for complete search history.

(56) References Cited

U.S. PATENT DOCUMENTS

| | | |
|---|---|---|
| 8,248,910 B2 | 8/2012 | Jokela et al. |
| 8,583,981 B2 | 11/2013 | Varnica et al. |
| 9,647,795 B2 * | 5/2017 | Ko .................... H03M 13/1165 |
| 2003/0117647 A1 | 6/2003 | Kaku et al. |
| 2003/0237030 A1 | 12/2003 | Chun |
| 2005/0073948 A1 | 4/2005 | Jwa |
| 2006/0176076 A1 | 8/2006 | Loughmiller |
| 2007/0140103 A1 | 6/2007 | Ouyang |
| 2009/0135713 A1 | 5/2009 | Hwang et al. |
| 2009/0315742 A1 | 12/2009 | Breiling |
| 2010/0296593 A1 * | 11/2010 | Atungsiri .............. H04L 1/0071 |
| | | 375/260 |
| 2011/0305300 A1 | 12/2011 | Ko |

FOREIGN PATENT DOCUMENTS

| | | |
|---|---|---|
| EP | 1983678 | 10/2008 |
| KR | 100454952 | 10/2004 |
| KR | 1020060072573 | 6/2006 |
| WO | 2008/097368 | 8/2008 |

OTHER PUBLICATIONS

ETSI: "Digital Video Broadcasting (DVB); Second generation framing structure, channel coding and modulation systems for Broadcasting, Interactive Services, News Gathering and other broadband satellite applications", ETSI EN 302 307 V1.1.2, Jun. 2006, XP014034070.
"Digital Video Broadcasting (DVB); Frame structure channel coding and modulation for a second generation digital terrestrial television broadcasting system (DVB-T2); DVB Document A122" internet citation, Jun. 2008, XP002546005.
Robert et al., "Digital Video Broadcasting (DVB); The Standard for Next Generation Digital Cable Transmission (DVB-C2)", pp. 1-5, May 2009, XP031480164.
The State Intellectual Property Office of the People's Republic of China Application Serial No. 200980151716.9, Office Action dated Mar. 4, 2013, 6 pages.
Sony, "Response to the DVB-C2 Call for Technologies (CfT)", Jun. 2008, 58 pages.
Digital Video Broadcasting, "Frame structure channel coding and modulation for a second generation digital terrestrial television broadcasting system (DVB-T2)", DVB Document A122, Jun. 2008, 158 pages.

* cited by examiner

[Fig. 1]
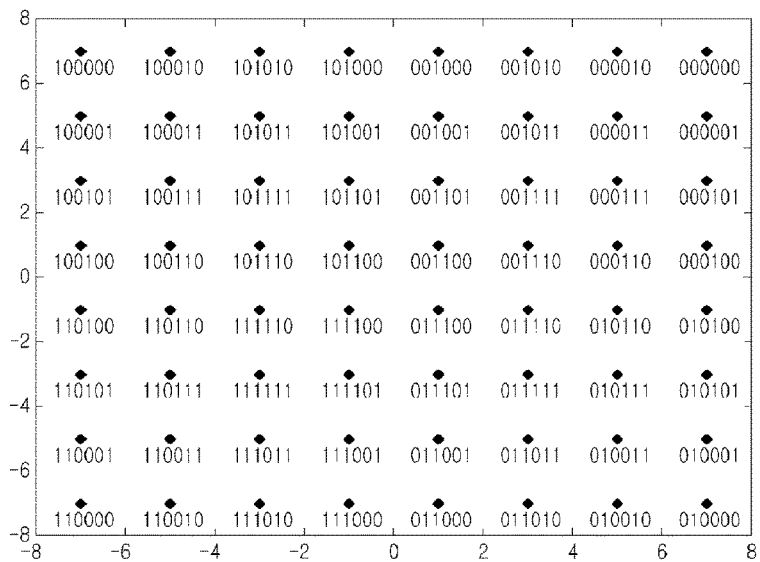
[Fig. 2]
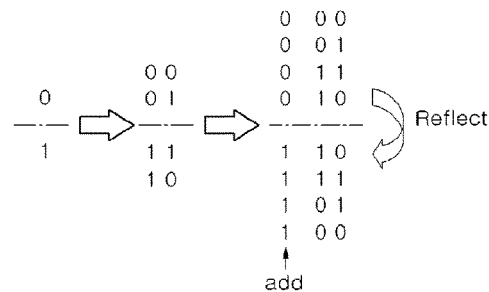
[Fig. 3]
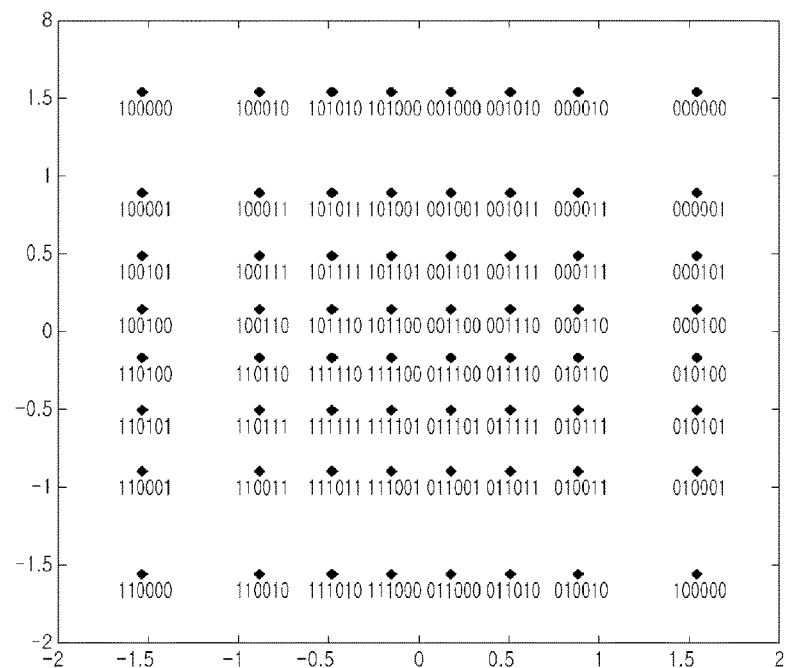

[Fig. 4]
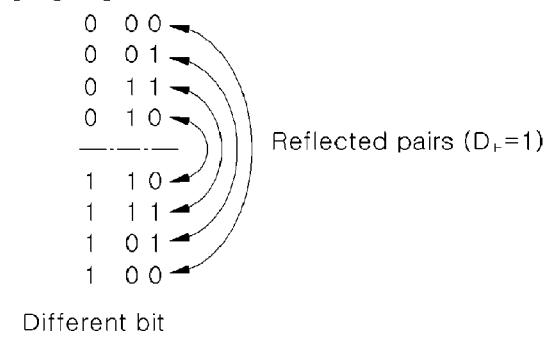
Different bit
[Fig. 5]
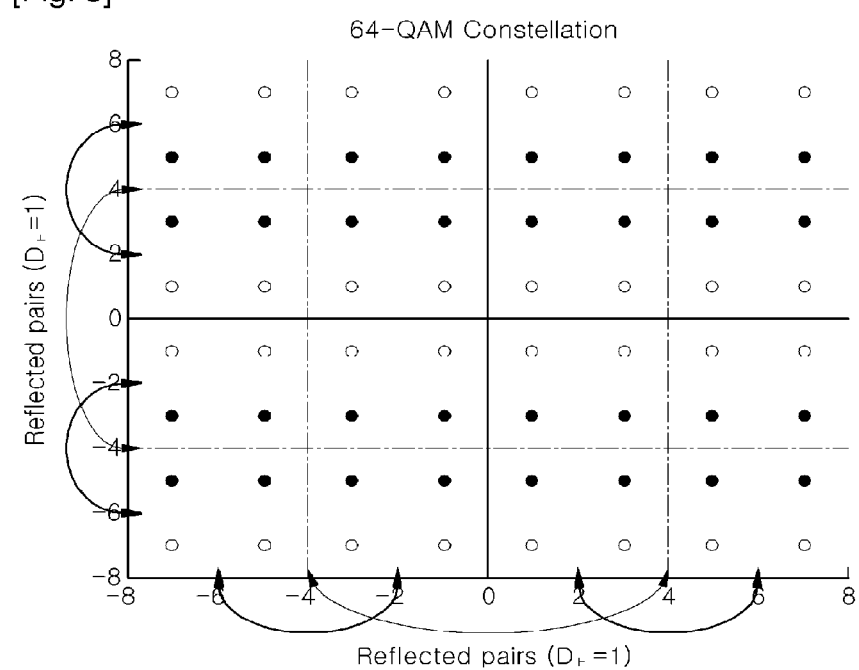

[Fig. 6]
(a)
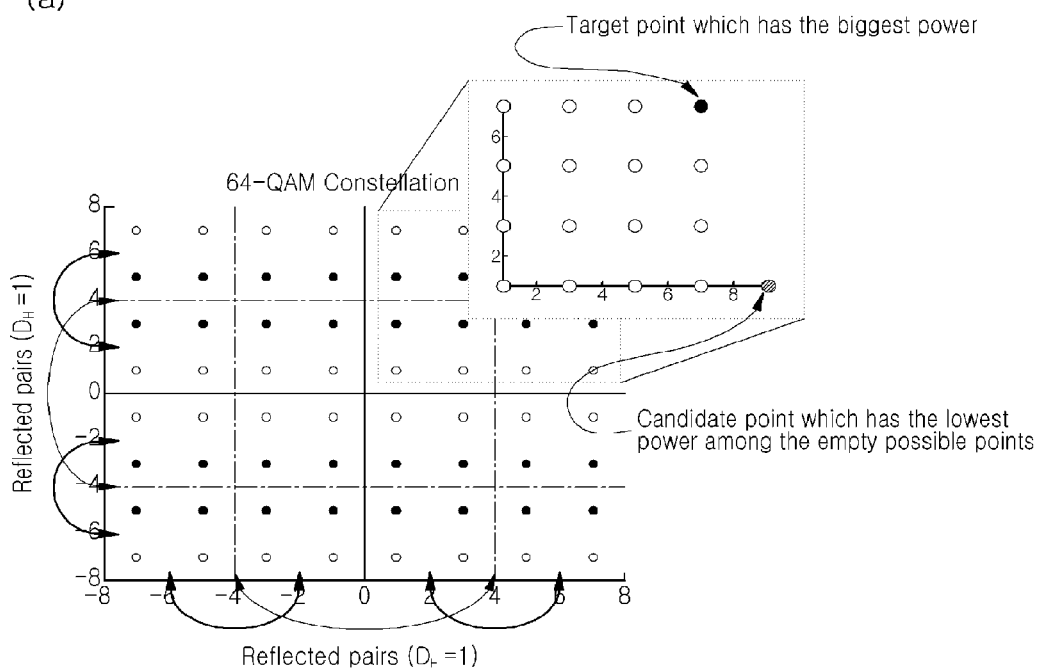
(b)
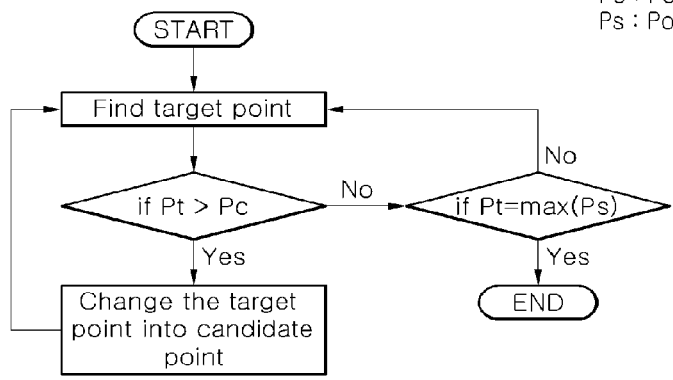

[Fig. 7]
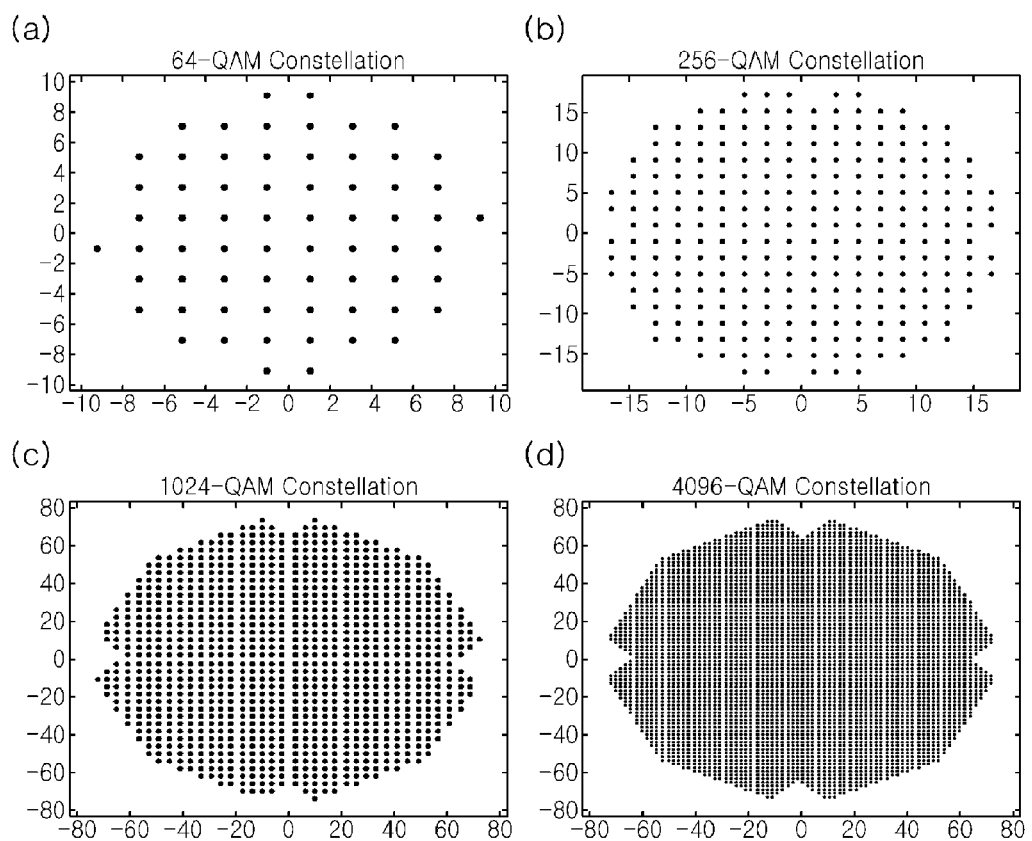

[Fig. 8]

| Value | Scatter |
|---|---|
| 0 | 9 + 1i |
| 1 | 7 + 5i |
| 2 | 5 + 7i |
| 3 | 5 + 5i |
| 4 | 7 + 1i |
| 5 | 7 + 3i |
| 6 | 5 + 1i |
| 7 | 5 + 3i |
| 8 | 1 + 7i |
| 9 | 1 + 5i |
| 10 | 3 + 7i |
| 11 | 3 + 5i |
| 12 | 1 + 1i |
| 13 | 1 + 3i |
| 14 | 3 + 1i |
| 15 | 3 + 3i |
| 16 | 1 - 9i |
| 17 | 7 - 5i |
| 18 | 5 - 7i |
| 19 | 5 - 5i |
| 20 | 7 - 1i |
| 21 | 7 - 3i |
| 22 | 5 - 1i |
| 23 | 5 - 3i |
| 24 | 1 - 7i |
| 25 | 1 - 5i |
| 26 | 3 - 7i |
| 27 | 3 - 5i |
| 28 | 1 - 1i |
| 29 | 1 - 3i |
| 30 | 3 - 1i |

[Fig. 9]

| 31 | 3 - 3i |
| 32 | -1 + 9i |
| 33 | -7 + 5i |
| 34 | -5 + 7i |
| 35 | -5 + 5i |
| 36 | -7 + 1i |
| 37 | -7 + 3i |
| 38 | -5 + 1i |
| 39 | -5 + 3i |
| 40 | -1 + 7i |
| 41 | -1 + 5i |
| 42 | -3 + 7i |
| 43 | -3 + 5i |
| 44 | -1 + 1i |
| 45 | -1 + 3i |
| 46 | -3 + 1i |
| 47 | -3 + 3i |
| 48 | -9 - 1i |
| 49 | -7 - 5i |
| 50 | -5 - 7i |
| 51 | -5 - 5i |
| 52 | -7 - 1i |
| 53 | -7 - 3i |
| 54 | -5 - 1i |
| 55 | -5 - 3i |
| 56 | -1 - 7i |
| 57 | -1 - 5i |
| 58 | -3 - 7i |
| 59 | -3 - 5i |
| 60 | -1 - 1i |
| 61 | -1 - 3i |
| 62 | -3 - 1i |
| 63 | -3 - 3i |

| | | | | | | | | | | | | | | |
|---|---|---|---|---|---|---|---|---|---|---|---|---|---|---|
| 27 + 21i | 31 | 27 + 11i | 95 | 5 + 21i | 159 | 5 + 11i | 223 | 27 - 21i | 287 | 27 - 11i | 351 | 5 - 21i | 415 | 5 - 11i | 479 |
| 17 + 31i | 32 | 17 + 11i | 96 | 15 + 31i | 160 | 15 + 1i | 224 | 17 - 31i | 288 | 17 - 11i | 352 | 15 - 31i | 416 | 15 - 1i | 480 |
| 17 + 29i | 33 | 17 + 3i | 97 | 15 + 29i | 161 | 15 + 3i | 225 | 17 - 29i | 289 | 17 - 3i | 353 | 15 - 29i | 417 | 15 - 3i | 481 |
| 13 + 33i | 34 | 19 + 1i | 98 | 13 + 31i | 162 | 13 + 1i | 226 | 13 - 33i | 290 | 19 - 1i | 354 | 13 - 31i | 418 | 13 - 1i | 482 |
| 19 + 29i | 35 | 19 + 3i | 99 | 13 + 29i | 163 | 13 + 3i | 227 | 19 - 29i | 291 | 19 - 3i | 355 | 13 - 29i | 419 | 13 - 3i | 483 |
| 17 + 27i | 36 | 17 + 7i | 100 | 15 + 27i | 164 | 15 + 7i | 228 | 17 - 27i | 292 | 17 - 7i | 356 | 15 - 27i | 420 | 15 - 7i | 484 |
| 17 + 27i | 37 | 17 + 5i | 101 | 15 + 27i | 165 | 15 + 5i | 229 | 17 - 27i | 293 | 17 - 5i | 357 | 15 - 27i | 421 | 15 - 5i | 485 |
| 19 + 25i | 38 | 19 + 7i | 102 | 13 + 25i | 166 | 13 + 7i | 230 | 19 - 25i | 294 | 19 - 7i | 358 | 13 - 25i | 422 | 13 - 7i | 486 |
| 19 + 27i | 39 | 19 + 5i | 103 | 13 + 27i | 167 | 13 + 5i | 231 | 19 - 27i | 295 | 19 - 5i | 359 | 13 - 27i | 423 | 13 - 5i | 487 |
| 9 + 33i | 40 | 23 + 1i | 104 | 9 + 31i | 168 | 9 + 1i | 232 | 9 - 33i | 296 | 23 - 1i | 360 | 9 - 31i | 424 | 9 - 1i | 488 |
| 9 + 35i | 41 | 23 + 3i | 105 | 9 + 29i | 169 | 9 + 3i | 233 | 9 - 35i | 297 | 23 - 3i | 361 | 9 - 29i | 425 | 9 - 3i | 489 |
| 11 + 33i | 42 | 21 + 1i | 106 | 11 + 31i | 170 | 11 + 1i | 234 | 11 - 33i | 298 | 21 - 1i | 362 | 11 - 31i | 426 | 11 - 1i | 490 |
| 21 + 29i | 43 | 21 + 3i | 107 | 11 + 29i | 171 | 11 + 3i | 235 | 21 - 29i | 299 | 21 - 3i | 363 | 11 - 29i | 427 | 11 - 3i | 491 |
| 23 + 25i | 44 | 23 + 7i | 108 | 9 + 25i | 172 | 9 + 7i | 236 | 23 - 25i | 300 | 23 - 7i | 364 | 9 - 25i | 428 | 9 - 7i | 492 |
| 23 + 27i | 45 | 23 + 5i | 109 | 9 + 27i | 173 | 9 + 5i | 237 | 23 - 27i | 301 | 23 - 5i | 365 | 9 - 27i | 429 | 9 - 5i | 493 |
| 21 + 25i | 46 | 21 + 7i | 110 | 11 + 25i | 174 | 11 + 7i | 238 | 21 - 25i | 302 | 21 - 7i | 366 | 11 - 25i | 430 | 11 - 7i | 494 |
| 21 + 27i | 47 | 21 + 5i | 111 | 11 + 27i | 175 | 11 + 5i | 239 | 21 - 27i | 303 | 21 - 5i | 367 | 11 - 27i | 431 | 11 - 5i | 495 |
| 17 + 17i | 48 | 17 + 15i | 112 | 15 + 19i | 176 | 15 + 15i | 240 | 17 - 17i | 304 | 17 - 15i | 368 | 15 - 19i | 432 | 15 - 15i | 496 |
| 17 + 19i | 49 | 17 + 13i | 113 | 15 + 17i | 177 | 15 + 13i | 241 | 17 - 19i | 305 | 17 - 13i | 369 | 15 - 17i | 433 | 15 - 13i | 497 |
| 19 + 17i | 50 | 19 + 15i | 114 | 13 + 19i | 178 | 13 + 15i | 242 | 19 - 17i | 306 | 19 - 15i | 370 | 13 - 19i | 434 | 13 - 15i | 498 |
| 19 + 19i | 51 | 19 + 13i | 115 | 13 + 17i | 179 | 13 + 13i | 243 | 19 - 19i | 307 | 19 - 13i | 371 | 13 - 17i | 435 | 13 - 13i | 499 |
| 17 + 23i | 52 | 17 + 9i | 116 | 15 + 23i | 180 | 15 + 9i | 244 | 17 - 23i | 308 | 17 - 9i | 372 | 15 - 23i | 436 | 15 - 9i | 500 |
| 17 + 21i | 53 | 17 + 11i | 117 | 15 + 21i | 181 | 15 + 11i | 245 | 17 - 21i | 309 | 17 - 11i | 373 | 15 - 21i | 437 | 15 - 11i | 501 |
| 19 + 23i | 54 | 19 + 9i | 118 | 13 + 23i | 182 | 13 + 9i | 246 | 19 - 23i | 310 | 19 - 9i | 374 | 13 - 23i | 438 | 13 - 9i | 502 |
| 19 + 21i | 55 | 19 + 11i | 119 | 13 + 21i | 183 | 13 + 11i | 247 | 19 - 21i | 311 | 19 - 11i | 375 | 13 - 21i | 439 | 13 - 11i | 503 |
| 23 + 17i | 56 | 23 + 15i | 120 | 9 + 17i | 184 | 9 + 15i | 248 | 23 - 17i | 312 | 23 - 15i | 376 | 9 - 17i | 440 | 9 - 15i | 504 |
| 23 + 19i | 57 | 23 + 13i | 121 | 9 + 19i | 185 | 9 + 13i | 249 | 23 - 19i | 313 | 23 - 13i | 377 | 9 - 19i | 441 | 9 - 13i | 505 |
| 21 + 17i | 58 | 21 + 15i | 122 | 11 + 17i | 186 | 11 + 15i | 250 | 21 - 17i | 314 | 21 - 15i | 378 | 11 - 17i | 442 | 11 - 15i | 506 |
| 21 + 19i | 59 | 21 + 13i | 123 | 11 + 19i | 187 | 11 + 13i | 251 | 21 - 19i | 315 | 21 - 13i | 379 | 11 - 19i | 443 | 11 - 13i | 507 |
| 23 + 23i | 60 | 23 + 9i | 124 | 9 + 23i | 188 | 9 + 9i | 252 | 23 - 23i | 316 | 23 - 9i | 380 | 9 - 23i | 444 | 9 - 9i | 508 |
| 23 + 21i | 61 | 23 + 11i | 125 | 9 + 21i | 189 | 9 + 11i | 253 | 23 - 21i | 317 | 23 - 11i | 381 | 9 - 21i | 445 | 9 - 11i | 509 |
| 21 + 23i | 62 | 21 + 9i | 126 | 11 + 23i | 190 | 11 + 9i | 254 | 21 - 23i | 318 | 21 - 9i | 382 | 11 - 23i | 446 | 11 - 9i | 510 |
| 21 + 21i | 63 | 21 + 11i | 127 | 11 + 21i | 191 | 11 + 11i | 255 | 21 - 21i | 319 | 21 - 11i | 383 | 11 - 21i | 447 | 11 - 11i | 511 |

[Fig. 14]

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 512 | -1 + 33i | 576 | -31 + 1i | 640 | -1 + 31i | 704 | -1 + 1i | 768 | -33 - 1i | 832 | -31 - 1i | 896 | -1 - 31i | 960 | -1 - 1i
| 513 | -33 + 3i | 577 | -31 + 3i | 641 | -1 + 29i | 705 | -1 + 3i | 769 | -33 - 3i | 833 | -31 - 3i | 897 | -1 - 29i | 961 | -1 - 3i
| 514 | -3 + 33i | 578 | -29 + 1i | 642 | -3 + 31i | 706 | -3 + 1i | 770 | -3 - 33i | 834 | -29 - 3i | 898 | -3 - 31i | 962 | -3 - 1i
| 515 | -3 + 35i | 579 | -29 + 3i | 643 | -3 + 29i | 707 | -3 + 3i | 771 | -35 - 3i | 835 | -29 - 3i | 899 | -3 - 29i | 963 | -3 - 3i
| 516 | -33 + 7i | 580 | -31 + 7i | 644 | -1 + 25i | 708 | -1 + 7i | 772 | -33 - 7i | 836 | -31 - 7i | 900 | -1 - 25i | 964 | -1 - 7i
| 517 | -33 + 5i | 581 | -31 + 5i | 645 | -1 + 27i | 709 | -1 + 5i | 773 | -33 - 5i | 837 | -31 - 5i | 901 | -1 - 27i | 965 | -1 - 5i
| 518 | -35 + 7i | 582 | -29 + 7i | 646 | -3 + 25i | 710 | -3 + 7i | 774 | -35 - 7i | 838 | -29 - 7i | 902 | -3 - 25i | 966 | -3 - 7i
| 519 | -35 + 5i | 583 | -29 + 5i | 647 | -3 + 27i | 711 | -3 + 5i | 775 | -35 - 5i | 839 | -29 - 5i | 903 | -3 - 27i | 967 | -3 - 5i
| 520 | -7 + 33i | 584 | -25 + 1i | 648 | -7 + 31i | 712 | -7 + 1i | 776 | -7 - 33i | 840 | -25 - 1i | 904 | -7 - 31i | 968 | -7 - 1i
| 521 | -7 + 35i | 585 | -25 + 3i | 649 | -7 + 29i | 713 | -7 + 3i | 777 | -7 - 35i | 841 | -25 - 3i | 905 | -7 - 29i | 969 | -7 - 3i
| 522 | -5 + 33i | 586 | -27 + 1i | 650 | -5 + 31i | 714 | -5 + 1i | 778 | -5 - 33i | 842 | -27 - 1i | 906 | -5 - 31i | 970 | -5 - 1i
| 523 | -5 + 35i | 587 | -27 + 3i | 651 | -5 + 29i | 715 | -5 + 3i | 779 | -5 - 35i | 843 | -27 - 3i | 907 | -5 - 29i | 971 | -5 - 3i
| 524 | -25 + 25i | 588 | -25 + 7i | 652 | -7 + 25i | 716 | -7 + 7i | 780 | -25 - 25i | 844 | -25 - 7i | 908 | -7 - 25i | 972 | -7 - 7i
| 525 | -25 + 27i | 589 | -25 + 5i | 653 | -7 + 27i | 717 | -7 + 5i | 781 | -25 - 27i | 845 | -25 - 5i | 909 | -7 - 27i | 973 | -7 - 5i
| 526 | -27 + 25i | 590 | -27 + 7i | 654 | -5 + 25i | 718 | -5 + 7i | 782 | -27 - 25i | 846 | -27 - 7i | 910 | -5 - 25i | 974 | -5 - 7i
| 527 | -5 + 37i | 591 | -27 + 5i | 655 | -5 + 27i | 719 | -5 + 5i | 783 | -37 - 5i | 847 | -27 - 5i | 911 | -5 - 27i | 975 | -5 - 5i
| 528 | -31 + 17i | 592 | -31 + 15i | 656 | -1 + 17i | 720 | -1 + 15i | 784 | -31 - 17i | 848 | -31 - 15i | 912 | -1 - 17i | 976 | -1 - 15i
| 529 | -33 + 13i | 593 | -31 + 13i | 657 | -1 + 19i | 721 | -1 + 13i | 785 | -33 - 13i | 849 | -31 - 13i | 913 | -1 - 19i | 977 | -1 - 13i
| 530 | -29 + 17i | 594 | -29 + 15i | 658 | -3 + 17i | 722 | -3 + 15i | 786 | -29 - 17i | 850 | -29 - 15i | 914 | -3 - 17i | 978 | -3 - 15i
| 531 | -29 + 19i | 595 | -29 + 13i | 659 | -3 + 19i | 723 | -3 + 13i | 787 | -29 - 19i | 851 | -29 - 13i | 915 | -3 - 19i | 979 | -3 - 13i
| 532 | -33 + 9i | 596 | -31 + 9i | 660 | -1 + 9i | 724 | -1 + 9i | 788 | -33 - 9i | 852 | -31 - 9i | 916 | -1 - 23i | 980 | -1 - 9i
| 533 | -33 + 11i | 597 | -31 + 11i | 661 | -1 + 21i | 725 | -1 + 11i | 789 | -33 - 11i | 853 | -31 - 11i | 917 | -1 - 21i | 981 | -1 - 11i
| 534 | -35 + 9i | 598 | -29 + 9i | 662 | -3 + 23i | 726 | -3 + 9i | 790 | -35 - 9i | 854 | -29 - 9i | 918 | -3 - 23i | 982 | -3 - 9i
| 535 | -29 + 21i | 599 | -29 + 11i | 663 | -3 + 21i | 727 | -3 + 11i | 791 | -29 - 21i | 855 | -29 - 11i | 919 | -3 - 21i | 983 | -3 - 11i
| 536 | -25 + 17i | 600 | -25 + 15i | 664 | -7 + 17i | 728 | -7 + 15i | 792 | -25 - 17i | 856 | -25 - 15i | 920 | -7 - 17i | 984 | -7 - 15i
| 537 | -25 + 19i | 601 | -25 + 13i | 665 | -7 + 19i | 729 | -7 + 13i | 793 | -25 - 19i | 857 | -25 - 13i | 921 | -7 - 19i | 985 | -7 - 13i
| 538 | -27 + 17i | 602 | -27 + 15i | 666 | -5 + 17i | 730 | -5 + 15i | 794 | -27 - 17i | 858 | -27 - 15i | 922 | -5 - 17i | 986 | -5 - 15i
| 539 | -27 + 19i | 603 | -27 + 13i | 667 | -5 + 19i | 731 | -5 + 13i | 795 | -27 - 19i | 859 | -27 - 13i | 923 | -5 - 19i | 987 | -5 - 13i
| 540 | -25 + 23i | 604 | -25 + 9i | 668 | -7 + 23i | 732 | -7 + 9i | 796 | -25 - 23i | 860 | -25 - 9i | 924 | -7 - 23i | 988 | -7 - 9i

[Fig. 15]

| | | | | | | | | | | | |
|---|---|---|---|---|---|---|---|---|---|---|---|
| 541 | -25 + 21i | 605 | -25 + 11i | 669 | -7 - 21i | 733 | -7 + 11i | 797 | -25 - 21i | 861 | -25 - 11i | 925 | -7 - 21i | 989 | -7 - 11i |
| 542 | -27 + 23i | 606 | -27 + 9i | 670 | -5 - 23i | 734 | -5 + 9i | 798 | -27 - 23i | 862 | -27 - 9i | 926 | -5 - 23i | 990 | -5 - 9i |
| 543 | -27 + 21i | 607 | -27 + 11i | 671 | -5 - 21i | 735 | -5 + 11i | 799 | -27 - 21i | 863 | -27 - 11i | 927 | -5 - 21i | 991 | -5 - 11i |
| 544 | -17 + 31i | 608 | -17 + 3i | 672 | -15 - 31i | 736 | -15 + 3i | 800 | -17 - 31i | 864 | -17 - 3i | 928 | -15 - 31i | 992 | -15 - 3i |
| 545 | -17 + 29i | 609 | -17 + 3i | 673 | -15 + 29i | 737 | -15 + 3i | 801 | -17 - 29i | 865 | -17 - 3i | 929 | -15 - 29i | 993 | -15 - 3i |
| 546 | -13 + 33i | 610 | -19 + 1i | 674 | -13 + 31i | 738 | -13 + 1i | 802 | -13 - 33i | 866 | -19 - 1i | 930 | -13 - 31i | 994 | -13 - 1i |
| 547 | -19 + 29i | 611 | -19 + 3i | 675 | -13 + 29i | 739 | -13 + 3i | 803 | -19 - 29i | 867 | -19 - 3i | 931 | -13 - 29i | 995 | -13 - 3i |
| 548 | -17 + 25i | 612 | -17 + 7i | 676 | -15 + 25i | 740 | -15 + 7i | 804 | -17 - 25i | 868 | -17 - 7i | 932 | -15 - 25i | 996 | -15 - 7i |
| 549 | -17 + 27i | 613 | -17 + 5i | 677 | -15 + 27i | 741 | -15 + 5i | 805 | -17 - 27i | 869 | -17 - 5i | 933 | -15 - 27i | 997 | -15 - 5i |
| 550 | -19 + 25i | 614 | -19 + 7i | 678 | -13 + 25i | 742 | -13 + 7i | 806 | -19 - 25i | 870 | -19 - 7i | 934 | -13 - 25i | 998 | -13 - 7i |
| 551 | -19 + 27i | 615 | -19 + 5i | 679 | -13 + 27i | 743 | -13 + 5i | 807 | -19 - 27i | 871 | -19 - 5i | 935 | -13 - 27i | 999 | -13 - 5i |
| 552 | -9 + 33i | 616 | -23 + 1i | 680 | -9 - 31i | 744 | -9 + 1i | 808 | -9 - 33i | 872 | -23 - 1i | 936 | -9 - 31i | 1000 | -9 - 1i |
| 553 | -9 + 35i | 617 | -23 + 3i | 681 | -9 - 29i | 745 | -9 + 3i | 809 | -9 - 35i | 873 | -23 - 3i | 937 | -9 - 29i | 1001 | -9 - 3i |
| 554 | -11 + 33i | 618 | -21 + 1i | 682 | -11 + 31i | 746 | -11 + 1i | 810 | -11 - 33i | 874 | -21 - 1i | 938 | -11 - 31i | 1002 | -11 - 1i |
| 555 | -21 + 29i | 619 | -21 + 3i | 683 | -11 + 29i | 747 | -11 + 3i | 811 | -11 - 29i | 875 | -21 - 3i | 939 | -11 - 29i | 1003 | -11 - 3i |
| 556 | -23 + 25i | 620 | -23 + 7i | 684 | -9 + 25i | 748 | -9 + 7i | 812 | -23 - 25i | 876 | -23 - 7i | 940 | -9 - 25i | 1004 | -9 - 7i |
| 557 | -23 + 27i | 621 | -23 + 5i | 685 | -9 - 27i | 749 | -9 + 5i | 813 | -23 - 27i | 877 | -23 - 5i | 941 | -9 - 27i | 1005 | -9 - 5i |
| 558 | -21 + 25i | 622 | -21 + 7i | 686 | -11 + 25i | 750 | -11 + 7i | 814 | -21 - 25i | 878 | -21 - 7i | 942 | -11 - 25i | 1006 | -11 - 7i |
| 559 | -21 + 27i | 623 | -21 + 5i | 687 | -11 + 27i | 751 | -11 + 5i | 815 | -21 - 27i | 879 | -21 - 5i | 943 | -11 - 27i | 1007 | -11 - 5i |
| 560 | -17 + 17i | 624 | -17 + 15i | 688 | -15 + 17i | 752 | -15 + 15i | 816 | -17 - 17i | 880 | -17 - 15i | 944 | -15 - 17i | 1008 | -15 - 15i |
| 561 | -17 + 19i | 625 | -17 + 13i | 689 | -15 + 19i | 753 | -15 + 13i | 817 | -17 - 19i | 881 | -17 - 13i | 945 | -15 - 19i | 1009 | -15 - 13i |
| 562 | -19 + 17i | 626 | -19 + 15i | 690 | -13 + 17i | 754 | -13 + 15i | 818 | -19 - 17i | 882 | -19 - 15i | 946 | -13 - 17i | 1010 | -13 - 15i |
| 563 | -19 + 19i | 627 | -19 + 13i | 691 | -13 + 19i | 755 | -13 + 13i | 819 | -19 - 19i | 883 | -19 - 13i | 947 | -13 - 19i | 1011 | -13 - 13i |
| 564 | -17 + 9i | 628 | -17 + 9i | 692 | -15 + 23i | 756 | -15 + 9i | 820 | -17 - 9i | 884 | -17 - 9i | 948 | -15 - 23i | 1012 | -15 - 9i |
| 565 | -17 + 21i | 629 | -17 + 11i | 693 | -15 + 21i | 757 | -15 + 11i | 821 | -17 - 21i | 885 | -17 - 11i | 949 | -15 - 21i | 1013 | -15 - 11i |
| 566 | -19 + 23i | 630 | -19 + 9i | 694 | -13 + 23i | 758 | -13 + 9i | 822 | -19 - 23i | 886 | -19 - 9i | 950 | -13 - 23i | 1014 | -13 - 9i |
| 567 | -19 + 21i | 631 | -19 + 11i | 695 | -13 + 21i | 759 | -13 + 11i | 823 | -19 - 21i | 887 | -19 - 11i | 951 | -13 - 21i | 1015 | -13 - 11i |
| 568 | -23 + 17i | 632 | -23 + 15i | 696 | -9 - 17i | 760 | -9 + 15i | 824 | -23 - 17i | 888 | -23 - 15i | 952 | -9 - 17i | 1016 | -9 - 15i |
| 569 | -23 + 19i | 633 | -23 + 13i | 697 | -9 - 19i | 761 | -9 + 13i | 825 | -23 - 19i | 889 | -23 - 13i | 953 | -9 - 19i | 1017 | -9 - 13i |
| 570 | -21 + 17i | 634 | -21 + 15i | 698 | -11 + 17i | 762 | -11 + 15i | 826 | -21 - 17i | 890 | -21 - 15i | 954 | -11 - 17i | 1018 | -11 - 15i |
| 571 | -21 + 19i | 635 | -21 + 13i | 699 | -11 + 19i | 763 | -11 + 13i | 827 | -21 - 19i | 891 | -21 - 13i | 955 | -11 - 19i | 1019 | -11 - 13i |
| 572 | -23 + 23i | 636 | -23 + 9i | 700 | -9 + 23i | 764 | -9 + 9i | 828 | -23 - 23i | 892 | -23 - 9i | 956 | -9 - 23i | 1020 | -9 - 9i |
| 573 | -23 + 21i | 637 | -23 + 11i | 701 | -9 - 21i | 765 | -9 + 11i | 829 | -23 - 21i | 893 | -23 - 11i | 957 | -9 - 21i | 1021 | -9 - 11i |
| 574 | -21 + 23i | 638 | -21 + 9i | 702 | -11 + 23i | 766 | -11 + 9i | 830 | -21 - 23i | 894 | -21 - 9i | 958 | -11 - 23i | 1022 | -11 - 9i |
| 575 | -21 + 21i | 639 | -21 + 11i | 703 | -11 + 21i | 767 | -11 + 11i | 831 | -21 - 21i | 895 | -21 - 11i | 959 | -11 - 21i | 1023 | -11 - 11i |

[Fig. 16]

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 0 | 65 + 1i | 64 | 63 + 3i | 128 | 33 + 63i | 192 | 33 + 33i | 256 | 63 + 1i | 320 | 63 + 31i | 384 | 33 + 1i | 448 | 33 + 3i |
| 1 | 65 + 3i | 65 | 65 + 29i | 129 | 33 + 61i | 193 | 33 + 35i | 257 | 63 + 3i | 321 | 63 + 29i | 385 | 33 + 3i | 449 | 33 + 29i |
| 2 | 3 + 65i | 66 | 61 + 33i | 130 | 29 + 65i | 194 | 35 + 33i | 258 | 61 + 1i | 322 | 61 + 31i | 386 | 35 + 1i | 450 | 35 + 31i |
| 3 | 67 + 3i | 67 | 61 + 35i | 131 | 35 + 61i | 195 | 35 + 35i | 259 | 61 + 3i | 323 | 61 + 29i | 387 | 35 + 3i | 451 | 35 + 29i |
| 4 | 65 + 7i | 68 | 65 + 25i | 132 | 33 + 57i | 196 | 33 + 39i | 260 | 63 + 7i | 324 | 63 + 25i | 388 | 33 + 7i | 452 | 33 + 25i |
| 5 | 65 + 5i | 69 | 65 + 27i | 133 | 33 + 59i | 197 | 33 + 37i | 261 | 63 + 5i | 325 | 63 + 27i | 389 | 33 + 5i | 453 | 33 + 27i |
| 6 | 67 + 7i | 70 | 67 + 25i | 134 | 35 + 57i | 198 | 35 + 39i | 262 | 61 + 7i | 326 | 61 + 25i | 390 | 35 + 7i | 454 | 35 + 25i |
| 7 | 67 + 5i | 71 | 61 + 37i | 135 | 35 + 59i | 199 | 35 + 37i | 263 | 61 + 5i | 327 | 61 + 27i | 391 | 35 + 5i | 455 | 35 + 27i |
| 8 | 7 + 65i | 72 | 57 + 33i | 136 | 25 + 65i | 200 | 39 + 33i | 264 | 57 + 1i | 328 | 57 + 31i | 392 | 39 + 1i | 456 | 39 + 31i |
| 9 | 7 + 67i | 73 | 57 + 35i | 137 | 25 + 67i | 201 | 39 + 35i | 265 | 57 + 3i | 329 | 57 + 29i | 393 | 39 + 3i | 457 | 39 + 29i |
| 10 | 5 + 65i | 74 | 59 + 33i | 138 | 27 + 65i | 202 | 37 + 33i | 266 | 59 + 1i | 330 | 59 + 31i | 394 | 37 + 1i | 458 | 37 + 31i |
| 11 | 5 + 67i | 75 | 59 + 35i | 139 | 27 + 67i | 203 | 37 + 35i | 267 | 59 + 3i | 331 | 59 + 29i | 395 | 37 + 3i | 459 | 37 + 29i |
| 12 | 7 + 71i | 76 | 57 + 39i | 140 | 25 + 71i | 204 | 39 + 39i | 268 | 57 + 7i | 332 | 57 + 25i | 396 | 39 + 7i | 460 | 39 + 25i |
| 13 | 7 + 69i | 77 | 57 + 37i | 141 | 25 + 69i | 205 | 39 + 37i | 269 | 57 + 5i | 333 | 57 + 27i | 397 | 39 + 5i | 461 | 39 + 27i |
| 14 | 5 + 71i | 78 | 59 + 39i | 142 | 27 + 71i | 206 | 37 + 39i | 270 | 59 + 7i | 334 | 59 + 25i | 398 | 37 + 7i | 462 | 37 + 25i |
| 15 | 5 + 69i | 79 | 59 + 37i | 143 | 27 + 69i | 207 | 37 + 37i | 271 | 59 + 5i | 335 | 59 + 27i | 399 | 37 + 5i | 463 | 37 + 27i |
| 16 | 65 + 15i | 80 | 65 + 17i | 144 | 33 + 49i | 208 | 33 + 47i | 272 | 63 + 15i | 336 | 63 + 17i | 400 | 33 + 15i | 464 | 33 + 17i |
| 17 | 65 + 13i | 81 | 65 + 19i | 145 | 33 + 51i | 209 | 33 + 45i | 273 | 63 + 13i | 337 | 63 + 19i | 401 | 33 + 13i | 465 | 33 + 19i |
| 18 | 67 + 15i | 82 | 67 + 17i | 146 | 35 + 49i | 210 | 35 + 47i | 274 | 61 + 15i | 338 | 61 + 17i | 402 | 35 + 15i | 466 | 35 + 17i |
| 19 | 67 + 13i | 83 | 67 + 19i | 147 | 35 + 51i | 211 | 35 + 45i | 275 | 61 + 13i | 339 | 61 + 19i | 403 | 35 + 13i | 467 | 35 + 19i |
| 20 | 65 + 9i | 84 | 65 + 21i | 148 | 33 + 53i | 212 | 33 + 41i | 276 | 63 + 9i | 340 | 63 + 23i | 404 | 33 + 9i | 468 | 33 + 23i |
| 21 | 65 + 11i | 85 | 65 + 23i | 149 | 33 + 55i | 213 | 33 + 43i | 277 | 63 + 11i | 341 | 63 + 21i | 405 | 33 + 11i | 469 | 33 + 21i |
| 22 | 67 + 9i | 86 | 67 + 21i | 150 | 35 + 53i | 214 | 35 + 41i | 278 | 61 + 9i | 342 | 61 + 23i | 406 | 35 + 9i | 470 | 35 + 23i |
| 23 | 67 + 11i | 87 | 67 + 23i | 151 | 35 + 55i | 215 | 35 + 43i | 279 | 61 + 11i | 343 | 61 + 21i | 407 | 35 + 11i | 471 | 35 + 21i |
| 24 | 71 + 15i | 88 | 71 + 17i | 152 | 39 + 49i | 216 | 39 + 47i | 280 | 57 + 15i | 344 | 57 + 17i | 408 | 39 + 15i | 472 | 39 + 17i |
| 25 | 71 + 13i | 89 | 57 + 45i | 153 | 39 + 51i | 217 | 39 + 45i | 281 | 57 + 13i | 345 | 57 + 19i | 409 | 39 + 13i | 473 | 39 + 19i |
| 26 | 69 + 15i | 90 | 69 + 17i | 154 | 37 + 49i | 218 | 37 + 47i | 282 | 59 + 15i | 346 | 59 + 17i | 410 | 37 + 15i | 474 | 37 + 17i |
| 27 | 69 + 13i | 91 | 69 + 19i | 155 | 37 + 51i | 219 | 37 + 45i | 283 | 59 + 13i | 347 | 59 + 19i | 411 | 37 + 13i | 475 | 37 + 19i |
| 28 | 71 + 9i | 92 | 57 + 41i | 156 | 39 + 55i | 220 | 39 + 41i | 284 | 57 + 9i | 348 | 57 + 23i | 412 | 39 + 9i | 476 | 39 + 23i |
| 29 | 71 + 11i | 93 | 57 + 43i | 157 | 39 + 53i | 221 | 39 + 43i | 285 | 57 + 11i | 349 | 57 + 21i | 413 | 39 + 11i | 477 | 39 + 21i |
| 30 | 69 + 9i | 94 | 59 + 41i | 158 | 37 + 55i | 222 | 37 + 41i | 286 | 59 + 9i | 350 | 59 + 23i | 414 | 37 + 9i | 478 | 37 + 23i |

[Fig. 17]

| | | | | | | | | | |
|---|---|---|---|---|---|---|---|---|---|
| 31 | 69 + 11i | 95 | 59 + 21i | 159 | 37 + 53i | 223 | 37 + 43i | 287 | 59 + 11i | 351 | 59 + 21i | 415 | 37 + 11i | 479 | 37 + 21i |
| 32 | 15 + 65i | 96 | 49 + 33i | 160 | 17 + 65i | 224 | 47 + 33i | 288 | 49 + 11i | 352 | 49 + 31i | 416 | 47 + 11i | 480 | 47 + 31i |
| 33 | 15 + 67i | 97 | 49 + 35i | 161 | 17 + 67i | 225 | 47 + 35i | 289 | 49 + 3i | 353 | 49 + 29i | 417 | 47 + 3i | 481 | 47 + 29i |
| 34 | 13 + 65i | 98 | 51 + 33i | 162 | 19 + 65i | 226 | 45 + 33i | 290 | 51 + 11i | 354 | 51 + 31i | 418 | 45 + 11i | 482 | 45 + 31i |
| 35 | 13 + 67i | 99 | 51 + 35i | 163 | 19 + 67i | 227 | 45 + 35i | 291 | 51 + 3i | 355 | 51 + 29i | 419 | 45 + 3i | 483 | 45 + 29i |
| 36 | 15 + 71i | 100 | 49 + 39i | 164 | 17 + 71i | 228 | 47 + 39i | 292 | 49 + 7i | 356 | 49 + 25i | 420 | 47 + 7i | 484 | 47 + 25i |
| 37 | 15 + 69i | 101 | 49 + 37i | 165 | 17 + 69i | 229 | 47 + 37i | 293 | 49 + 5i | 357 | 49 + 27i | 421 | 47 + 5i | 485 | 47 + 27i |
| 38 | 13 + 71i | 102 | 51 + 39i | 166 | 45 + 57i | 230 | 45 + 39i | 294 | 51 + 7i | 358 | 51 + 25i | 422 | 47 + 5i | 486 | 45 + 25i |
| 39 | 13 + 69i | 103 | 51 + 37i | 167 | 19 + 69i | 231 | 45 + 37i | 295 | 51 + 5i | 359 | 51 + 27i | 423 | 45 + 5i | 487 | 45 + 27i |
| 40 | 9 + 65i | 104 | 55 + 33i | 168 | 23 + 65i | 232 | 41 + 33i | 296 | 55 + 11i | 360 | 55 + 31i | 424 | 41 + 11i | 488 | 41 + 31i |
| 41 | 9 + 67i | 105 | 55 + 35i | 169 | 23 + 67i | 233 | 41 + 35i | 297 | 55 + 3i | 361 | 55 + 29i | 425 | 41 + 3i | 489 | 41 + 29i |
| 42 | 11 + 65i | 106 | 53 + 33i | 170 | 21 + 65i | 234 | 43 + 33i | 298 | 53 + 11i | 362 | 53 + 31i | 426 | 43 + 11i | 490 | 43 + 31i |
| 43 | 11 + 67i | 107 | 53 + 35i | 171 | 21 + 67i | 235 | 43 + 35i | 299 | 53 + 3i | 363 | 53 + 29i | 427 | 43 + 3i | 491 | 43 + 29i |
| 44 | 9 + 71i | 108 | 55 + 39i | 172 | 41 + 57i | 236 | 41 + 39i | 300 | 51 + 7i | 364 | 55 + 25i | 428 | 41 + 5i | 492 | 41 + 25i |
| 45 | 9 + 69i | 109 | 55 + 37i | 173 | 41 + 59i | 237 | 41 + 37i | 301 | 51 + 5i | 365 | 55 + 27i | 429 | 41 + 5i | 493 | 41 + 27i |
| 46 | 11 + 71i | 110 | 53 + 39i | 174 | 43 + 57i | 238 | 43 + 39i | 302 | 53 + 7i | 366 | 53 + 25i | 430 | 43 + 7i | 494 | 43 + 25i |
| 47 | 11 + 69i | 111 | 53 + 37i | 175 | 21 + 69i | 239 | 43 + 37i | 303 | 53 + 5i | 367 | 53 + 27i | 431 | 43 + 5i | 495 | 43 + 27i |
| 48 | 49 + 49i | 112 | 49 + 47i | 176 | 47 + 49i | 240 | 47 + 47i | 304 | 49 + 15i | 368 | 49 + 17i | 432 | 47 + 15i | 496 | 47 + 17i |
| 49 | 49 + 51i | 113 | 49 + 45i | 177 | 47 + 51i | 241 | 47 + 45i | 305 | 49 + 13i | 369 | 49 + 19i | 433 | 47 + 13i | 497 | 47 + 19i |
| 50 | 51 + 49i | 114 | 51 + 47i | 178 | 45 + 49i | 242 | 45 + 47i | 306 | 51 + 15i | 370 | 51 + 17i | 434 | 45 + 15i | 498 | 45 + 17i |
| 51 | 51 + 51i | 115 | 51 + 45i | 179 | 45 + 51i | 243 | 45 + 45i | 307 | 51 + 13i | 371 | 51 + 19i | 435 | 45 + 13i | 499 | 45 + 19i |
| 52 | 49 + 55i | 116 | 49 + 43i | 180 | 47 + 55i | 244 | 47 + 41i | 308 | 49 + 9i | 372 | 49 + 23i | 436 | 47 + 9i | 500 | 47 + 23i |
| 53 | 49 + 53i | 117 | 49 + 41i | 181 | 47 + 53i | 245 | 47 + 43i | 309 | 49 + 11i | 373 | 49 + 21i | 437 | 47 + 11i | 501 | 47 + 21i |
| 54 | 49 + 53i | 118 | 51 + 43i | 182 | 45 + 55i | 246 | 45 + 41i | 310 | 49 + 9i | 374 | 51 + 23i | 438 | 45 + 9i | 502 | 45 + 23i |
| 55 | 51 + 53i | 119 | 51 + 41i | 183 | 45 + 53i | 247 | 45 + 43i | 311 | 51 + 11i | 375 | 51 + 21i | 439 | 45 + 11i | 503 | 45 + 21i |
| 56 | 55 + 49i | 120 | 55 + 47i | 184 | 41 + 49i | 248 | 41 + 47i | 312 | 55 + 15i | 376 | 55 + 17i | 440 | 41 + 15i | 504 | 41 + 17i |
| 57 | 73 + 13i | 121 | 55 + 45i | 185 | 41 + 51i | 249 | 41 + 45i | 313 | 55 + 13i | 377 | 55 + 19i | 441 | 41 + 13i | 505 | 41 + 19i |
| 58 | 53 + 49i | 122 | 53 + 47i | 186 | 43 + 49i | 250 | 43 + 47i | 314 | 53 + 15i | 378 | 53 + 17i | 442 | 43 + 15i | 506 | 43 + 17i |
| 59 | 53 + 51i | 123 | 53 + 45i | 187 | 43 + 51i | 251 | 43 + 45i | 315 | 53 + 13i | 379 | 53 + 19i | 443 | 43 + 13i | 507 | 43 + 19i |
| 60 | 73 + 9i | 124 | 55 + 41i | 188 | 41 + 55i | 252 | 41 + 41i | 316 | 55 + 9i | 380 | 55 + 23i | 444 | 41 + 9i | 508 | 41 + 23i |
| 61 | 73 + 11i | 125 | 55 + 43i | 189 | 41 + 53i | 253 | 41 + 43i | 317 | 55 + 11i | 381 | 55 + 21i | 445 | 41 + 11i | 509 | 41 + 21i |
| 62 | 11 + 73i | 126 | 53 + 41i | 190 | 43 + 55i | 254 | 43 + 41i | 318 | 53 + 9i | 382 | 53 + 23i | 446 | 43 + 9i | 510 | 43 + 23i |
| 63 | 53 + 53i | 127 | 53 + 43i | 191 | 43 + 53i | 255 | 43 + 43i | 319 | 53 + 11i | 383 | 53 + 21i | 447 | 43 + 11i | 511 | 43 + 21i |

[Fig. 18]

| Value | Scatter | Value | Scatter | Value | Scatter | Value | Scatter | Value | Scatter | Value | Scatter |
|---|---|---|---|---|---|---|---|---|---|---|---|
| 512 | 1 + 63 | 576 | 1 + 33 | 540 | 31 + 63 | 704 | 31 + 33 | 768 | 1 + 1 | 832 | 1 + 31 | 896 | 31 + 1 | 960 | 31 + 31 |
| 513 | 1 + 61 | 577 | 1 + 35 | 541 | 31 + 61 | 705 | 31 + 35 | 769 | 1 + 3 | 833 | 1 + 29 | 897 | 31 + 3 | 961 | 31 + 29 |
| 514 | 3 + 63 | 578 | 3 + 33 | 542 | 29 + 63 | 706 | 29 + 33 | 770 | 3 + 1 | 834 | 3 + 31 | 898 | 29 + 1 | 962 | 29 + 31 |
| 515 | 3 + 61 | 579 | 3 + 35 | 543 | 29 + 61 | 707 | 29 + 35 | 771 | 3 + 3 | 835 | 3 + 29 | 899 | 29 + 3 | 963 | 29 + 29 |
| 516 | 1 + 57 | 580 | 1 + 39 | 544 | 31 + 57 | 708 | 31 + 39 | 772 | 1 + 7 | 836 | 1 + 25 | 900 | 31 + 7 | 964 | 31 + 25 |
| 517 | 1 + 59 | 581 | 1 + 37 | 545 | 31 + 59 | 709 | 31 + 37 | 773 | 1 + 5 | 837 | 1 + 27 | 901 | 31 + 5 | 965 | 31 + 27 |
| 518 | 3 + 57 | 582 | 3 + 39 | 546 | 29 + 57 | 710 | 29 + 39 | 774 | 3 + 7 | 838 | 3 + 25 | 902 | 29 + 7 | 966 | 29 + 25 |
| 519 | 3 + 59 | 583 | 3 + 37 | 547 | 29 + 59 | 711 | 29 + 37 | 775 | 3 + 5 | 839 | 3 + 27 | 903 | 29 + 5 | 967 | 29 + 27 |
| 520 | 7 + 63 | 584 | 7 + 33 | 548 | 25 + 63 | 712 | 25 + 33 | 776 | 7 + 1 | 840 | 7 + 31 | 904 | 25 + 1 | 968 | 25 + 31 |
| 521 | 7 + 61 | 585 | 7 + 35 | 549 | 25 + 61 | 713 | 25 + 35 | 777 | 7 + 3 | 841 | 7 + 29 | 905 | 25 + 3 | 969 | 25 + 29 |
| 522 | 5 + 63 | 586 | 5 + 33 | 550 | 27 + 63 | 714 | 27 + 33 | 778 | 5 + 1 | 842 | 5 + 31 | 906 | 27 + 1 | 970 | 27 + 31 |
| 523 | 5 + 61 | 587 | 5 + 35 | 551 | 27 + 61 | 715 | 27 + 35 | 779 | 5 + 3 | 843 | 5 + 29 | 907 | 27 + 3 | 971 | 27 + 29 |
| 524 | 7 + 57 | 588 | 7 + 39 | 552 | 25 + 57 | 716 | 25 + 39 | 780 | 7 + 7 | 844 | 7 + 25 | 908 | 25 + 7 | 972 | 25 + 25 |
| 525 | 7 + 59 | 589 | 7 + 37 | 553 | 25 + 59 | 717 | 25 + 37 | 781 | 7 + 5 | 845 | 7 + 27 | 909 | 25 + 5 | 973 | 25 + 27 |
| 526 | 5 + 57 | 590 | 5 + 39 | 554 | 27 + 57 | 718 | 27 + 39 | 782 | 5 + 7 | 846 | 5 + 25 | 910 | 27 + 7 | 974 | 27 + 25 |
| 527 | 5 + 59 | 591 | 5 + 37 | 555 | 27 + 59 | 719 | 27 + 37 | 783 | 5 + 5 | 847 | 5 + 27 | 911 | 27 + 5 | 975 | 27 + 27 |
| 528 | 1 + 49 | 592 | 1 + 47 | 556 | 31 + 49 | 720 | 31 + 47 | 784 | 1 + 15 | 848 | 1 + 17 | 912 | 31 + 15 | 976 | 31 + 17 |
| 529 | 1 + 51 | 593 | 1 + 45 | 557 | 31 + 51 | 721 | 31 + 45 | 785 | 1 + 13 | 849 | 1 + 19 | 913 | 31 + 13 | 977 | 31 + 19 |
| 530 | 3 + 49 | 594 | 3 + 47 | 558 | 29 + 49 | 722 | 29 + 47 | 786 | 3 + 15 | 850 | 3 + 17 | 914 | 29 + 15 | 978 | 29 + 17 |
| 531 | 3 + 51 | 595 | 3 + 45 | 559 | 29 + 51 | 723 | 29 + 45 | 787 | 3 + 13 | 851 | 3 + 19 | 915 | 29 + 13 | 979 | 29 + 19 |
| 532 | 1 + 55 | 596 | 1 + 41 | 560 | 31 + 55 | 724 | 31 + 41 | 788 | 1 + 9 | 852 | 1 + 23 | 916 | 31 + 9 | 980 | 31 + 23 |
| 533 | 1 + 53 | 597 | 1 + 43 | 561 | 31 + 53 | 725 | 31 + 43 | 789 | 1 + 11 | 853 | 1 + 21 | 917 | 31 + 11 | 981 | 31 + 21 |
| 534 | 3 + 55 | 598 | 3 + 41 | 562 | 29 + 55 | 726 | 29 + 41 | 790 | 3 + 9 | 854 | 3 + 23 | 918 | 29 + 9 | 982 | 29 + 23 |
| 535 | 3 + 53 | 599 | 3 + 43 | 563 | 29 + 53 | 727 | 29 + 43 | 791 | 3 + 11 | 855 | 3 + 21 | 919 | 29 + 11 | 983 | 29 + 21 |
| 536 | 7 + 49 | 600 | 7 + 47 | 564 | 25 + 49 | 728 | 25 + 47 | 792 | 7 + 15 | 856 | 7 + 17 | 920 | 25 + 15 | 984 | 25 + 17 |
| 537 | 7 + 51 | 601 | 7 + 45 | 565 | 25 + 51 | 729 | 25 + 45 | 793 | 7 + 13 | 857 | 7 + 19 | 921 | 25 + 13 | 985 | 25 + 19 |
| 538 | 5 + 49 | 602 | 5 + 47 | 566 | 27 + 49 | 730 | 27 + 47 | 794 | 5 + 15 | 858 | 5 + 17 | 922 | 27 + 15 | 986 | 27 + 17 |
| 539 | 5 + 51 | 603 | 5 + 45 | 567 | 27 + 51 | 731 | 27 + 45 | 795 | 5 + 13 | 859 | 5 + 19 | 923 | 27 + 13 | 987 | 27 + 19 |
| 540 | 7 + 55 | 604 | 7 + 41 | 568 | 25 + 55 | 732 | 25 + 41 | 796 | 7 + 9 | 860 | 7 + 23 | 924 | 25 + 9 | 988 | 25 + 23 |

[Fig. 19]

| | | | | | | | | | | |
|---|---|---|---|---|---|---|---|---|---|---|
| 541 | 7 + 53i | 505 | 7 + 45i | 669 | 25 + 53i | 733 | 25 + 45i | 797 | 7 + 11i | 861 | 7 + 21i | 925 | 25 + 11i | 989 | 25 + 21i |
| 542 | 5 + 55i | 506 | 5 + 41i | 670 | 27 + 55i | 734 | 27 + 41i | 798 | 5 + 9i | 862 | 5 + 23i | 926 | 27 + 9i | 990 | 27 + 23i |
| 543 | 5 + 53i | 507 | 5 + 43i | 671 | 27 + 53i | 735 | 27 + 43i | 799 | 5 + 11i | 863 | 5 + 21i | 927 | 27 + 11i | 991 | 27 + 21i |
| 544 | 15 + 63i | 508 | 15 + 33i | 672 | 17 + 53i | 736 | 17 + 35i | 800 | 15 + 1i | 864 | 15 + 31i | 928 | 17 + 1i | 992 | 17 + 31i |
| 545 | 15 + 61i | 509 | 15 + 35i | 673 | 17 + 55i | 737 | 17 + 33i | 801 | 15 + 3i | 865 | 15 + 29i | 929 | 17 + 3i | 993 | 17 + 29i |
| 546 | 13 + 63i | 510 | 13 + 33i | 674 | 19 + 53i | 738 | 19 + 33i | 802 | 15 + 3i | 866 | 13 + 31i | 930 | 19 + 1i | 994 | 19 + 31i |
| 547 | 13 + 61i | 511 | 13 + 35i | 675 | 19 + 51i | 739 | 19 + 35i | 803 | 13 + 3i | 867 | 13 + 29i | 931 | 19 + 3i | 995 | 19 + 29i |
| 548 | 15 + 57i | 512 | 13 + 39i | 676 | 17 + 57i | 740 | 17 + 39i | 804 | 15 + 7i | 868 | 15 + 25i | 932 | 17 + 7i | 996 | 17 + 25i |
| 549 | 15 + 59i | 513 | 15 + 37i | 677 | 17 + 59i | 741 | 17 + 37i | 805 | 15 + 5i | 869 | 15 + 27i | 933 | 17 + 5i | 997 | 17 + 27i |
| 550 | 13 + 57i | 514 | 13 + 39i | 678 | 19 + 57i | 742 | 19 + 39i | 806 | 13 + 7i | 870 | 13 + 25i | 934 | 19 + 7i | 998 | 19 + 25i |
| 551 | 13 + 59i | 515 | 13 + 37i | 679 | 19 + 59i | 743 | 19 + 37i | 807 | 13 + 5i | 871 | 13 + 27i | 935 | 19 + 5i | 999 | 19 + 27i |
| 552 | 9 + 63i | 516 | 9 + 35i | 680 | 23 + 53i | 744 | 23 + 35i | 808 | 9 + 11i | 872 | 9 + 31i | 936 | 23 + 11i | 1000 | 23 + 31i |
| 553 | 9 + 61i | 517 | 9 + 37i | 681 | 23 + 51i | 745 | 23 + 33i | 809 | 9 + 3i | 873 | 9 + 29i | 937 | 23 + 3i | 1001 | 23 + 29i |
| 554 | 11 + 63i | 518 | 11 + 33i | 682 | 21 + 53i | 746 | 21 + 33i | 810 | 11 + 1i | 874 | 11 + 31i | 938 | 21 + 1i | 1002 | 21 + 31i |
| 555 | 11 + 61i | 519 | 11 + 35i | 683 | 21 + 51i | 747 | 21 + 35i | 811 | 11 + 3i | 875 | 11 + 29i | 939 | 21 + 3i | 1003 | 21 + 29i |
| 556 | 9 + 57i | 520 | 9 + 39i | 684 | 23 + 57i | 748 | 23 + 39i | 812 | 9 + 7i | 876 | 9 + 25i | 940 | 23 + 7i | 1004 | 23 + 25i |
| 557 | 9 + 59i | 521 | 9 + 37i | 685 | 23 + 59i | 749 | 23 + 37i | 813 | 9 + 5i | 877 | 9 + 27i | 941 | 23 + 5i | 1005 | 23 + 27i |
| 558 | 11 + 57i | 522 | 11 + 39i | 686 | 21 + 57i | 750 | 21 + 37i | 814 | 11 + 7i | 878 | 11 + 25i | 942 | 21 + 7i | 1006 | 21 + 25i |
| 559 | 11 + 59i | 523 | 11 + 37i | 687 | 21 + 59i | 751 | 21 + 39i | 815 | 11 + 5i | 879 | 11 + 27i | 943 | 21 + 5i | 1007 | 21 + 27i |
| 560 | 15 + 49i | 524 | 15 + 47i | 688 | 17 + 47i | 752 | 17 + 47i | 816 | 15 + 15i | 880 | 15 + 17i | 944 | 17 + 15i | 1008 | 17 + 17i |
| 561 | 15 + 51i | 525 | 15 + 45i | 689 | 17 + 45i | 753 | 17 + 45i | 817 | 15 + 13i | 881 | 15 + 19i | 945 | 17 + 13i | 1009 | 17 + 19i |
| 562 | 13 + 49i | 526 | 13 + 47i | 690 | 19 + 49i | 754 | 19 + 47i | 818 | 13 + 15i | 882 | 13 + 17i | 946 | 19 + 15i | 1010 | 19 + 17i |
| 563 | 13 + 51i | 527 | 13 + 45i | 691 | 19 + 51i | 755 | 19 + 45i | 819 | 13 + 13i | 883 | 13 + 19i | 947 | 19 + 13i | 1011 | 19 + 19i |
| 564 | 15 + 55i | 528 | 15 + 41i | 692 | 17 + 55i | 756 | 17 + 41i | 820 | 15 + 9i | 884 | 15 + 23i | 948 | 17 + 9i | 1012 | 17 + 23i |
| 565 | 15 + 53i | 529 | 15 + 43i | 693 | 17 + 53i | 757 | 17 + 43i | 821 | 15 + 11i | 885 | 15 + 21i | 949 | 17 + 11i | 1013 | 17 + 21i |
| 566 | 13 + 55i | 530 | 13 + 41i | 694 | 19 + 55i | 758 | 19 + 41i | 822 | 13 + 9i | 886 | 13 + 23i | 950 | 19 + 9i | 1014 | 19 + 23i |
| 567 | 13 + 53i | 531 | 13 + 43i | 695 | 19 + 53i | 759 | 19 + 43i | 823 | 13 + 11i | 887 | 13 + 21i | 951 | 19 + 11i | 1015 | 19 + 21i |
| 568 | 9 + 49i | 532 | 9 + 47i | 696 | 23 + 49i | 760 | 23 + 47i | 824 | 9 + 15i | 888 | 9 + 17i | 952 | 23 + 15i | 1016 | 23 + 17i |
| 569 | 9 + 51i | 533 | 9 + 45i | 697 | 23 + 51i | 761 | 23 + 45i | 825 | 9 + 13i | 889 | 9 + 19i | 953 | 23 + 13i | 1017 | 23 + 19i |
| 570 | 11 + 49i | 534 | 11 + 47i | 698 | 21 + 49i | 762 | 21 + 47i | 826 | 11 + 15i | 890 | 11 + 17i | 954 | 21 + 15i | 1018 | 21 + 17i |
| 571 | 11 + 51i | 535 | 11 + 45i | 699 | 21 + 51i | 763 | 21 + 45i | 827 | 11 + 13i | 891 | 11 + 19i | 955 | 21 + 13i | 1019 | 21 + 19i |
| 572 | 9 + 55i | 536 | 9 + 41i | 700 | 23 + 55i | 764 | 23 + 41i | 828 | 9 + 9i | 892 | 9 + 23i | 956 | 23 + 9i | 1020 | 23 + 23i |
| 573 | 9 + 53i | 537 | 9 + 43i | 701 | 23 + 53i | 765 | 23 + 43i | 829 | 9 + 11i | 893 | 9 + 21i | 957 | 23 + 11i | 1021 | 23 + 21i |
| 574 | 11 + 55i | 538 | 11 + 41i | 702 | 21 + 55i | 766 | 21 + 41i | 830 | 11 + 9i | 894 | 11 + 23i | 958 | 21 + 9i | 1022 | 21 + 23i |
| 575 | 11 + 53i | 539 | 11 + 43i | 703 | 21 + 53i | 767 | 21 + 43i | 831 | 11 + 11i | 895 | 11 + 21i | 959 | 21 + 11i | 1023 | 21 + 21i |

[Fig. 20]

| Value | Scatter | Value | Scatter | Value | Scatter | Value | Scatter | Value | Scatter | Value | Scatter |
|---|---|---|---|---|---|---|---|---|---|---|---|
| 1024 | 1 - 65 | 1088 | 63 - 33 | 1152 | 33 - 63 | 1216 | 33 - 33 | 1280 | 63 - 1 | 1344 | 63 - 31 | 1408 | 33 - 1 | 1472 | 33 - 31 |
| 1025 | 65 - 3 | 1089 | 65 - 29 | 1153 | 33 - 61 | 1217 | 33 - 35 | 1281 | 63 - 3 | 1345 | 63 - 29 | 1409 | 33 - 3 | 1473 | 33 - 29 |
| 1026 | 3 - 65 | 1090 | 61 - 33 | 1154 | 29 - 65 | 1218 | 35 - 33 | 1282 | 61 - 1 | 1346 | 61 - 31 | 1410 | 35 - 1 | 1474 | 35 - 31 |
| 1027 | 3 - 67 | 1091 | 61 - 35 | 1155 | 35 - 61 | 1219 | 35 - 35 | 1283 | 61 - 3 | 1347 | 61 - 29 | 1411 | 35 - 3 | 1475 | 35 - 29 |
| 1028 | 65 - 7 | 1092 | 65 - 25 | 1156 | 33 - 57 | 1220 | 33 - 39 | 1284 | 63 - 7 | 1348 | 63 - 25 | 1412 | 33 - 7 | 1476 | 33 - 25 |
| 1029 | 65 - 5 | 1093 | 65 - 27 | 1157 | 33 - 59 | 1221 | 33 - 37 | 1285 | 63 - 5 | 1349 | 63 - 27 | 1413 | 33 - 5 | 1477 | 33 - 27 |
| 1030 | 67 - 7 | 1094 | 67 - 25 | 1158 | 35 - 57 | 1222 | 35 - 39 | 1286 | 61 - 7 | 1350 | 61 - 25 | 1414 | 35 - 7 | 1478 | 35 - 25 |
| 1031 | 67 - 5 | 1095 | 61 - 37 | 1159 | 35 - 59 | 1223 | 35 - 37 | 1287 | 61 - 5 | 1351 | 61 - 27 | 1415 | 35 - 5 | 1479 | 35 - 27 |
| 1032 | 7 - 65 | 1096 | 57 - 33 | 1160 | 25 - 65 | 1224 | 39 - 33 | 1288 | 57 - 1 | 1352 | 57 - 31 | 1416 | 39 - 1 | 1480 | 39 - 31 |
| 1033 | 7 - 67 | 1097 | 57 - 35 | 1161 | 25 - 67 | 1225 | 39 - 35 | 1289 | 57 - 3 | 1353 | 57 - 29 | 1417 | 39 - 3 | 1481 | 39 - 29 |
| 1034 | 5 - 65 | 1098 | 59 - 33 | 1162 | 27 - 65 | 1226 | 37 - 33 | 1290 | 59 - 1 | 1354 | 59 - 31 | 1418 | 37 - 1 | 1482 | 37 - 31 |
| 1035 | 5 - 67 | 1099 | 59 - 35 | 1163 | 37 - 61 | 1227 | 37 - 35 | 1291 | 59 - 3 | 1355 | 59 - 29 | 1419 | 37 - 3 | 1483 | 37 - 29 |
| 1036 | 7 - 67 | 1100 | 57 - 39 | 1164 | 39 - 57 | 1228 | 37 - 39 | 1292 | 57 - 7 | 1356 | 57 - 25 | 1420 | 39 - 7 | 1484 | 39 - 25 |
| 1037 | 7 - 69 | 1101 | 57 - 37 | 1165 | 39 - 59 | 1229 | 39 - 37 | 1293 | 57 - 5 | 1357 | 57 - 27 | 1421 | 39 - 5 | 1485 | 39 - 27 |
| 1038 | 69 - 7 | 1102 | 59 - 39 | 1166 | 37 - 57 | 1230 | 37 - 39 | 1294 | 59 - 7 | 1358 | 59 - 25 | 1422 | 37 - 7 | 1486 | 37 - 25 |
| 1039 | 5 - 69 | 1103 | 59 - 37 | 1167 | 37 - 59 | 1231 | 37 - 37 | 1295 | 59 - 5 | 1359 | 59 - 27 | 1423 | 37 - 5 | 1487 | 37 - 27 |
| 1040 | 65 - 15 | 1104 | 65 - 17 | 1168 | 33 - 49 | 1232 | 33 - 47 | 1296 | 63 - 15 | 1360 | 63 - 17 | 1424 | 33 - 15 | 1488 | 33 - 17 |
| 1041 | 65 - 13 | 1105 | 65 - 19 | 1169 | 33 - 51 | 1233 | 33 - 45 | 1297 | 63 - 13 | 1361 | 63 - 19 | 1425 | 33 - 13 | 1489 | 33 - 19 |
| 1042 | 67 - 15 | 1106 | 67 - 17 | 1170 | 35 - 49 | 1234 | 35 - 47 | 1298 | 61 - 15 | 1362 | 61 - 17 | 1426 | 35 - 15 | 1490 | 35 - 17 |
| 1043 | 67 - 13 | 1107 | 67 - 19 | 1171 | 35 - 51 | 1235 | 35 - 45 | 1299 | 61 - 13 | 1363 | 61 - 19 | 1427 | 35 - 13 | 1491 | 35 - 19 |
| 1044 | 65 - 9 | 1108 | 65 - 23 | 1172 | 33 - 55 | 1236 | 33 - 41 | 1300 | 63 - 9 | 1364 | 63 - 23 | 1428 | 33 - 9 | 1492 | 33 - 23 |
| 1045 | 65 - 11 | 1109 | 65 - 21 | 1173 | 33 - 53 | 1237 | 33 - 43 | 1301 | 63 - 11 | 1365 | 63 - 21 | 1429 | 33 - 11 | 1493 | 33 - 21 |
| 1046 | 67 - 9 | 1110 | 67 - 23 | 1174 | 35 - 55 | 1238 | 35 - 41 | 1302 | 61 - 9 | 1366 | 61 - 23 | 1430 | 35 - 9 | 1494 | 35 - 23 |
| 1047 | 67 - 11 | 1111 | 67 - 21 | 1175 | 35 - 53 | 1239 | 35 - 43 | 1303 | 61 - 11 | 1367 | 61 - 21 | 1431 | 35 - 11 | 1495 | 35 - 21 |
| 1048 | 71 - 15 | 1112 | 57 - 45 | 1176 | 39 - 49 | 1240 | 39 - 47 | 1304 | 57 - 15 | 1368 | 57 - 17 | 1432 | 39 - 15 | 1496 | 39 - 17 |
| 1049 | 71 - 13 | 1113 | 57 - 47 | 1177 | 39 - 51 | 1241 | 39 - 45 | 1305 | 57 - 13 | 1369 | 57 - 19 | 1433 | 39 - 13 | 1497 | 39 - 19 |
| 1050 | 69 - 15 | 1114 | 69 - 17 | 1178 | 37 - 49 | 1242 | 37 - 47 | 1306 | 59 - 15 | 1370 | 59 - 17 | 1434 | 37 - 15 | 1498 | 37 - 17 |
| 1051 | 69 - 13 | 1115 | 69 - 19 | 1179 | 37 - 51 | 1243 | 37 - 45 | 1307 | 59 - 13 | 1371 | 59 - 19 | 1435 | 37 - 13 | 1499 | 37 - 19 |
| 1052 | 71 - 9 | 1116 | 57 - 41 | 1180 | 39 - 55 | 1244 | 39 - 41 | 1308 | 57 - 9 | 1372 | 57 - 23 | 1436 | 39 - 9 | 1500 | 39 - 23 |
| 1053 | 71 - 11 | 1117 | 57 - 43 | 1181 | 39 - 53 | 1245 | 39 - 43 | 1309 | 57 - 11 | 1373 | 57 - 21 | 1437 | 39 - 11 | 1501 | 39 - 21 |
| 1054 | 69 - 9 | 1118 | 59 - 41 | 1182 | 37 - 55 | 1246 | 37 - 41 | 1310 | 59 - 9 | 1374 | 59 - 23 | 1438 | 37 - 9 | 1502 | 37 - 23 |
| 1055 | 69 - 11 | 1119 | 69 - 21 | 1183 | 37 - 53 | 1247 | 37 - 43 | 1311 | 59 - 11 | 1375 | 59 - 21 | 1439 | 37 - 11 | 1503 | 37 - 21 |

| Value | Scatter | Value | Scatter | Value | Scatter | Value | Scatter | Value | Scatter | Value | Scatter |
|---|---|---|---|---|---|---|---|---|---|---|---|
| 1536 | 1 - 63 | 1600 | 1 - 33 | 1664 | 31 - 63 | 1728 | 31 - 33 | 1792 | 1 - 1 | 1856 | 1 - 31 | 1920 | 31 - 1 | 1984 | 31 - 31 |
| 1537 | 1 - 61 | 1601 | 1 - 35 | 1665 | 31 - 61 | 1729 | 31 - 35 | 1793 | 1 - 3 | 1857 | 1 - 29 | 1921 | 31 - 3 | 1985 | 31 - 29 |
| 1538 | 3 - 63 | 1602 | 3 - 33 | 1666 | 29 - 63 | 1730 | 29 - 33 | 1794 | 3 - 1 | 1858 | 3 - 31 | 1922 | 29 - 1 | 1986 | 29 - 31 |
| 1539 | 3 - 61 | 1603 | 3 - 35 | 1667 | 29 - 61 | 1731 | 29 - 35 | 1795 | 3 - 3 | 1859 | 3 - 29 | 1923 | 29 - 3 | 1987 | 29 - 29 |
| 1540 | 1 - 57 | 1604 | 1 - 39 | 1668 | 31 - 57 | 1732 | 31 - 39 | 1796 | 1 - 7 | 1860 | 1 - 25 | 1924 | 31 - 7 | 1988 | 31 - 25 |
| 1541 | 1 - 59 | 1605 | 1 - 37 | 1669 | 31 - 59 | 1733 | 31 - 37 | 1797 | 1 - 5 | 1861 | 1 - 27 | 1925 | 31 - 5 | 1989 | 31 - 27 |
| 1542 | 3 - 57 | 1606 | 3 - 39 | 1670 | 29 - 57 | 1734 | 29 - 39 | 1798 | 3 - 7 | 1862 | 3 - 25 | 1926 | 29 - 7 | 1990 | 29 - 25 |
| 1543 | 3 - 59 | 1607 | 3 - 37 | 1671 | 29 - 59 | 1735 | 29 - 37 | 1799 | 3 - 5 | 1863 | 3 - 27 | 1927 | 29 - 5 | 1991 | 29 - 27 |
| 1544 | 7 - 63 | 1608 | 7 - 33 | 1672 | 25 - 63 | 1736 | 25 - 33 | 1800 | 7 - 1 | 1864 | 7 - 31 | 1928 | 25 - 1 | 1992 | 25 - 31 |
| 1545 | 7 - 61 | 1609 | 7 - 35 | 1673 | 25 - 61 | 1737 | 25 - 35 | 1801 | 7 - 3 | 1865 | 7 - 29 | 1929 | 25 - 3 | 1993 | 25 - 29 |
| 1546 | 5 - 63 | 1610 | 5 - 33 | 1674 | 27 - 63 | 1738 | 27 - 33 | 1802 | 5 - 1 | 1866 | 5 - 31 | 1930 | 27 - 1 | 1994 | 27 - 31 |
| 1547 | 5 - 61 | 1611 | 5 - 35 | 1675 | 27 - 61 | 1739 | 27 - 35 | 1803 | 5 - 3 | 1867 | 5 - 29 | 1931 | 27 - 3 | 1995 | 27 - 29 |
| 1548 | 7 - 57 | 1612 | 7 - 39 | 1676 | 25 - 57 | 1740 | 25 - 39 | 1804 | 7 - 7 | 1868 | 7 - 25 | 1932 | 25 - 7 | 1996 | 25 - 25 |
| 1549 | 7 - 59 | 1613 | 7 - 37 | 1677 | 25 - 59 | 1741 | 25 - 37 | 1805 | 7 - 5 | 1869 | 7 - 27 | 1933 | 25 - 5 | 1997 | 25 - 27 |
| 1550 | 5 - 57 | 1614 | 5 - 39 | 1678 | 27 - 57 | 1742 | 27 - 39 | 1806 | 5 - 7 | 1870 | 5 - 25 | 1934 | 27 - 7 | 1998 | 27 - 25 |
| 1551 | 5 - 59 | 1615 | 5 - 37 | 1679 | 27 - 59 | 1743 | 27 - 37 | 1807 | 5 - 5 | 1871 | 5 - 27 | 1935 | 27 - 5 | 1999 | 27 - 27 |
| 1552 | 1 - 49 | 1616 | 1 - 47 | 1680 | 31 - 49 | 1744 | 31 - 47 | 1808 | 1 - 15 | 1872 | 1 - 17 | 1936 | 31 - 15 | 2000 | 31 - 17 |
| 1553 | 1 - 51 | 1617 | 1 - 45 | 1681 | 31 - 51 | 1745 | 31 - 45 | 1809 | 1 - 13 | 1873 | 1 - 19 | 1937 | 31 - 13 | 2001 | 31 - 19 |
| 1554 | 3 - 49 | 1618 | 3 - 47 | 1682 | 29 - 49 | 1746 | 29 - 47 | 1810 | 3 - 15 | 1874 | 3 - 17 | 1938 | 29 - 15 | 2002 | 29 - 17 |
| 1555 | 3 - 51 | 1619 | 3 - 45 | 1683 | 29 - 51 | 1747 | 29 - 45 | 1811 | 3 - 13 | 1875 | 3 - 19 | 1939 | 29 - 13 | 2003 | 29 - 19 |
| 1556 | 1 - 55 | 1620 | 1 - 41 | 1684 | 31 - 55 | 1748 | 31 - 41 | 1812 | 1 - 9 | 1876 | 1 - 23 | 1940 | 31 - 9 | 2004 | 31 - 23 |
| 1557 | 1 - 53 | 1621 | 1 - 43 | 1685 | 31 - 53 | 1749 | 31 - 43 | 1813 | 1 - 11 | 1877 | 1 - 21 | 1941 | 31 - 11 | 2005 | 31 - 21 |
| 1558 | 3 - 55 | 1622 | 3 - 41 | 1686 | 29 - 55 | 1750 | 29 - 41 | 1814 | 3 - 9 | 1878 | 3 - 23 | 1942 | 29 - 9 | 2006 | 29 - 23 |
| 1559 | 3 - 53 | 1623 | 3 - 43 | 1687 | 29 - 53 | 1751 | 29 - 43 | 1815 | 3 - 11 | 1879 | 3 - 21 | 1943 | 29 - 11 | 2007 | 29 - 21 |
| 1560 | 7 - 49 | 1624 | 7 - 47 | 1688 | 25 - 49 | 1752 | 25 - 47 | 1816 | 7 - 15 | 1880 | 7 - 17 | 1944 | 25 - 15 | 2008 | 25 - 17 |
| 1561 | 7 - 51 | 1625 | 7 - 45 | 1689 | 25 - 51 | 1753 | 25 - 45 | 1817 | 7 - 13 | 1881 | 7 - 19 | 1945 | 25 - 13 | 2009 | 25 - 19 |
| 1562 | 5 - 49 | 1626 | 5 - 47 | 1690 | 27 - 49 | 1754 | 27 - 47 | 1818 | 5 - 15 | 1882 | 5 - 17 | 1946 | 27 - 15 | 2010 | 27 - 17 |
| 1563 | 5 - 51 | 1627 | 5 - 45 | 1691 | 27 - 51 | 1755 | 27 - 45 | 1819 | 5 - 13 | 1883 | 5 - 19 | 1947 | 27 - 13 | 2011 | 27 - 19 |
| 1564 | 7 - 55 | 1628 | 7 - 41 | 1692 | 25 - 55 | 1756 | 25 - 41 | 1820 | 7 - 9 | 1884 | 7 - 23 | 1948 | 25 - 9 | 2012 | 25 - 23 |
| 1565 | 7 - 53 | 1629 | 7 - 43 | 1693 | 25 - 53 | 1757 | 25 - 43 | 1821 | 7 - 11 | 1885 | 7 - 21 | 1949 | 25 - 11 | 2013 | 25 - 21 |
| 1566 | 5 - 55 | 1630 | 5 - 41 | 1694 | 27 - 55 | 1758 | 27 - 41 | 1822 | 5 - 9 | 1886 | 5 - 23 | 1950 | 27 - 9 | 2014 | 27 - 23 |
| 1567 | 5 - 53 | 1631 | 5 - 43 | 1695 | 27 - 53 | 1759 | 27 - 43 | 1823 | 5 - 11 | 1887 | 5 - 21 | 1951 | 27 - 11 | 2015 | 27 - 21 |
| 1568 | 15 - 63 | 1632 | 15 - 33 | 1696 | 17 - 63 | 1760 | 17 - 33 | 1824 | 15 - 1 | 1888 | 15 - 31 | 1952 | 17 - 1 | 2016 | 17 - 31 |
| 1569 | 15 - 61 | 1633 | 15 - 35 | 1697 | 17 - 61 | 1761 | 17 - 35 | 1825 | 15 - 3 | 1889 | 15 - 29 | 1953 | 17 - 3 | 2017 | 17 - 29 |
| 1570 | 13 - 63 | 1634 | 13 - 33 | 1698 | 19 - 63 | 1762 | 19 - 33 | 1826 | 13 - 1 | 1890 | 13 - 31 | 1954 | 19 - 1 | 2018 | 19 - 31 |

[Fig. 23]

| | | | | | | | | | | | | |
|---|---|---|---|---|---|---|---|---|---|---|---|---|
| 1571 | 13 - 61 | 1635 | 13 - 35 | 1699 | 19 - 61 | 1763 | 19 - 35 | 1827 | 13 - 3 | 1891 | 13 - 29 | 1955 | 19 - 3 | 2019 | 19 - 29 |
| 1572 | 15 - 57 | 1636 | 15 - 39 | 1700 | 17 - 57 | 1764 | 17 - 39 | 1828 | 15 - 7 | 1892 | 15 - 25 | 1956 | 17 - 7 | 2020 | 17 - 25 |
| 1573 | 15 - 59 | 1637 | 15 - 37 | 1701 | 17 - 59 | 1765 | 17 - 37 | 1829 | 15 - 5 | 1893 | 15 - 27 | 1957 | 17 - 5 | 2021 | 17 - 27 |
| 1574 | 13 - 57 | 1638 | 13 - 39 | 1702 | 19 - 57 | 1766 | 19 - 39 | 1830 | 13 - 7 | 1894 | 13 - 25 | 1958 | 19 - 7 | 2022 | 19 - 25 |
| 1575 | 13 - 59 | 1639 | 13 - 37 | 1703 | 19 - 59 | 1767 | 19 - 37 | 1831 | 13 - 5 | 1895 | 13 - 27 | 1959 | 19 - 5 | 2023 | 19 - 27 |
| 1576 | 9 - 63 | 1640 | 9 - 33 | 1704 | 23 - 63 | 1768 | 23 - 33 | 1832 | 9 - 1 | 1896 | 9 - 31 | 1960 | 23 - 1 | 2024 | 23 - 31 |
| 1577 | 9 - 61 | 1641 | 9 - 35 | 1705 | 23 - 61 | 1769 | 23 - 35 | 1833 | 9 - 3 | 1897 | 9 - 29 | 1961 | 23 - 3 | 2025 | 23 - 29 |
| 1578 | 11 - 63 | 1642 | 11 - 33 | 1706 | 21 - 63 | 1770 | 21 - 33 | 1834 | 11 - 1 | 1898 | 11 - 31 | 1962 | 21 - 1 | 2026 | 21 - 31 |
| 1579 | 11 - 61 | 1643 | 11 - 35 | 1707 | 21 - 61 | 1771 | 21 - 35 | 1835 | 11 - 3 | 1899 | 11 - 29 | 1963 | 21 - 3 | 2027 | 21 - 29 |
| 1580 | 9 - 57 | 1644 | 9 - 39 | 1708 | 23 - 57 | 1772 | 23 - 39 | 1836 | 9 - 7 | 1900 | 9 - 25 | 1964 | 23 - 7 | 2028 | 23 - 25 |
| 1581 | 9 - 59 | 1645 | 9 - 37 | 1709 | 23 - 59 | 1773 | 23 - 37 | 1837 | 9 - 5 | 1901 | 9 - 27 | 1965 | 23 - 5 | 2029 | 23 - 27 |
| 1582 | 11 - 57 | 1646 | 11 - 39 | 1710 | 21 - 57 | 1774 | 21 - 39 | 1838 | 11 - 7 | 1902 | 11 - 25 | 1966 | 21 - 7 | 2030 | 21 - 25 |
| 1583 | 11 - 59 | 1647 | 11 - 37 | 1711 | 21 - 59 | 1775 | 21 - 37 | 1839 | 11 - 5 | 1903 | 11 - 27 | 1967 | 21 - 5 | 2031 | 21 - 27 |
| 1584 | 15 - 49 | 1648 | 15 - 47 | 1712 | 17 - 49 | 1776 | 17 - 47 | 1840 | 15 - 15 | 1904 | 15 - 17 | 1968 | 17 - 15 | 2032 | 17 - 17 |
| 1585 | 15 - 51 | 1649 | 15 - 45 | 1713 | 17 - 51 | 1777 | 17 - 45 | 1841 | 15 - 13 | 1905 | 15 - 19 | 1969 | 17 - 13 | 2033 | 17 - 19 |
| 1586 | 13 - 49 | 1650 | 13 - 47 | 1714 | 19 - 49 | 1778 | 19 - 47 | 1842 | 13 - 15 | 1906 | 13 - 17 | 1970 | 19 - 15 | 2034 | 19 - 17 |
| 1587 | 13 - 51 | 1651 | 13 - 45 | 1715 | 19 - 51 | 1779 | 19 - 45 | 1843 | 13 - 13 | 1907 | 13 - 19 | 1971 | 19 - 13 | 2035 | 19 - 19 |
| 1588 | 15 - 55 | 1652 | 15 - 41 | 1716 | 17 - 55 | 1780 | 17 - 41 | 1844 | 15 - 9 | 1908 | 15 - 23 | 1972 | 17 - 9 | 2036 | 17 - 23 |
| 1589 | 15 - 53 | 1653 | 15 - 43 | 1717 | 17 - 53 | 1781 | 17 - 43 | 1845 | 15 - 11 | 1909 | 15 - 21 | 1973 | 17 - 11 | 2037 | 17 - 21 |
| 1590 | 13 - 55 | 1654 | 13 - 41 | 1718 | 19 - 55 | 1782 | 19 - 41 | 1846 | 13 - 9 | 1910 | 13 - 23 | 1974 | 19 - 9 | 2038 | 19 - 23 |
| 1591 | 13 - 53 | 1655 | 13 - 43 | 1719 | 19 - 53 | 1783 | 19 - 43 | 1847 | 13 - 11 | 1911 | 13 - 21 | 1975 | 19 - 11 | 2039 | 19 - 21 |
| 1592 | 9 - 49 | 1656 | 9 - 47 | 1720 | 23 - 49 | 1784 | 23 - 47 | 1848 | 9 - 15 | 1912 | 9 - 17 | 1976 | 23 - 15 | 2040 | 23 - 17 |
| 1593 | 9 - 51 | 1657 | 9 - 45 | 1721 | 23 - 51 | 1785 | 23 - 45 | 1849 | 9 - 13 | 1913 | 9 - 19 | 1977 | 23 - 13 | 2041 | 23 - 19 |
| 1594 | 11 - 49 | 1658 | 11 - 47 | 1722 | 21 - 49 | 1786 | 21 - 47 | 1850 | 11 - 15 | 1914 | 11 - 17 | 1978 | 21 - 15 | 2042 | 21 - 17 |
| 1595 | 11 - 51 | 1659 | 11 - 45 | 1723 | 21 - 51 | 1787 | 21 - 45 | 1851 | 11 - 13 | 1915 | 11 - 19 | 1979 | 21 - 13 | 2043 | 21 - 19 |
| 1596 | 9 - 55 | 1660 | 9 - 41 | 1724 | 23 - 55 | 1788 | 23 - 41 | 1852 | 9 - 9 | 1916 | 9 - 23 | 1980 | 23 - 9 | 2044 | 23 - 23 |
| 1597 | 9 - 53 | 1661 | 9 - 43 | 1725 | 23 - 53 | 1789 | 23 - 43 | 1853 | 9 - 11 | 1917 | 9 - 21 | 1981 | 23 - 11 | 2045 | 23 - 21 |
| 1598 | 11 - 55 | 1662 | 11 - 41 | 1726 | 21 - 55 | 1790 | 21 - 41 | 1854 | 11 - 9 | 1918 | 11 - 23 | 1982 | 21 - 9 | 2046 | 21 - 23 |
| 1599 | 11 - 53 | 1663 | 11 - 43 | 1727 | 21 - 53 | 1791 | 21 - 43 | 1855 | 11 - 11 | 1919 | 11 - 21 | 1983 | 21 - 11 | 2047 | 21 - 21 |

| | | | | | | | | | | | | |
|---|---|---|---|---|---|---|---|---|---|---|---|---|
| 2591 | -5+5i | 2655 | -5+43i | 2719 | -27+53i | 2783 | -27+43i | 2847 | -5+11i | 2911 | -5+21i | 2975 | -27+11i | 3039 | -27+21i |
| 2592 | -15+63i | 2656 | -15+33i | 2720 | -17+63i | 2784 | -17+33i | 2848 | -15+1i | 2912 | -15+31i | 2976 | -17+1i | 3040 | -17+31i |
| 2593 | -15+61i | 2657 | -15+35i | 2721 | -17+61i | 2785 | -17+35i | 2849 | -15+3i | 2913 | -15+29i | 2977 | -17+3i | 3041 | -17+29i |
| 2594 | -13+63i | 2658 | -13+33i | 2722 | -19+63i | 2786 | -19+33i | 2850 | -13+1i | 2914 | -13+31i | 2978 | -19+1i | 3042 | -19+31i |
| 2595 | -13+61i | 2659 | -13+35i | 2723 | -19+61i | 2787 | -19+35i | 2851 | -13+3i | 2915 | -13+29i | 2979 | -19+3i | 3043 | -19+29i |
| 2596 | -15+57i | 2660 | -15+39i | 2724 | -17+57i | 2788 | -17+39i | 2852 | -15+7i | 2916 | -15+25i | 2980 | -17+7i | 3044 | -17+25i |
| 2597 | -15+59i | 2661 | -15+37i | 2725 | -17+59i | 2789 | -17+37i | 2853 | -15+5i | 2917 | -15+27i | 2981 | -17+5i | 3045 | -17+27i |
| 2598 | -13+57i | 2662 | -13+39i | 2726 | -19+57i | 2790 | -19+39i | 2854 | -13+7i | 2918 | -13+25i | 2982 | -19+7i | 3046 | -19+25i |
| 2599 | -13+59i | 2663 | -13+37i | 2727 | -19+59i | 2791 | -19+37i | 2855 | -13+5i | 2919 | -13+27i | 2983 | -19+5i | 3047 | -19+27i |
| 2600 | -9+63i | 2664 | -9+33i | 2728 | -23+63i | 2792 | -23+33i | 2856 | -9+1i | 2920 | -9+31i | 2984 | -23+1i | 3048 | -23+31i |
| 2601 | -9+61i | 2665 | -9+35i | 2729 | -23+61i | 2793 | -23+35i | 2857 | -9+3i | 2921 | -9+29i | 2985 | -23+3i | 3049 | -23+29i |
| 2602 | -11+63i | 2666 | -11+33i | 2730 | -21+63i | 2794 | -21+33i | 2858 | -11+1i | 2922 | -11+31i | 2986 | -21+1i | 3050 | -21+31i |
| 2603 | -11+61i | 2667 | -11+35i | 2731 | -21+61i | 2795 | -21+35i | 2859 | -11+3i | 2923 | -11+29i | 2987 | -21+3i | 3051 | -21+29i |
| 2604 | -9+57i | 2668 | -9+39i | 2732 | -23+57i | 2796 | -23+39i | 2860 | -9+7i | 2924 | -9+25i | 2988 | -23+7i | 3052 | -23+25i |
| 2605 | -9+59i | 2669 | -9+37i | 2733 | -23+59i | 2797 | -23+37i | 2861 | -9+5i | 2925 | -9+27i | 2989 | -23+5i | 3053 | -23+27i |
| 2606 | -11+57i | 2670 | -11+39i | 2734 | -21+57i | 2798 | -21+39i | 2862 | -11+7i | 2926 | -11+25i | 2990 | -21+7i | 3054 | -21+25i |
| 2607 | -11+59i | 2671 | -11+37i | 2735 | -21+59i | 2799 | -21+37i | 2863 | -11+5i | 2927 | -11+27i | 2991 | -21+5i | 3055 | -21+27i |
| 2608 | -15+49i | 2672 | -15+47i | 2736 | -17+49i | 2800 | -17+47i | 2864 | -15+15i | 2928 | -15+17i | 2992 | -17+15i | 3056 | -17+17i |
| 2609 | -15+51i | 2673 | -15+45i | 2737 | -17+51i | 2801 | -17+45i | 2865 | -15+13i | 2929 | -15+19i | 2993 | -17+13i | 3057 | -17+19i |
| 2610 | -13+49i | 2674 | -13+47i | 2738 | -19+49i | 2802 | -19+47i | 2866 | -13+15i | 2930 | -13+17i | 2994 | -19+15i | 3058 | -19+17i |
| 2611 | -13+51i | 2675 | -13+45i | 2739 | -19+51i | 2803 | -19+45i | 2867 | -13+13i | 2931 | -13+19i | 2995 | -19+13i | 3059 | -19+19i |
| 2612 | -15+55i | 2676 | -15+41i | 2740 | -17+55i | 2804 | -17+41i | 2868 | -15+9i | 2932 | -15+23i | 2996 | -17+9i | 3060 | -17+23i |
| 2613 | -15+53i | 2677 | -15+43i | 2741 | -17+53i | 2805 | -17+43i | 2869 | -15+11i | 2933 | -15+21i | 2997 | -17+11i | 3061 | -17+21i |
| 2614 | -13+55i | 2678 | -13+41i | 2742 | -19+55i | 2806 | -19+41i | 2870 | -13+9i | 2934 | -13+23i | 2998 | -19+9i | 3062 | -19+23i |
| 2615 | -13+53i | 2679 | -13+43i | 2743 | -19+53i | 2807 | -19+43i | 2871 | -13+11i | 2935 | -13+21i | 2999 | -19+11i | 3063 | -19+21i |
| 2616 | -9+49i | 2680 | -9+47i | 2744 | -23+49i | 2808 | -23+47i | 2872 | -9+15i | 2936 | -9+17i | 3000 | -23+15i | 3064 | -23+17i |
| 2617 | -9+51i | 2681 | -9+45i | 2745 | -23+51i | 2809 | -23+45i | 2873 | -9+13i | 2937 | -9+19i | 3001 | -23+13i | 3065 | -23+19i |
| 2618 | -11+49i | 2682 | -11+47i | 2746 | -21+49i | 2810 | -21+47i | 2874 | -11+15i | 2938 | -11+17i | 3002 | -21+15i | 3066 | -21+17i |
| 2619 | -11+51i | 2683 | -11+45i | 2747 | -21+51i | 2811 | -21+45i | 2875 | -11+13i | 2939 | -11+19i | 3003 | -21+13i | 3067 | -21+19i |
| 2620 | -9+55i | 2684 | -9+41i | 2748 | -23+55i | 2812 | -23+41i | 2876 | -9+9i | 2940 | -9+23i | 3004 | -23+9i | 3068 | -23+23i |
| 2621 | -9+53i | 2685 | -9+43i | 2749 | -23+53i | 2813 | -23+43i | 2877 | -9+11i | 2941 | -9+21i | 3005 | -23+11i | 3069 | -23+21i |
| 2622 | -11+55i | 2686 | -11+41i | 2750 | -21+55i | 2814 | -21+41i | 2878 | -11+9i | 2942 | -11+23i | 3006 | -21+9i | 3070 | -21+23i |
| 2623 | -11+53i | 2687 | -11+43i | 2751 | -21+53i | 2815 | -21+43i | 2879 | -11+11i | 2943 | -11+21i | 3007 | -21+11i | 3071 | -21+21i |

| | | | | | | | | |
|---|---|---|---|---|---|---|---|---|
| 3101 -71 -11 | 3165 -57 -43 | 3229 -39 -53 | 3293 -39 -43 | 3357 -57 -11 | 3421 -57 -21 | 3485 -39 -11 | 3549 -39 -21 | |
| 3102 -69 -9 | 3166 -59 -41 | 3230 -37 -55 | 3294 -37 -41 | 3358 -59 -9 | 3422 -59 -23 | 3486 -37 -9 | 3550 -37 -23 | |
| 3103 -69 -11 | 3167 -69 -21 | 3231 -37 -53 | 3295 -37 -43 | 3359 -59 -11 | 3423 -59 -21 | 3487 -37 -11 | 3551 -37 -21 | |
| 3104 -15 -65 | 3168 -49 -33 | 3232 -17 -65 | 3296 -47 -33 | 3360 -49 -9 | 3424 -49 -31 | 3488 -47 -11 | 3552 -47 -31 | |
| 3105 -15 -67 | 3169 -49 -35 | 3233 -17 -67 | 3297 -47 -35 | 3361 -49 -9 | 3425 -49 -29 | 3489 -47 -9 | 3553 -47 -29 | |
| 3106 -13 -65 | 3170 -51 -33 | 3234 -19 -65 | 3298 -45 -33 | 3362 -51 -11 | 3426 -51 -31 | 3490 -45 -11 | 3554 -45 -31 | |
| 3107 -13 -67 | 3171 -51 -35 | 3235 -19 -67 | 3299 -45 -35 | 3363 -51 -9 | 3427 -51 -29 | 3491 -45 -9 | 3555 -45 -29 | |
| 3108 -15 -69 | 3172 -49 -39 | 3236 -17 -71 | 3300 -47 -39 | 3364 -49 -7 | 3428 -49 -25 | 3492 -47 -7 | 3556 -47 -25 | |
| 3109 -15 -67 | 3173 -49 -37 | 3237 -17 -69 | 3301 -47 -37 | 3365 -49 -5 | 3429 -49 -27 | 3493 -47 -5 | 3557 -47 -27 | |
| 3110 -13 -71 | 3174 -51 -39 | 3238 -45 -57 | 3302 -45 -39 | 3366 -51 -7 | 3430 -51 -25 | 3494 -45 -7 | 3558 -45 -25 | |
| 3111 -13 -69 | 3175 -51 -37 | 3239 -19 -69 | 3303 -45 -37 | 3367 -51 -5 | 3431 -51 -27 | 3495 -45 -5 | 3559 -45 -27 | |
| 3112 -9 -65 | 3176 -55 -33 | 3240 -23 -65 | 3304 -41 -33 | 3368 -55 -11 | 3432 -55 -31 | 3496 -41 -11 | 3560 -41 -31 | |
| 3113 -9 -67 | 3177 -55 -35 | 3241 -23 -67 | 3305 -41 -35 | 3369 -55 -9 | 3433 -55 -29 | 3497 -41 -9 | 3561 -41 -29 | |
| 3114 -11 -65 | 3178 -53 -33 | 3242 -21 -65 | 3306 -43 -33 | 3370 -53 -11 | 3434 -53 -31 | 3498 -43 -11 | 3562 -43 -31 | |
| 3115 -11 -67 | 3179 -53 -35 | 3243 -21 -67 | 3307 -43 -35 | 3371 -53 -9 | 3435 -53 -29 | 3499 -43 -9 | 3563 -43 -29 | |
| 3116 -9 -71 | 3180 -55 -39 | 3244 -41 -57 | 3308 -41 -39 | 3372 -55 -7 | 3436 -55 -25 | 3500 -41 -7 | 3564 -41 -25 | |
| 3117 -9 -69 | 3181 -55 -37 | 3245 -41 -59 | 3309 -41 -37 | 3373 -55 -5 | 3437 -55 -27 | 3501 -41 -5 | 3565 -41 -27 | |
| 3118 -11 -71 | 3182 -53 -39 | 3246 -43 -57 | 3310 -43 -39 | 3374 -53 -7 | 3438 -53 -25 | 3502 -43 -7 | 3566 -43 -25 | |
| 3119 -11 -69 | 3183 -53 -37 | 3247 -21 -69 | 3311 -43 -37 | 3375 -53 -5 | 3439 -53 -27 | 3503 -43 -5 | 3567 -43 -27 | |
| 3120 -49 -49 | 3184 -49 -47 | 3248 -47 -49 | 3312 -47 -47 | 3376 -49 -15 | 3440 -49 -17 | 3504 -47 -15 | 3568 -47 -17 | |
| 3121 -49 -51 | 3185 -49 -45 | 3249 -47 -51 | 3313 -47 -45 | 3377 -49 -13 | 3441 -49 -19 | 3505 -47 -13 | 3569 -47 -19 | |
| 3122 -51 -49 | 3186 -51 -47 | 3250 -45 -49 | 3314 -45 -47 | 3378 -51 -15 | 3442 -51 -17 | 3506 -45 -15 | 3570 -45 -17 | |
| 3123 -51 -51 | 3187 -51 -45 | 3251 -45 -51 | 3315 -45 -45 | 3379 -51 -13 | 3443 -51 -19 | 3507 -45 -13 | 3571 -45 -19 | |
| 3124 -49 -55 | 3188 -49 -41 | 3252 -47 -55 | 3316 -47 -41 | 3380 -49 -9 | 3444 -49 -23 | 3508 -47 -9 | 3572 -47 -23 | |
| 3125 -49 -53 | 3189 -49 -43 | 3253 -47 -53 | 3317 -47 -43 | 3381 -49 -11 | 3445 -49 -21 | 3509 -47 -11 | 3573 -47 -21 | |
| 3126 -13 -73 | 3190 -51 -41 | 3254 -45 -55 | 3318 -45 -41 | 3382 -51 -9 | 3446 -51 -23 | 3510 -45 -9 | 3574 -45 -23 | |
| 3127 -51 -53 | 3191 -51 -43 | 3255 -45 -53 | 3319 -45 -43 | 3383 -51 -11 | 3447 -51 -21 | 3511 -45 -11 | 3575 -45 -21 | |
| 3128 -55 -49 | 3192 -55 -47 | 3256 -41 -49 | 3320 -41 -47 | 3384 -55 -15 | 3448 -55 -17 | 3512 -41 -15 | 3576 -41 -17 | |
| 3129 -73 -13 | 3193 -55 -45 | 3257 -41 -51 | 3321 -41 -45 | 3385 -55 -13 | 3449 -55 -19 | 3513 -41 -13 | 3577 -41 -19 | |
| 3130 -53 -49 | 3194 -53 -47 | 3258 -43 -49 | 3322 -43 -47 | 3386 -53 -15 | 3450 -53 -17 | 3514 -43 -15 | 3578 -43 -17 | |
| 3131 -53 -51 | 3195 -53 -45 | 3259 -43 -51 | 3323 -43 -45 | 3387 -53 -13 | 3451 -53 -19 | 3515 -43 -13 | 3579 -43 -19 | |
| 3132 -73 -9 | 3196 -55 -41 | 3260 -41 -55 | 3324 -41 -41 | 3388 -55 -9 | 3452 -55 -23 | 3516 -41 -9 | 3580 -41 -23 | |
| 3133 -73 -11 | 3197 -55 -43 | 3261 -41 -53 | 3325 -41 -43 | 3389 -55 -11 | 3453 -55 -21 | 3517 -41 -11 | 3581 -41 -21 | |
| 3134 -11 -73 | 3198 -53 -41 | 3262 -43 -55 | 3326 -43 -41 | 3390 -53 -9 | 3454 -53 -23 | 3518 -43 -9 | 3582 -43 -23 | |
| 3135 -53 -53 | 3199 -53 -43 | 3263 -43 -53 | 3327 -43 -43 | 3391 -53 -11 | 3455 -53 -21 | 3519 -43 -11 | 3583 -43 -21 | |

[Fig. 32]
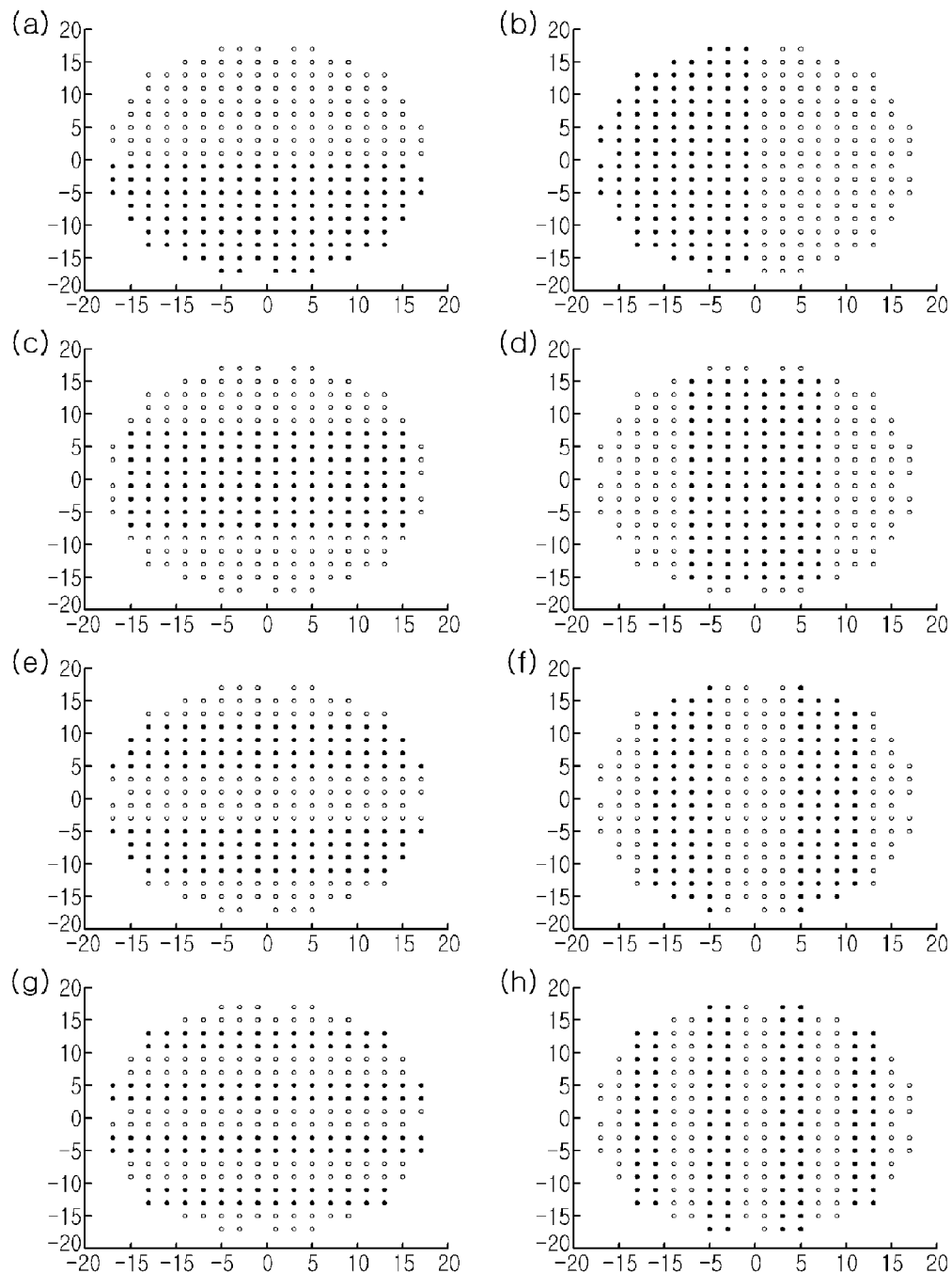

[Fig. 33]
(a)
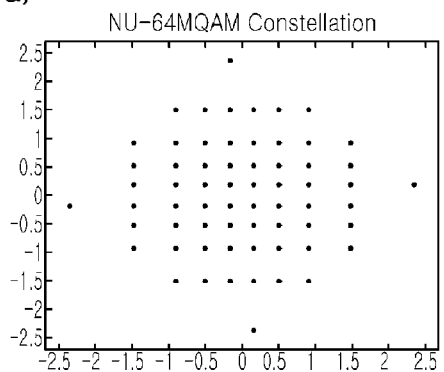
(b)
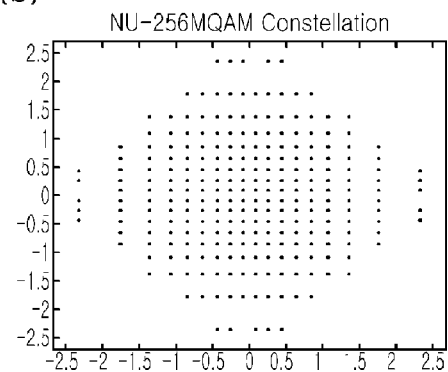
(c)
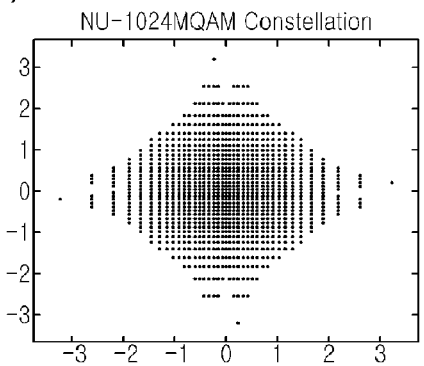
(d)
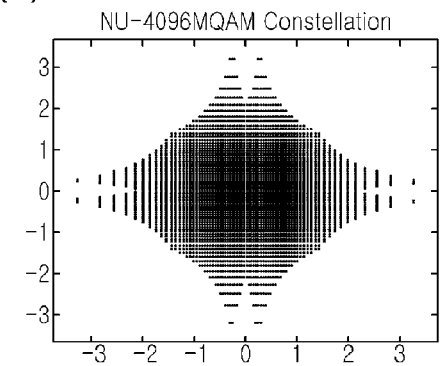
[Fig. 34]
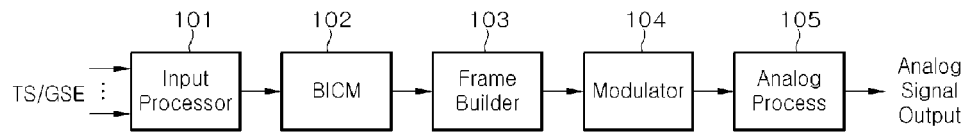

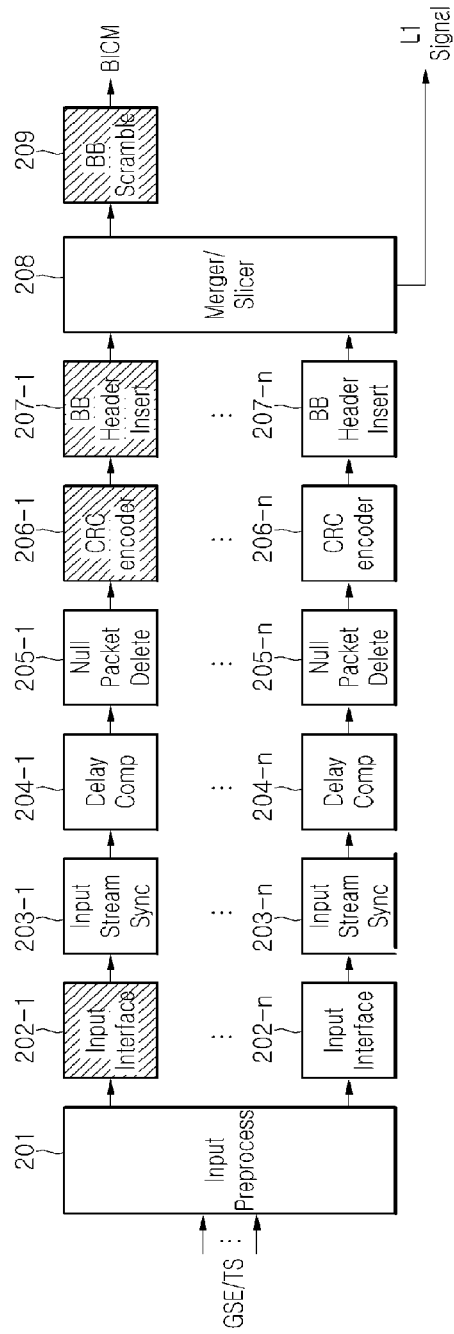
[Fig. 35]

[Fig. 36]

| TS/GS (2 bits) | SIS/MIS (1 bit) | CCM/ACM (1 bit) | ISSYI (1 bit) | NPD (1bit) | EXT (2bits) |
|---|---|---|---|---|---|
| 00 = GFPS<br>11 = TS<br>01 = GCS<br>10 = GSE | 1 = single<br>0 = multiple | 1 = CCM<br>0 = ACM | 1 = active<br>0 = not-active | 1= active<br>0 = not-active | Reserved for future use |

| Field | Size (Bytes) | Description |
|---|---|---|
| MATYPE | 2 | As described above |
| UPL | 2 | User Packet Length in bits, in the range [0,65535] |
| DFL | 2 | Data Field Length in bits, in the range [ 0,53760] |
| SYNC | 1 | A copy of the User Packet Sync-byte |
| SYNCD | 2 | The distance in bits from the beginning of the DATA FIELD to the first complete UP of the data field. SYNCD=$0_D$ means that the first UP is aligned to the beginning of the Data Field. SYNCD = $65535_D$ means that no UP starts in the DATA FIELD. |
| CRC-8 MODE | 1 | The XOR of the CRC-8 (1-byte) field with the MODE field (1-byte). CRC-8 is the error detection code applied to the first 9 bytes of the BBHEADER.<br>MODE (8 bits) shall be:<br>• $0_D$ Normal Mode<br>• $1_D$ High Efficiency Mode<br>• Other values : reserved for future use. |

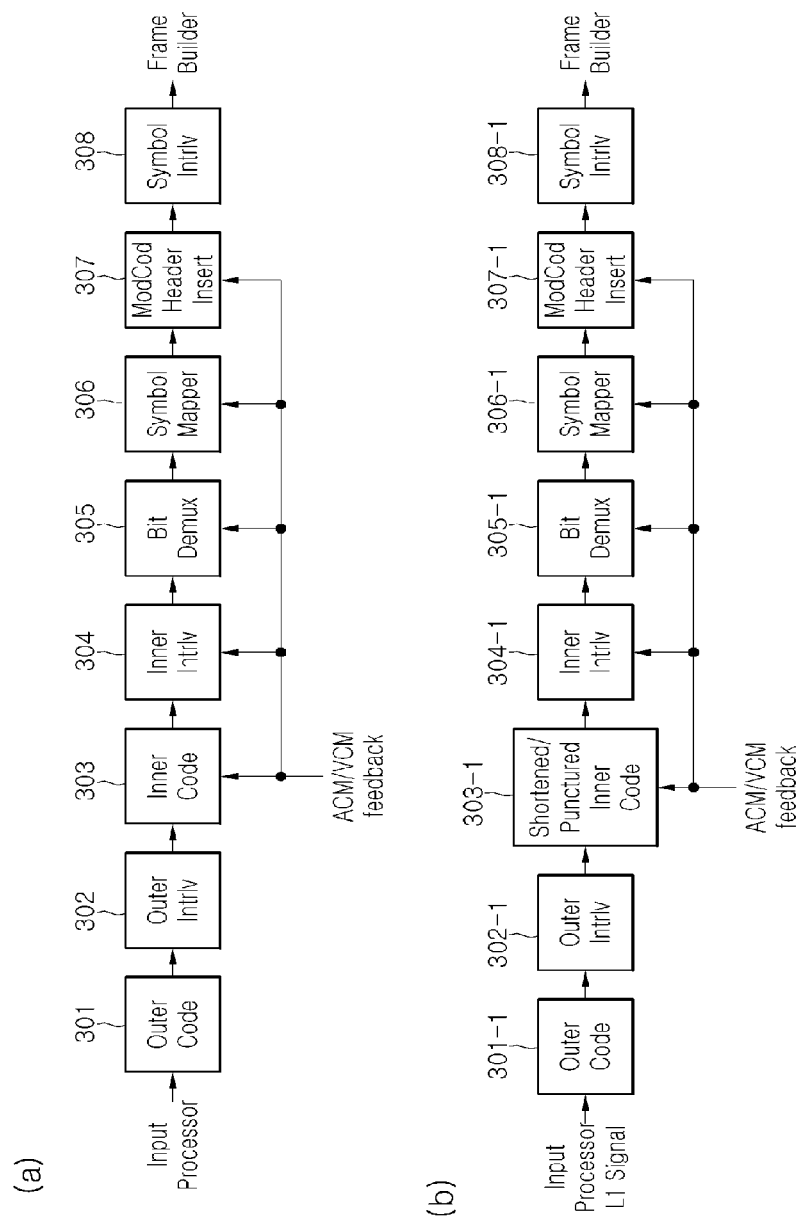

[Fig. 38]
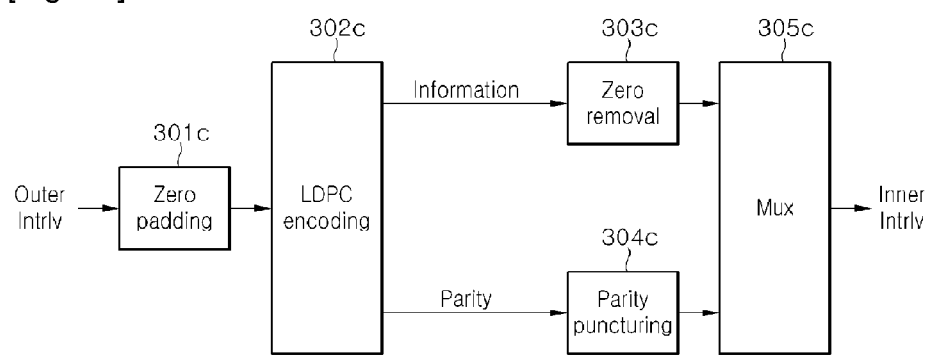

[Fig. 39]

| Capacity (bit/s/Hz) | | | Case 1 Modulation | Case 2 Modulation |
|---|---|---|---|---|
| 6 | 1/2 | 3.0 | NU-MQAM | NU-QAM |
| | 2/3 | 4.0 | NU-MQAM | NU-QAM |
| | 3/4 | 4.5 | NU-MQAM | NU-MQAM |
| | 4/5 | 4.8 | MQAM | MQAM |
| | 5/6 | 5.0 | MQAM | MQAM |
| | 8/9 | 5.3 | MQAM | MQAM |
| | 9/10 | 5.4 | MQAM | MQAM |
| 8 | 1/2 | 4.0 | NU-MQAM | NU-QAM |
| | 2/3 | 5.3 | NU-MQAM | NU-QAM |
| | 3/4 | 6.0 | NU-MQAM | NU-MQAM |
| | 4/5 | 6.4 | NU-MQAM | NU-MQAM |
| | 5/6 | 6.7 | MQAM | MQAM |
| | 8/9 | 7.1 | MQAM | MQAM |
| | 9/10 | 7.2 | MQAM | MQAM |
| 10 | 1/2 | 5.0 | NU-MQAM | NU-QAM |
| | 2/3 | 6.7 | NU-MQAM | NU-QAM |
| | 3/4 | 7.5 | NU-MQAM | NU-MQAM |
| | 4/5 | 8.0 | NU-MQAM | NU-MQAM |
| | 5/6 | 8.3 | NU-MQAM | NU-MQAM |
| | 8/9 | 8.9 | MQAM | MQAM |
| | 9/10 | 9.0 | MQAM | MQAM |
| 12 | 1/2 | 6.0 | NU-MQAM | NU-QAM |
| | 2/3 | 8.0 | NU-MQAM | NU-QAM |
| | 3/4 | 9.0 | NU-MQAM | NU-MQAM |
| | 4/5 | 9.6 | NU-MQAM | NU-MQAM |
| | 5/6 | 10.0 | NU-MQAM | NU-MQAM |
| | 8/9 | 10.7 | MQAM | MQAM |
| | 9/10 | 10.8 | MQAM | MQAM |

[Fig. 40]

| | Capacity (bit/s/Hz) | | Case 1 Modulation | Case 2 Modulation | Case 2 Modulation |
|---|---|---|---|---|---|
| 2 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 4 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 6 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 8 | 1/2 | 4.0 | QAM | QAM | QAM |
| | 2/3 | 5.3 | QAM | QAM | QAM |
| | 3/4 | 6.0 | QAM | QAM | QAM |
| | 4/5 | 6.4 | QAM | QAM | QAM |
| | 5/6 | 6.7 | QAM | QAM | QAM |
| | 8/9 | 7.1 | QAM | QAM | QAM |
| | 9/10 | 7.2 | QAM | QAM | QAM |
| 10 | 1/2 | 5.0 | NU-MQAM | NU-QAM | MQAM |
| | 2/3 | 6.7 | NU-MQAM | NU-QAM | MQAM |
| | 3/4 | 7.5 | NU-MQAM | NU-MQAM | MQAM |
| | 4/5 | 8.0 | NU-MQAM | NU-MQAM | MQAM |
| | 5/6 | 8.3 | NU-MQAM | NU-MQAM | MQAM |
| | 8/9 | 8.9 | MQAM | MQAM | MQAM |
| | 9/10 | 9.0 | MQAM | MQAM | MQAM |
| 12 | 1/2 | 6.0 | NU-MQAM | NU-QAM | MQAM |
| | 2/3 | 8.0 | NU-MQAM | NU-QAM | MQAM |
| | 3/4 | 9.0 | NU-MQAM | NU-MQAM | MQAM |
| | 4/5 | 9.6 | NU-MQAM | NU-MQAM | MQAM |
| | 5/6 | 10.0 | NU-MQAM | NU-MQAM | MQAM |
| | 8/9 | 10.7 | MQAM | MQAM | MQAM |
| | 9/10 | 10.8 | MQAM | MQAM | MQAM |

[Fig. 41]
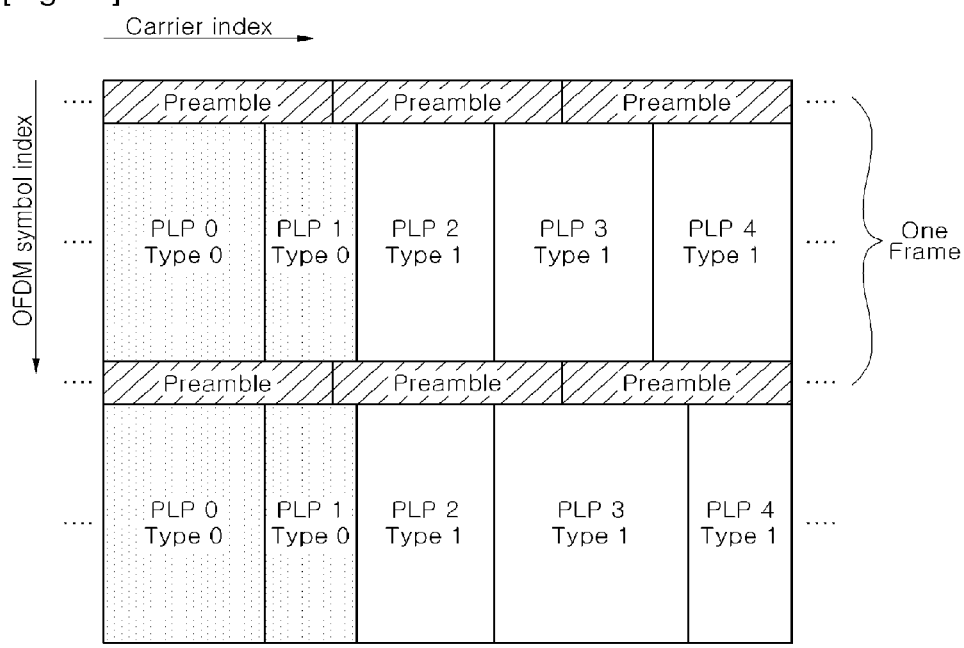
[Fig. 42]
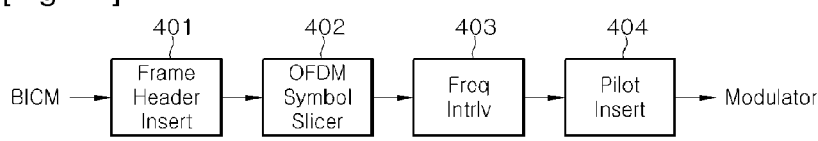

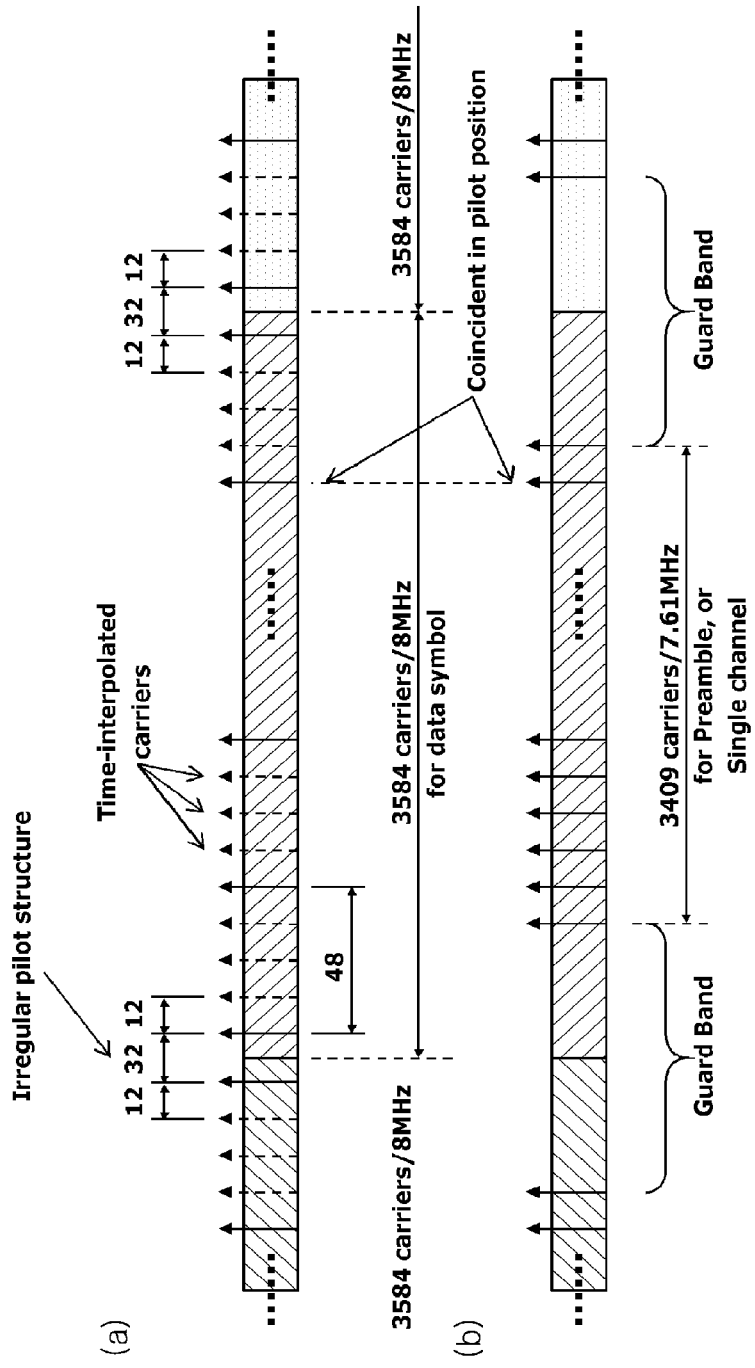

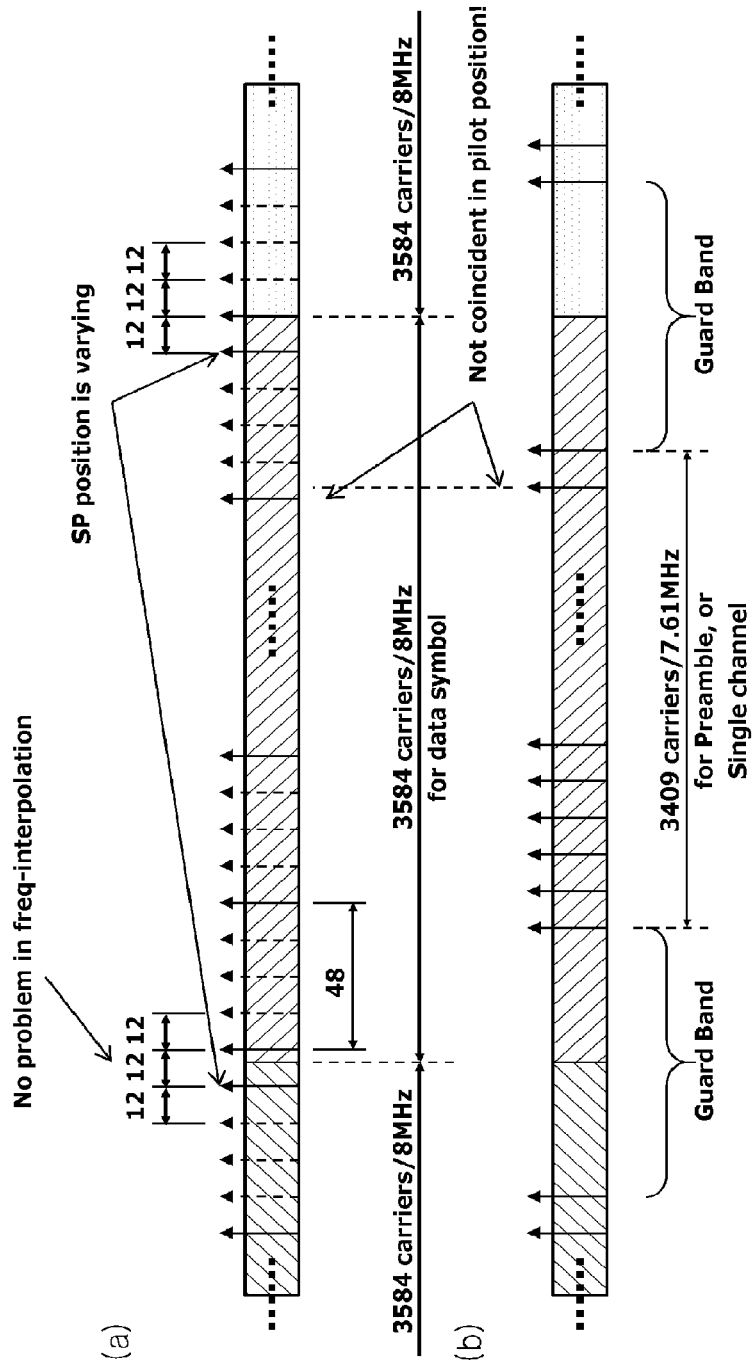
[Fig. 44]

[Fig. 45]
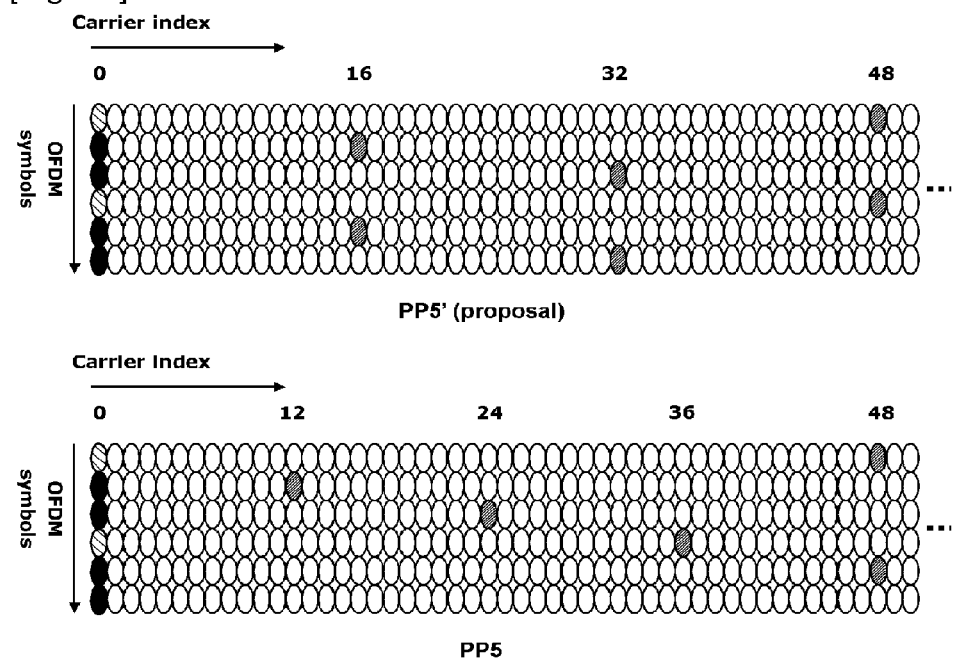

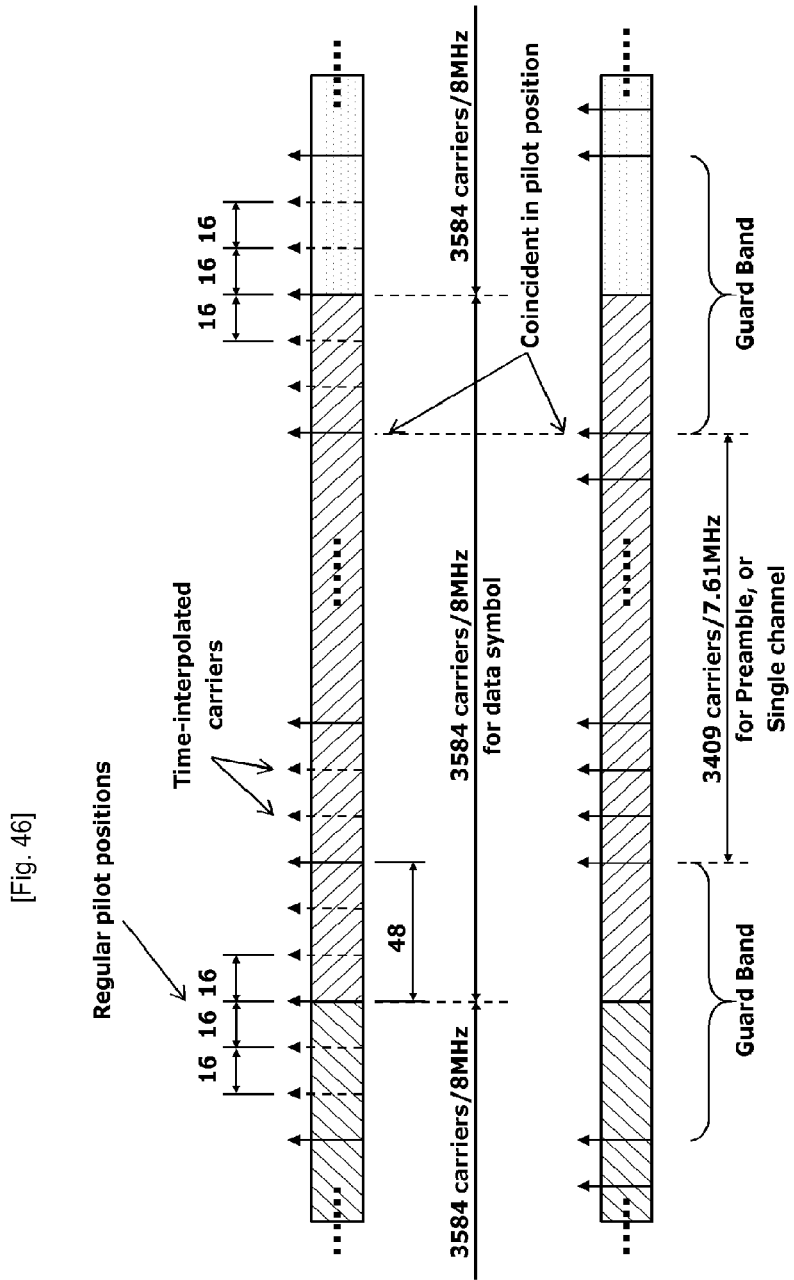
[Fig. 46]

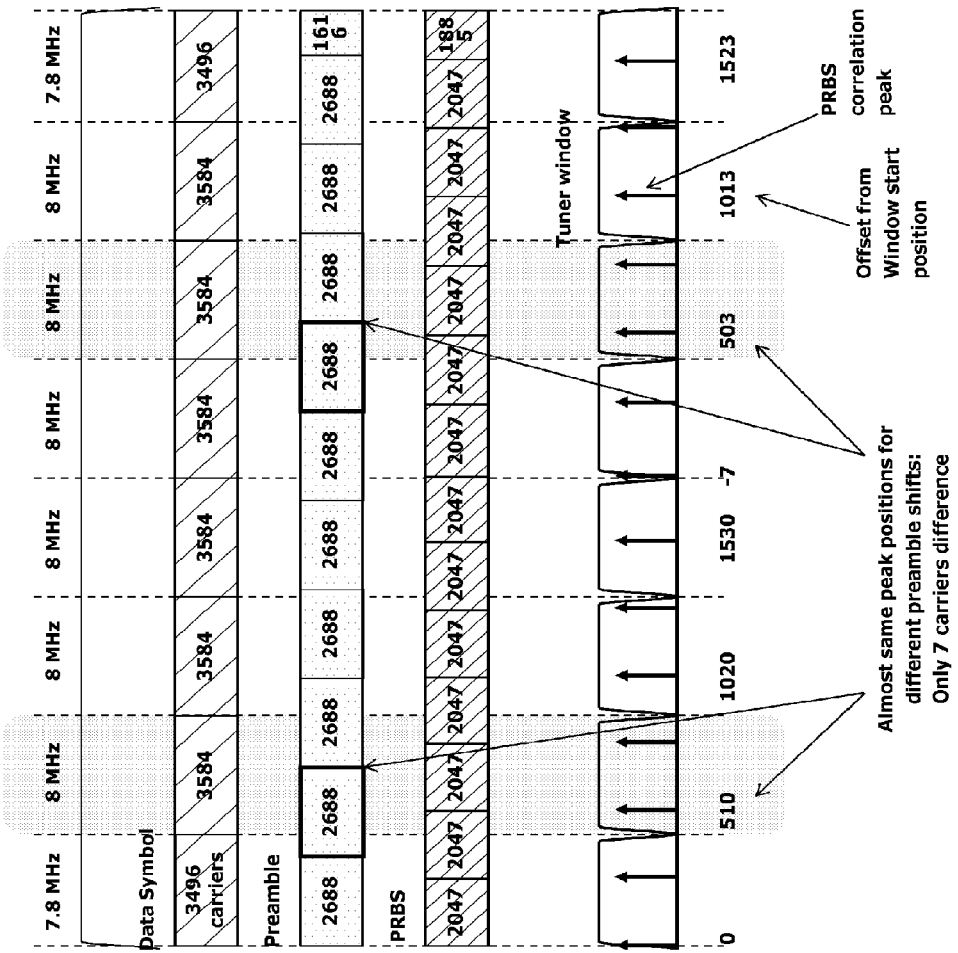
[Fig. 47]

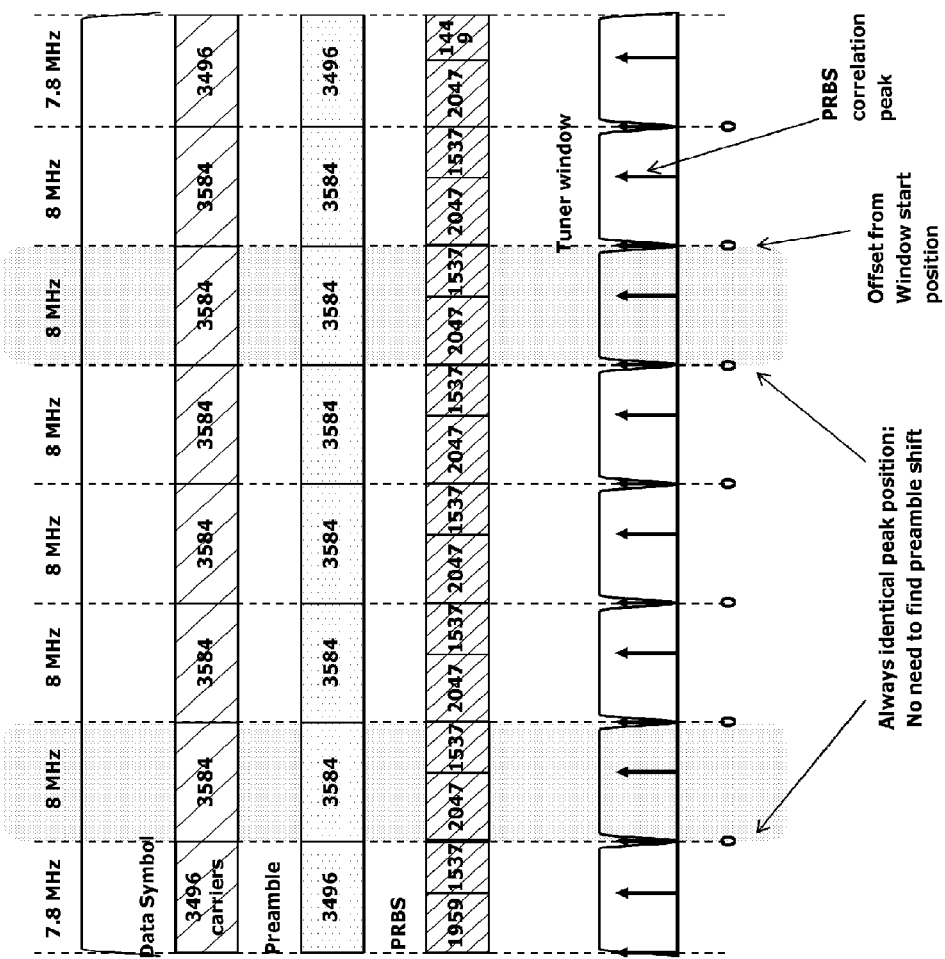

[Fig. 49]

| Delay (μs) | 0.2 | 0.4 | 0.8 | 1.2 | 2.5 | 15 |
|---|---|---|---|---|---|---|
| Att. (dB) | −11 | −14 | −17 | −23 | −32 | −40 |

Negligible Delay path

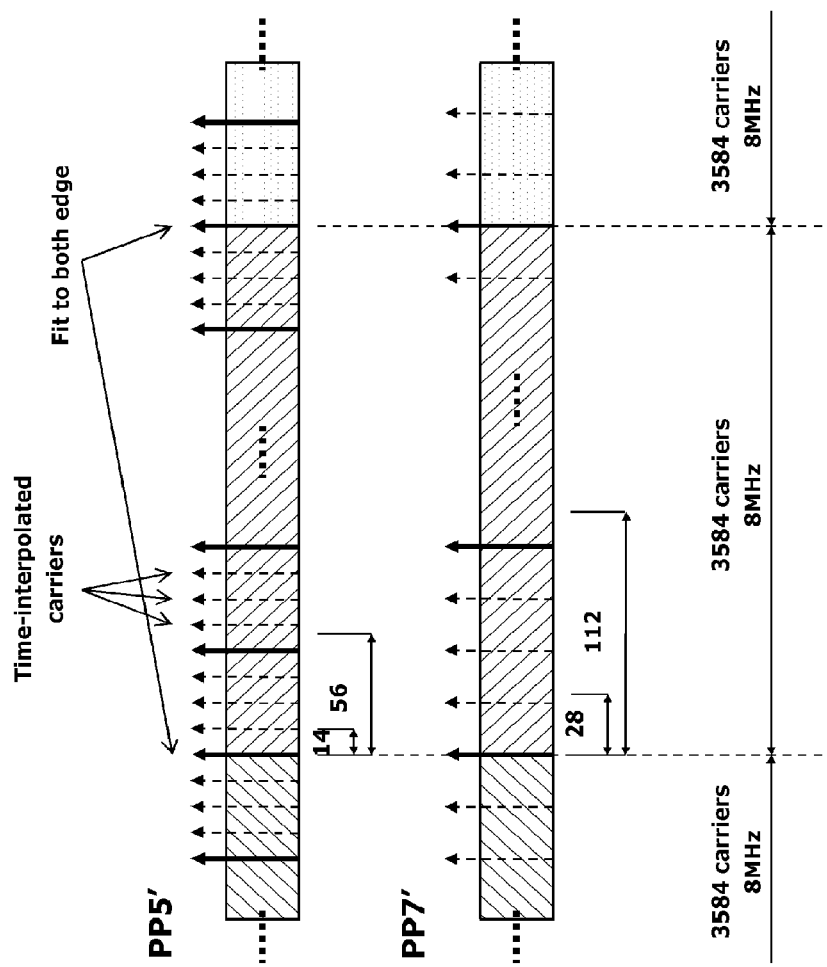
[Fig. 50]

[Fig. 51]
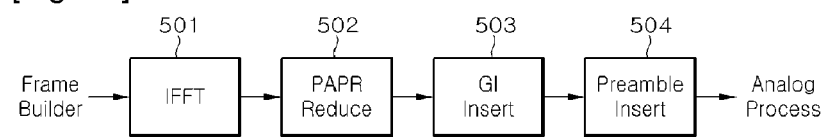
[Fig. 52]
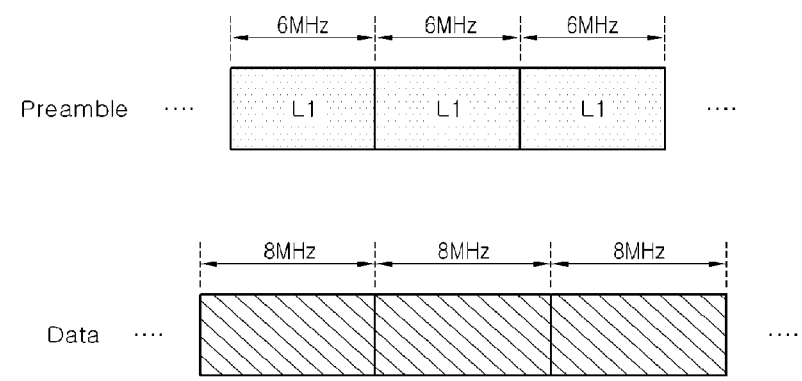

[Fig. 53]
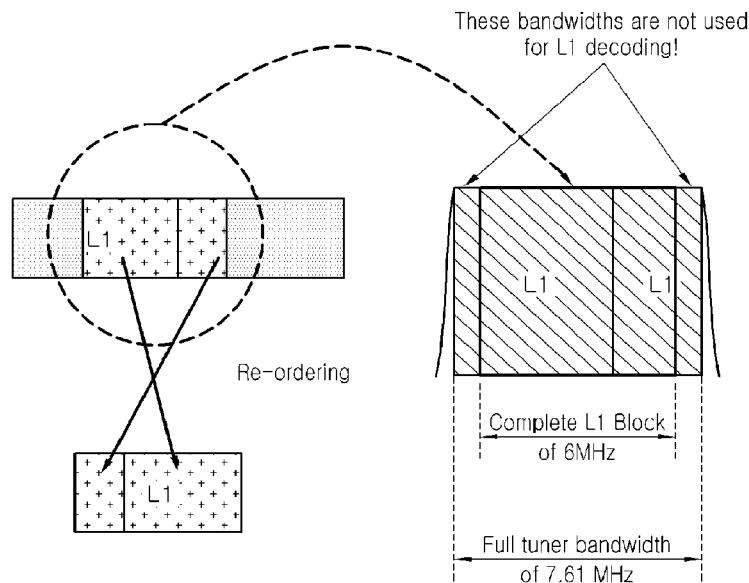
[Fig. 54]
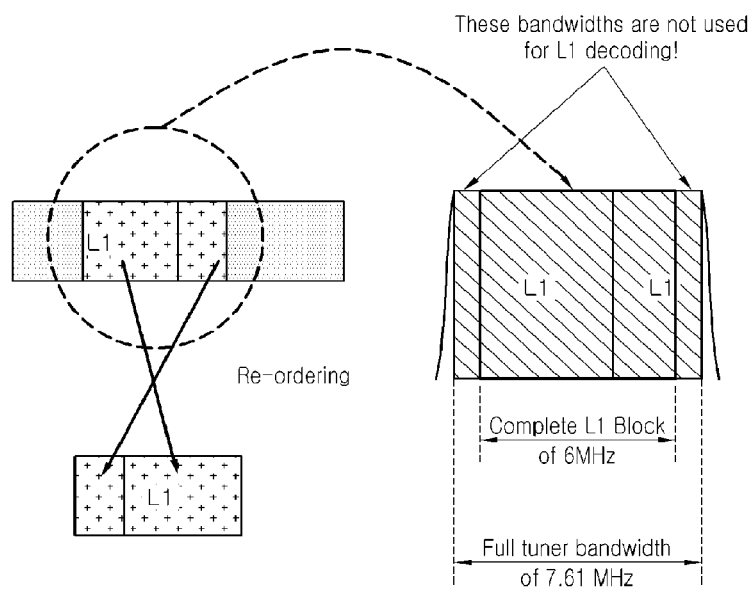
[Fig. 55]
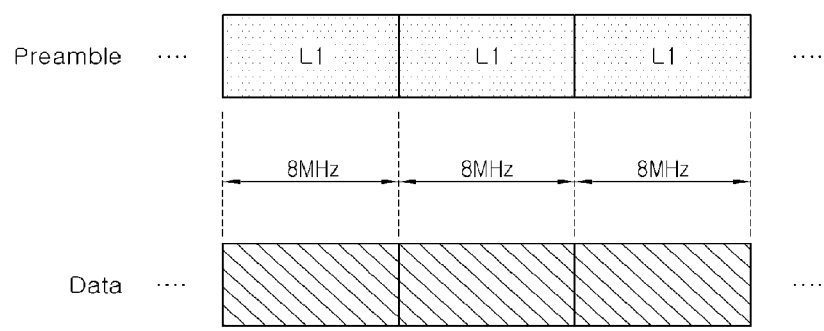

[Fig. 56]
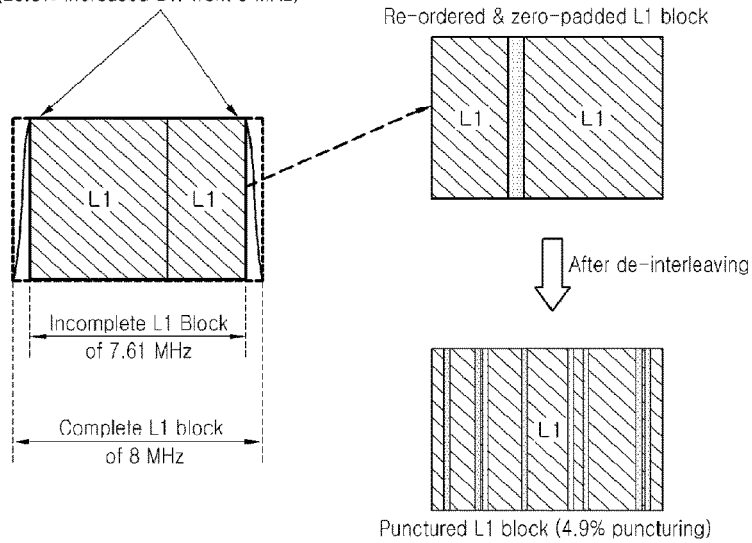
[Fig. 57]
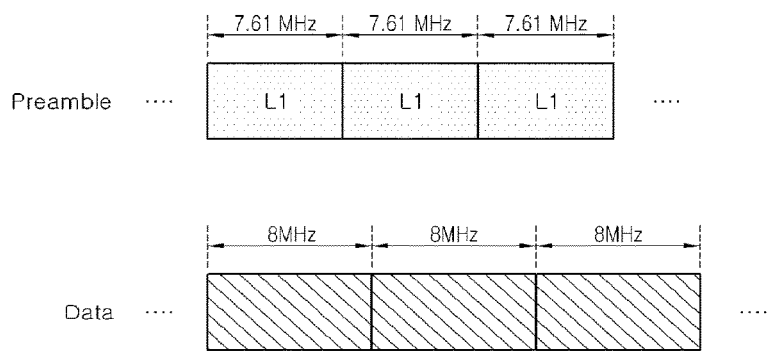
[Fig. 58]
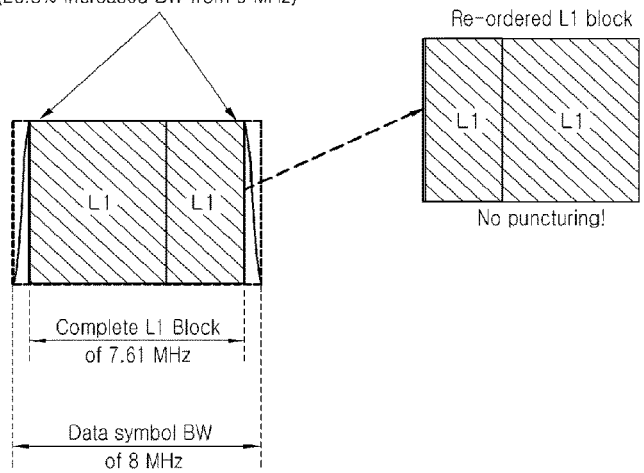

[Fig. 59]
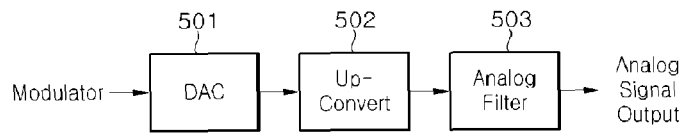
[Fig. 60]
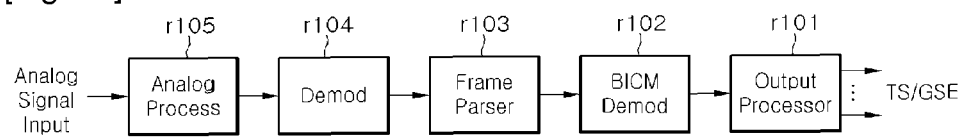
[Fig. 61]
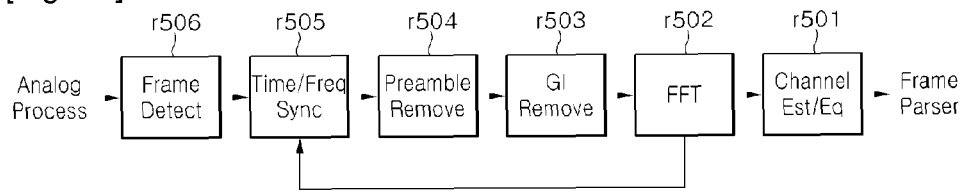
[Fig. 62]
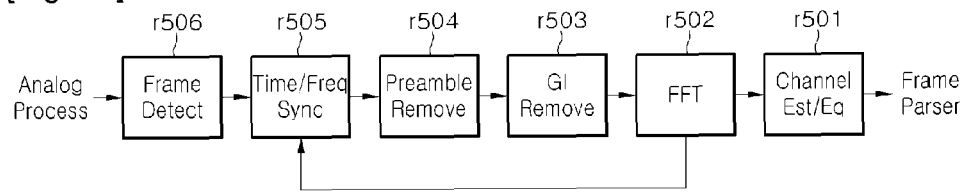
[Fig. 63]
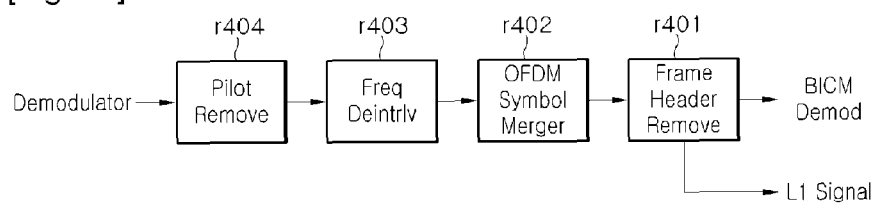

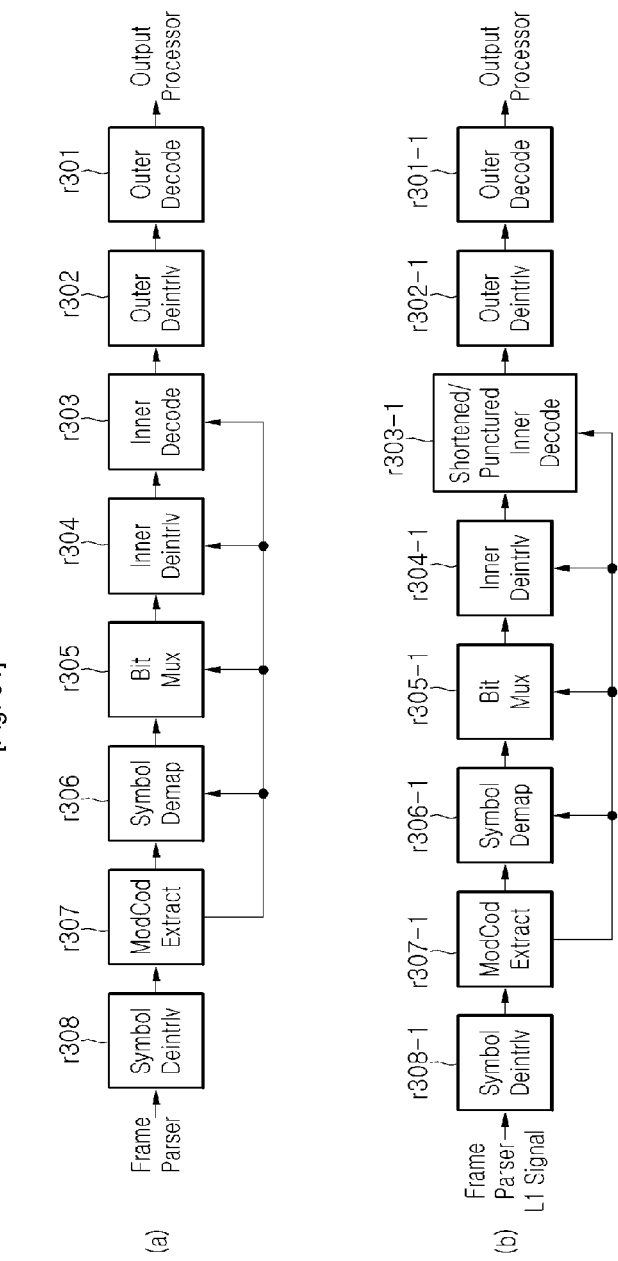

[Fig. 65]
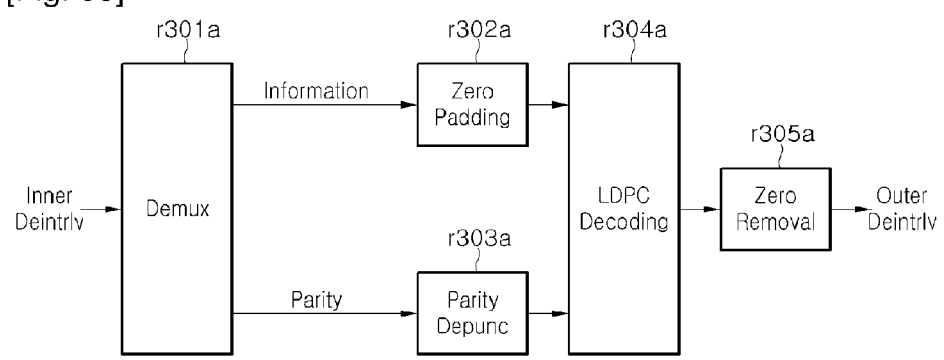

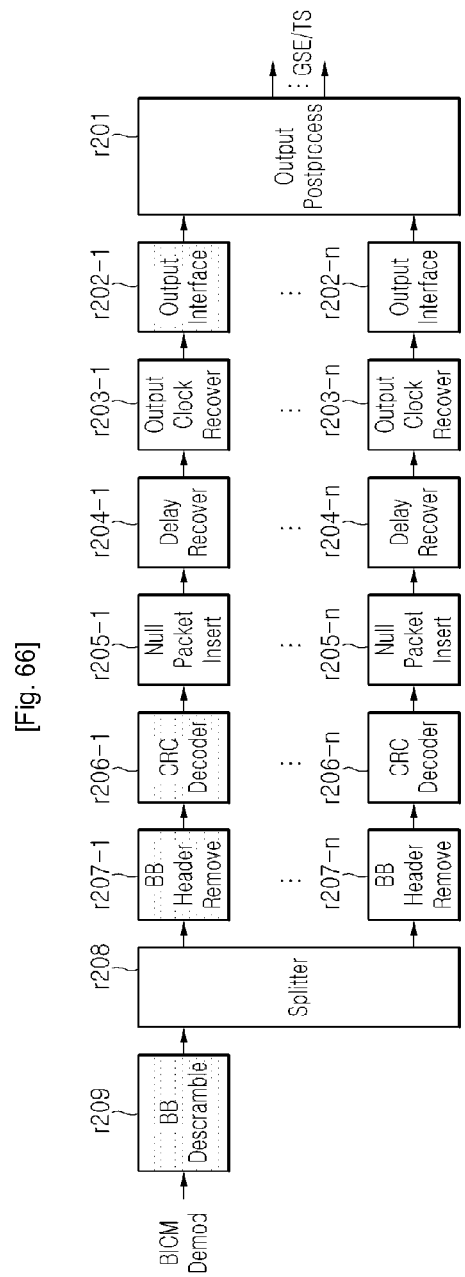
[Fig. 66]

[Fig. 67]
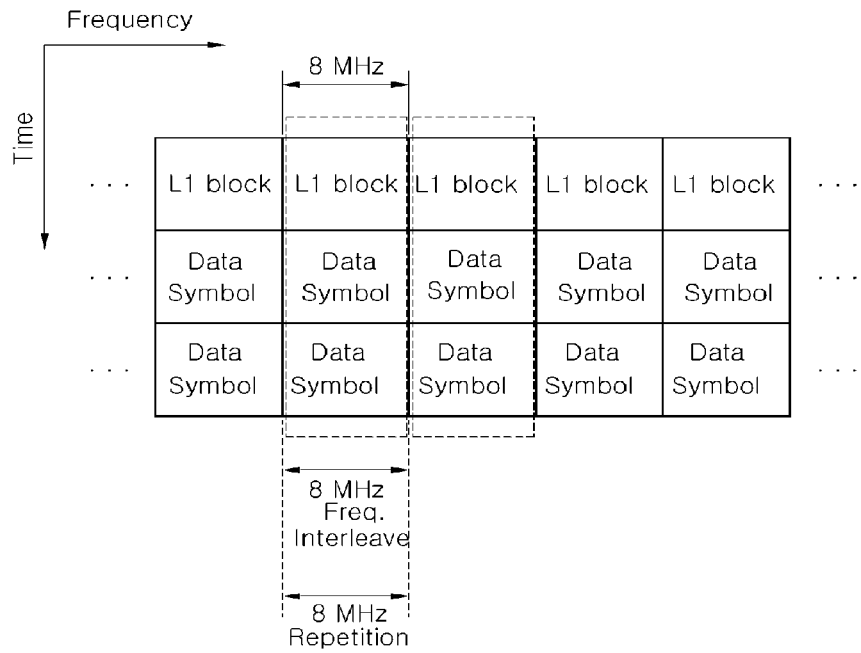
[Fig. 68]
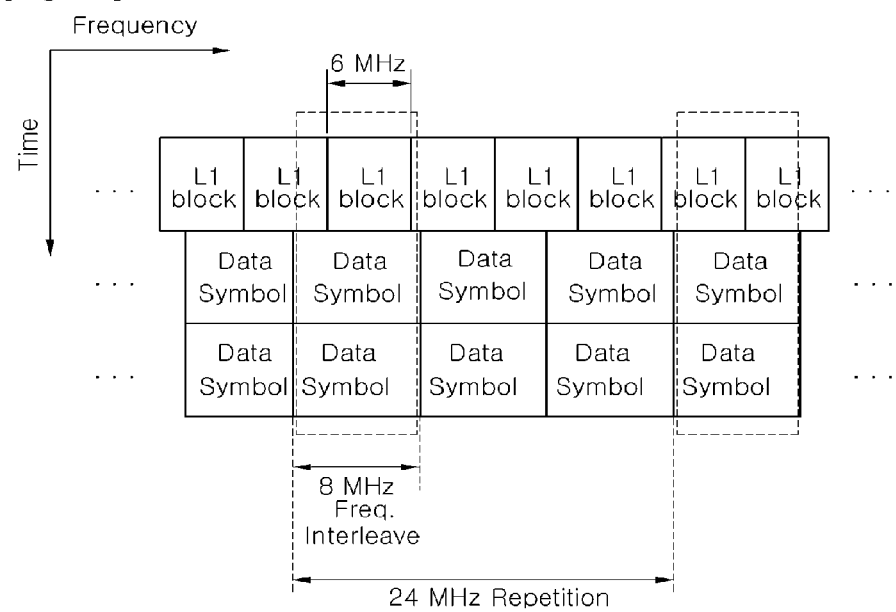

[Fig. 69]

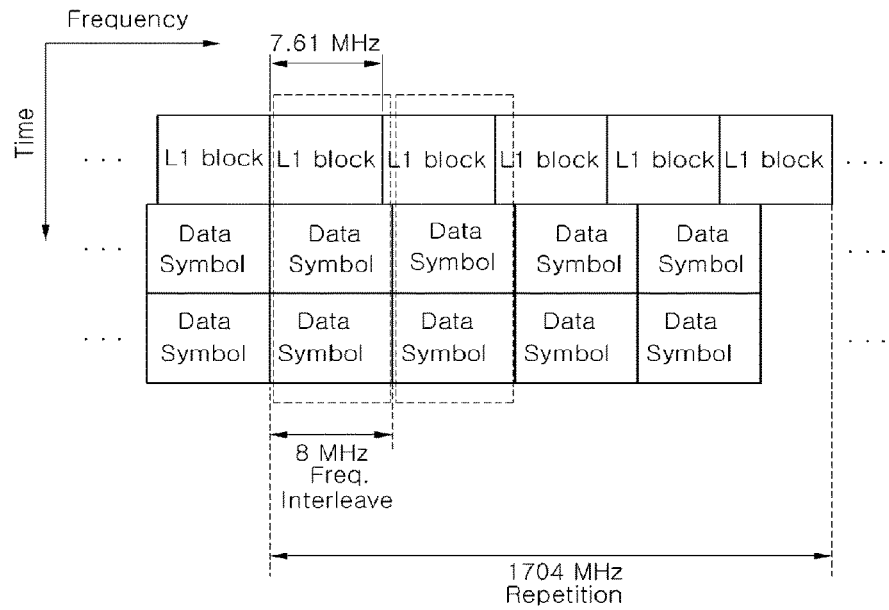

[Fig. 70]

| Field | Bits | |
|---|---|---|
| L1_span | 12 | number of carriers spanned by L1 block within one OFDM symbol (Max=7.61 MHz) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS,GS,···) |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 0 | rfu |
| crc32 | 32 | CRC32 |
| Total | 11760 | |

The number of L1 information bits varies according to various configurations/conditions

[Fig. 71]
| L1 info (bits) | 11760 |
| --- | --- |
| L1 block (bits) | 23520 |
| 16 – QAM symbols | 5880 |
| Total carriers | 3408 |
| Preamble SP distance | 6 |
| Data carriers | 2840 |
| Short LDPC | 1.45 |
| OFDM symbols | 2.07 |
Maximum size
[Fig. 72]
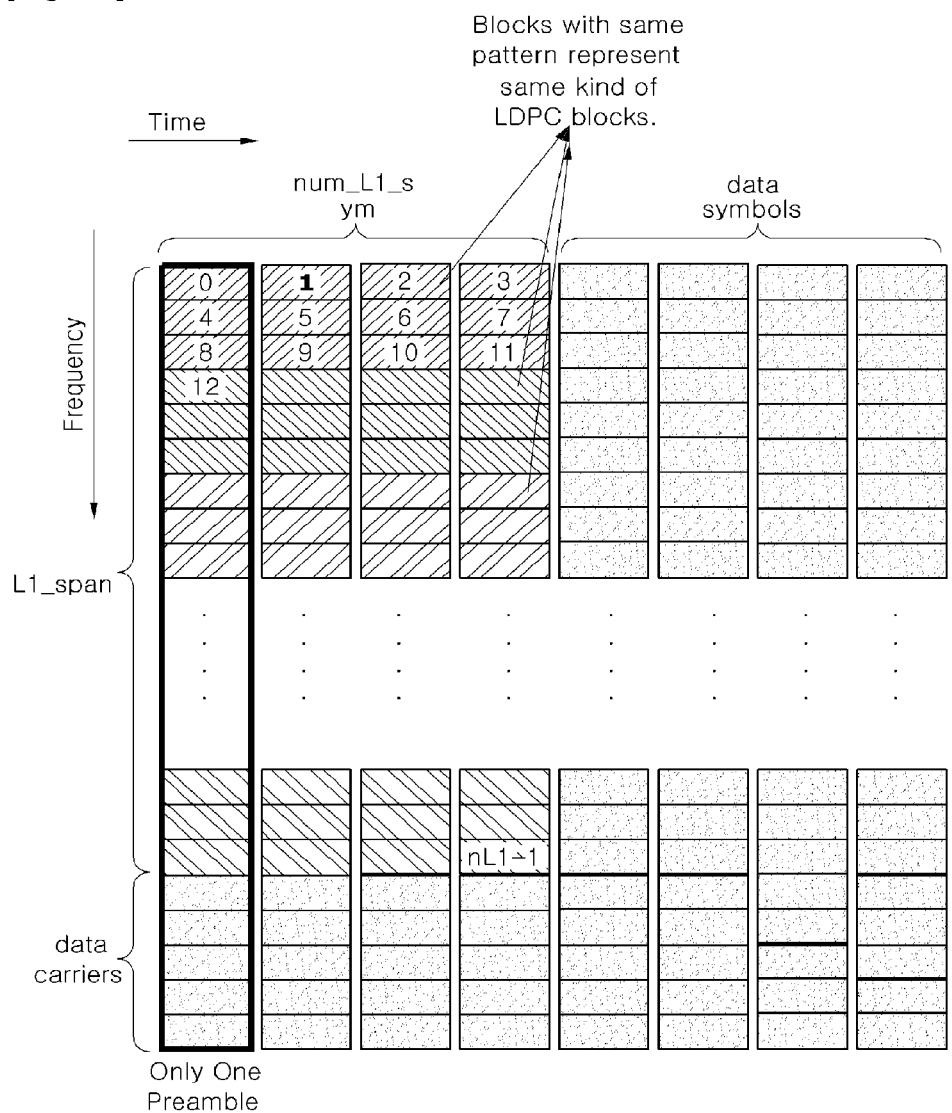

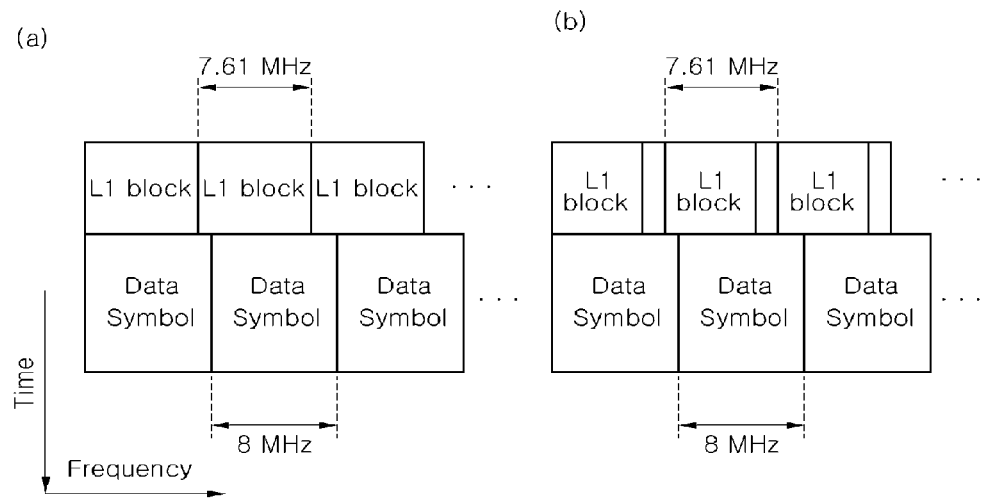
[Fig. 73]

[Fig. 74]

| Field | Bits | |
|---|---|---|
| L1_column | 9 | number of carriers spanned by L1 block within one OFDM symbol (Max=7.61 MHz) |
| L1_row | 3 | number of OFDM symbols spanned by L1 block |
| num_chbon | 3 | number of bonded channels |
| num_plp | 8 | number of data slices |
| num_dslice | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS, GS, ...) |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 11776 | |

The number of L1 information bits varies according to various configurations/conditions

[Fig. 75]

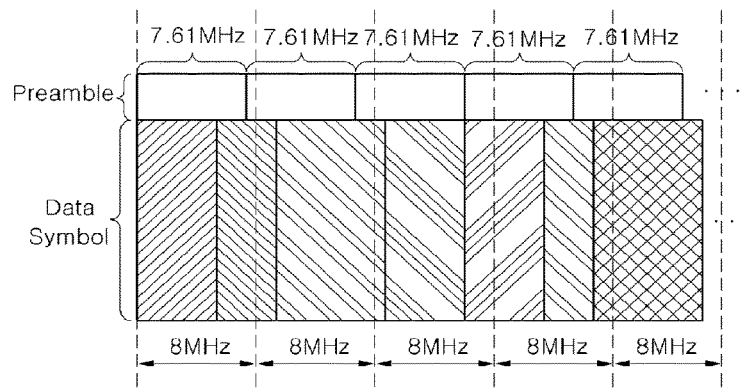

[Fig. 76]
| LDPC Block Size | Modulation (bps/Hz) | QAM Symbols | ModCod Overhead |
|---|---|---|---|
| 64800 | 4 | 16200 | 0.28% |
|  | 6 | 10800 | 0.42% |
|  | 8 | 8100 | 0.56% |
|  | 10 | 6480 | 0.69% |
|  | 12 | 5400 | 0.83% |
| 16200 | 4 | 4050 | 1.11% |
|  | 6 | 2700 | 1.67% |
|  | 8 | 2025 | 2.22% |
|  | 10 | 1620 | 2.78% |
|  | 12 | 1350 | 3.33% |
[Fig. 77]
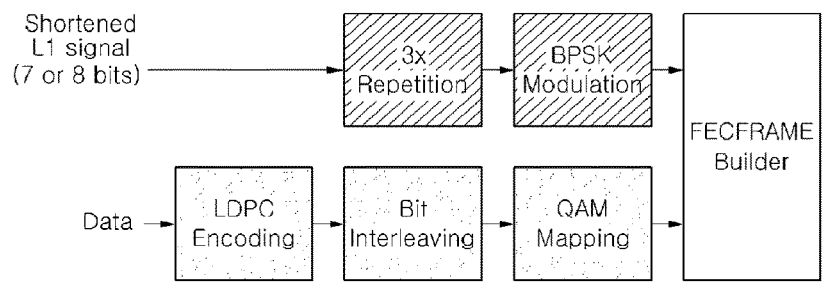
[Fig. 78]
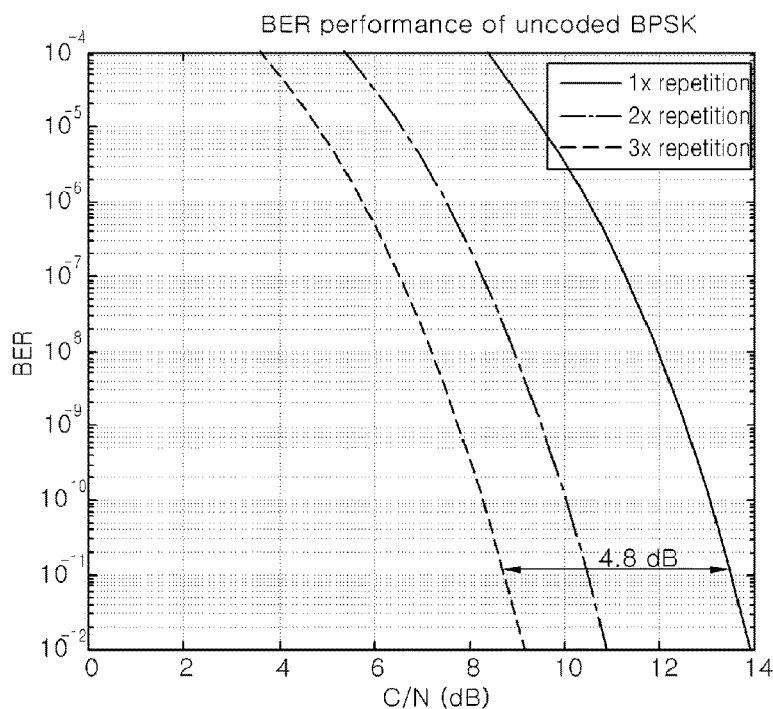

[Fig. 79]
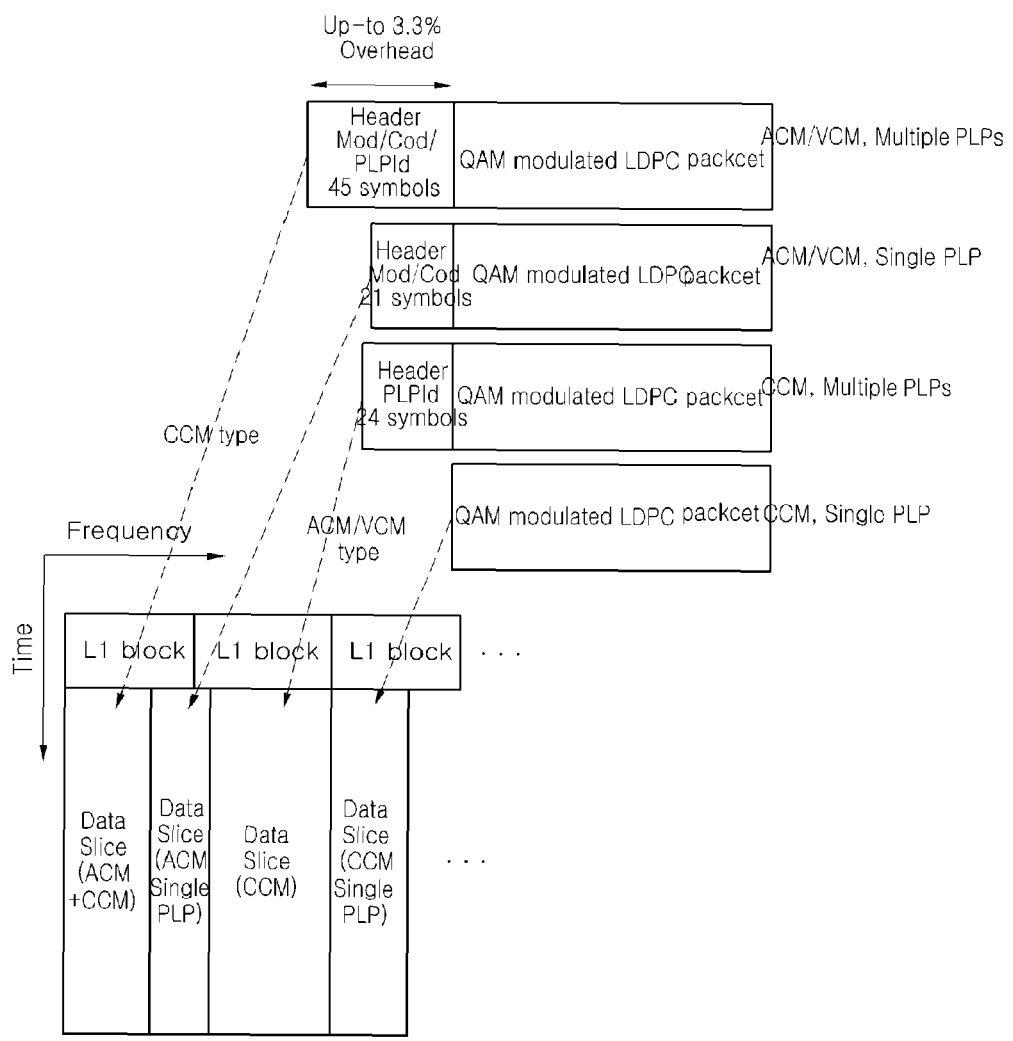

[Fig. 80]

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload(TS,GS…) |
| if dslice_type=CCM { | | |
| plp_mod | 3 | PLP modulation type |
| plp_fec_type | 1 | PLP FEC type (long/short) |
| plp_cod | 3 | PLP coderate |
| } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 14082 | |

L1 block size is transmitted on first LDPC block (fixed shortest length=192 bits)

Time interleaving on/off to support short latency mode

Data slice type for L1 signaling overhead reduction

Mod/Cod fields are transmitted on preamble for CCM type only

[Fig. 81]

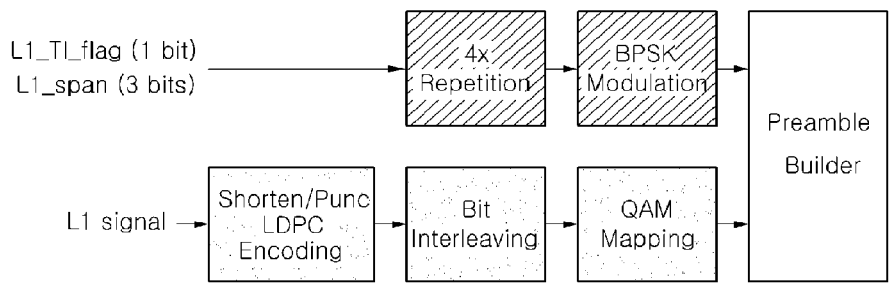

[Fig. 82]
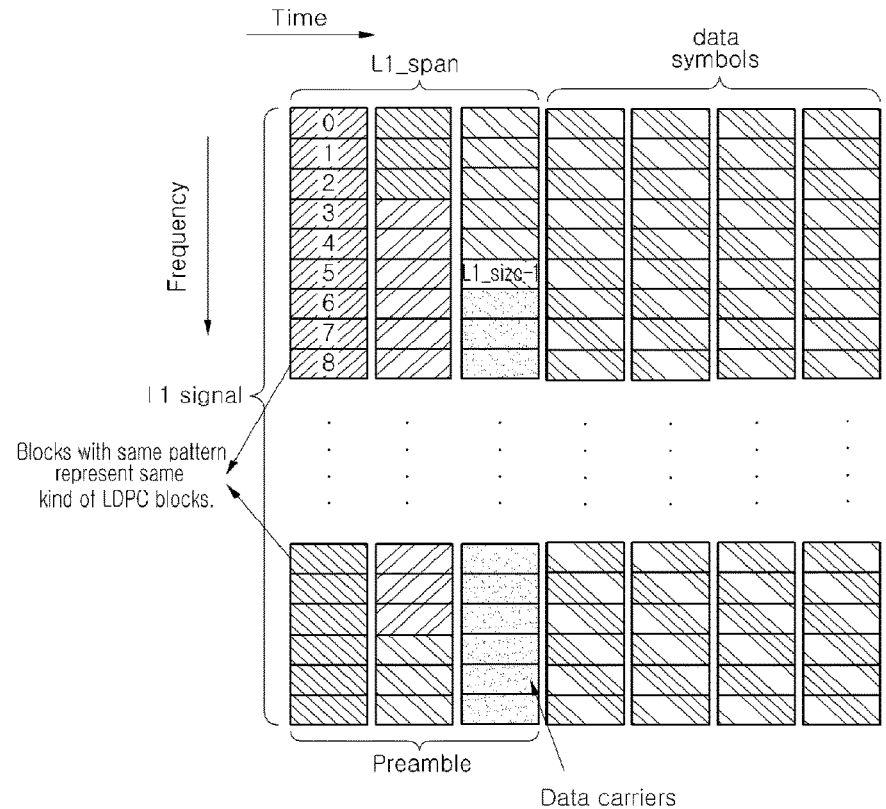
[Fig. 83]
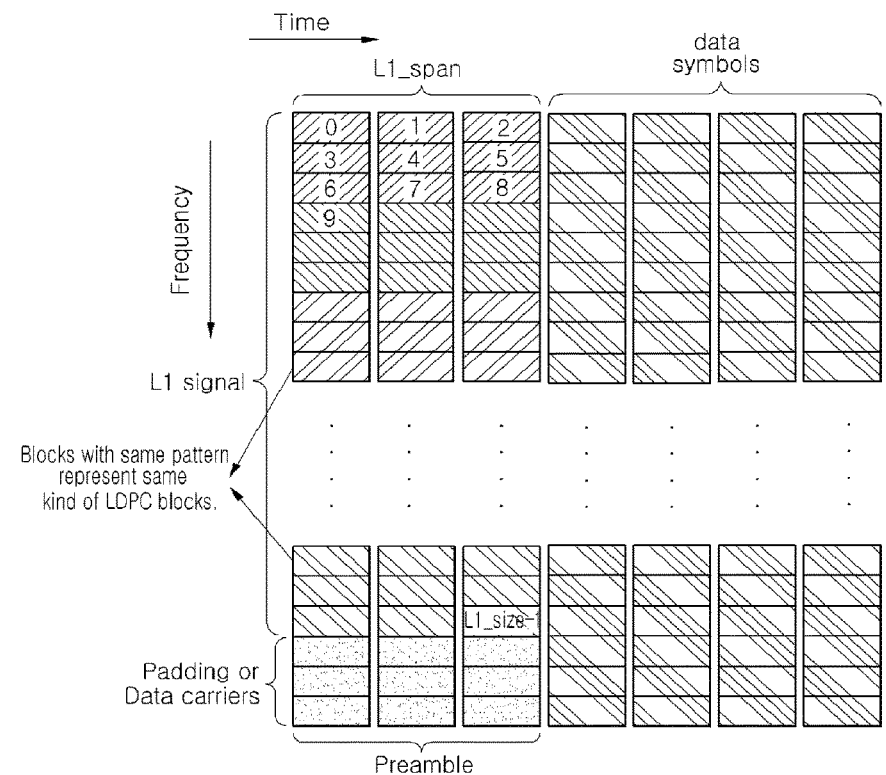

[Fig. 84]
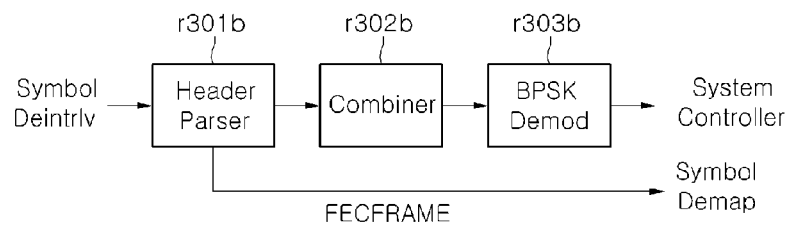

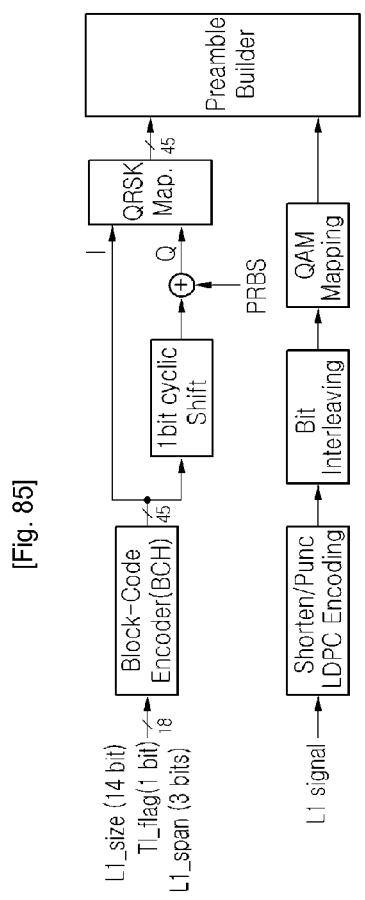
[Fig. 85]

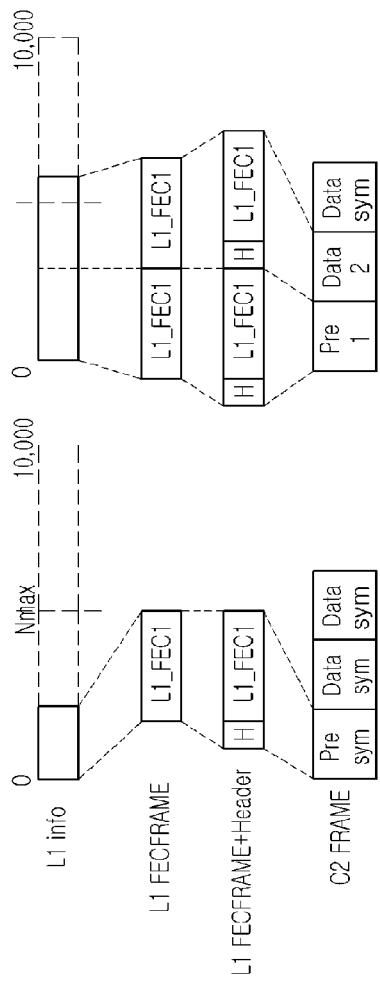
[Fig. 86]

[Fig. 87]
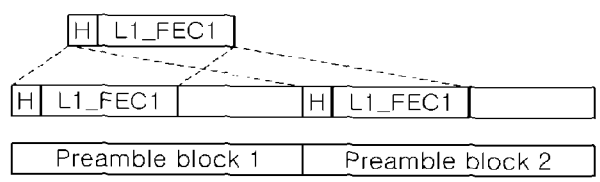
[Fig. 88]
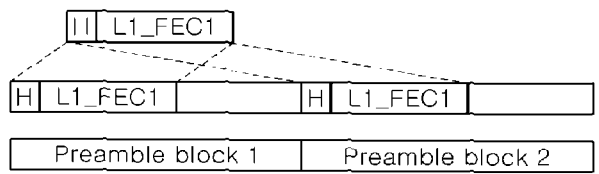

[Fig. 89]
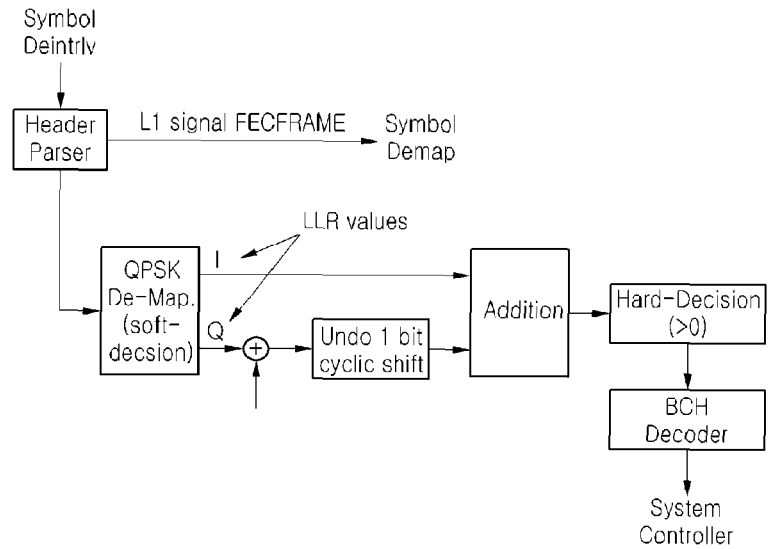
[Fig. 90]
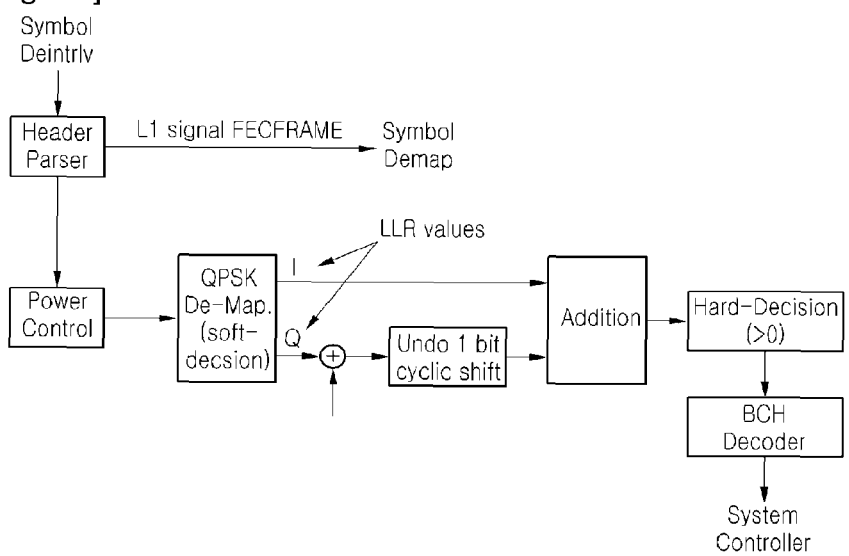
[Fig. 91]
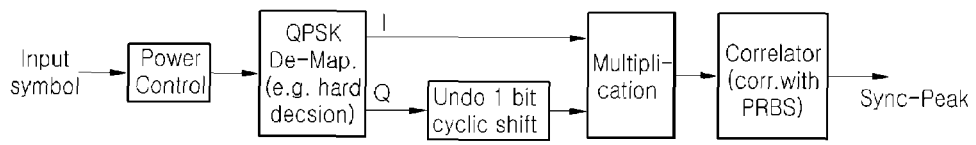

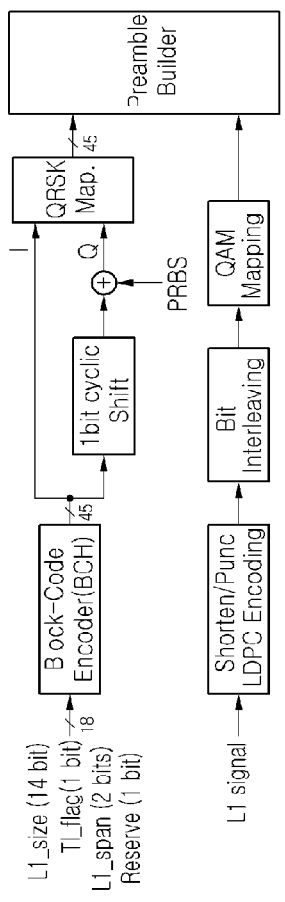
[Fig. 92]

[Fig. 93]
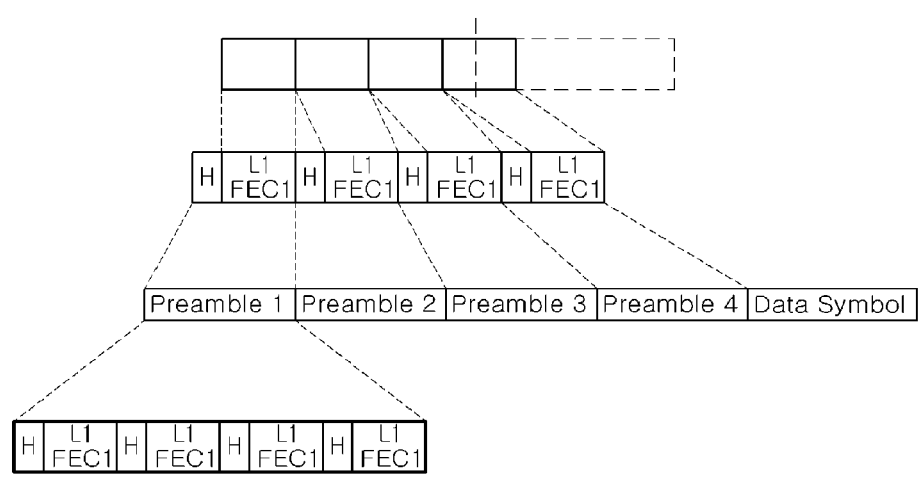
[Fig. 94]
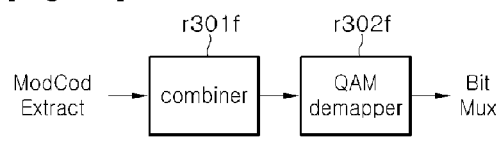

[Fig. 95]

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS, GS, ...) |
| if dslice_type=CCM { | | |
| plp_mod | 3 | PLP  modulation type |
| plp_fec_type | 1 | PLP  FEC type (long/short) |
| plp_cod | 3 | PLP  coderate |
| plp_start | 21 | PLP  start address |
| } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 19458 | |

The number of L1 information bits varies according to various configurations/conditions

[Fig. 96]

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS , GS , ⋯) |
|   if dslice_type=CCM { | | |
|   plp_mod | 3 | PLP   modulation type |
|   plp_fec_type | 1 | PLP   FEC type (long/short) |
|   plp_cod | 3 | PLP   coderate |
|   plp_start | 14 | PLP   start address |
|   } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 17666 | |

The number of L1 information bits varies according to various configurations/conditions

[Fig. 97]
| LDPC length | QAM type | QAM symbols |
|---|---|---|
| 64800 | 16 QAM | 16200 |
| 64800 | 64 QAM | 10800 |
| 64800 | 256 QAM | 8100 |
| 64800 | 1024 QAM | 6480 |
| 64800 | 4096 QAM | 5400 |
| 16200 | 16 QAM | 4050 |
| 16200 | 64 QAM | 2700 |
| 16200 | 256 QAM | 2025 |
| 16200 | 1024 QAM | 1620 |
| 16200 | 4096 QAM | 1350 |
[Fig. 98]
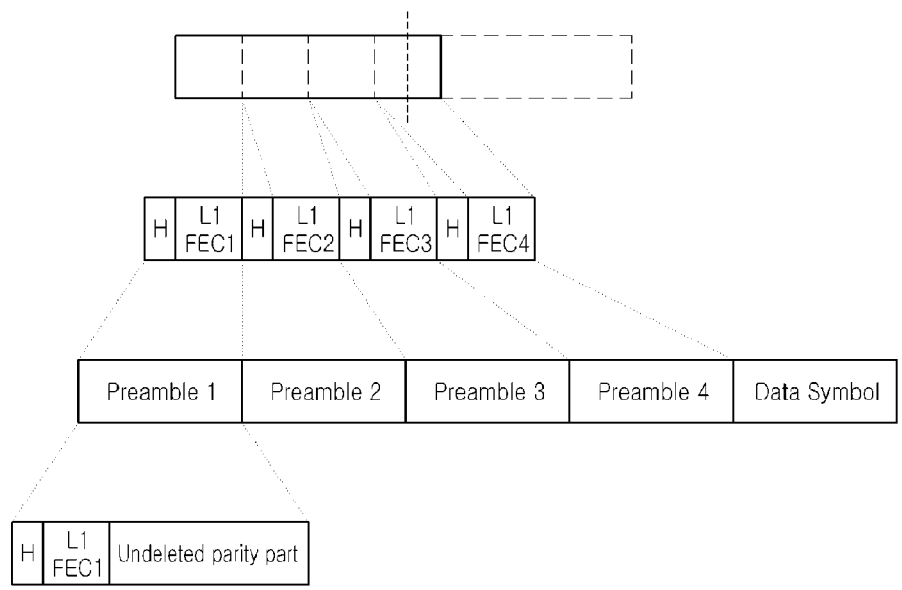
[Fig. 99]
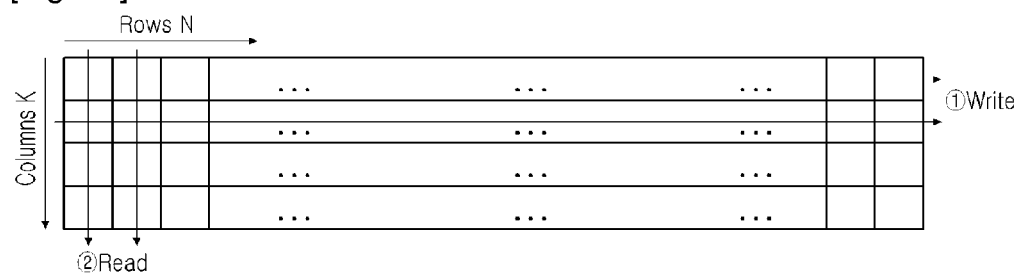

[Fig. 100]
[Fig. 101]
[Fig. 102]
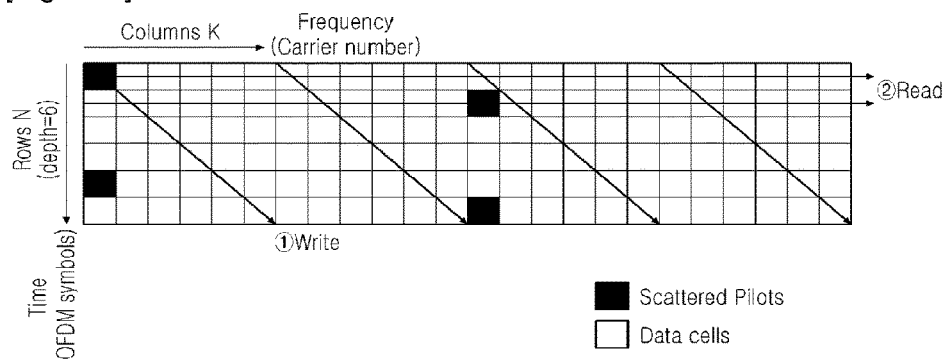

[Fig. 103]
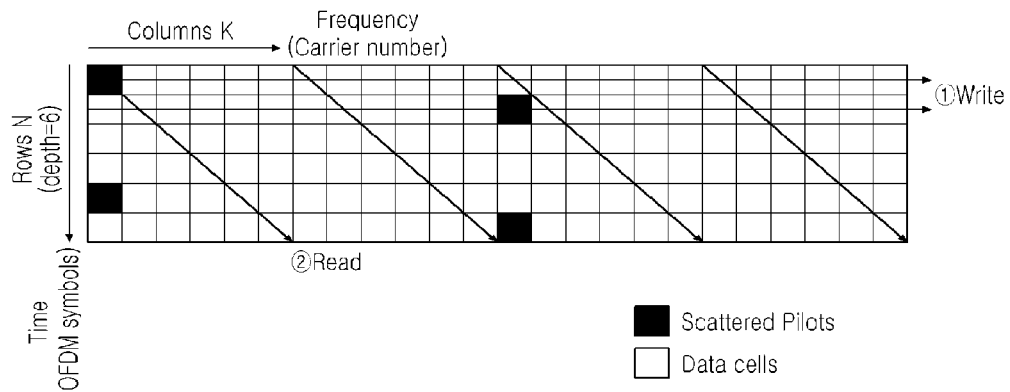
[Fig. 104]
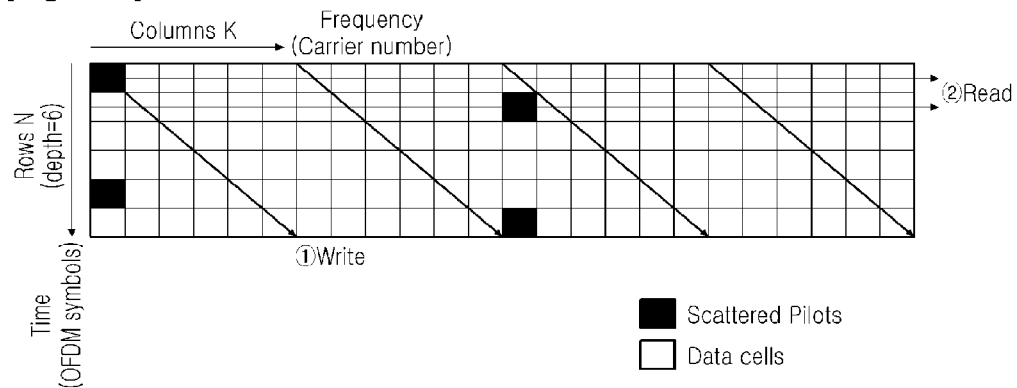
[Fig. 105]
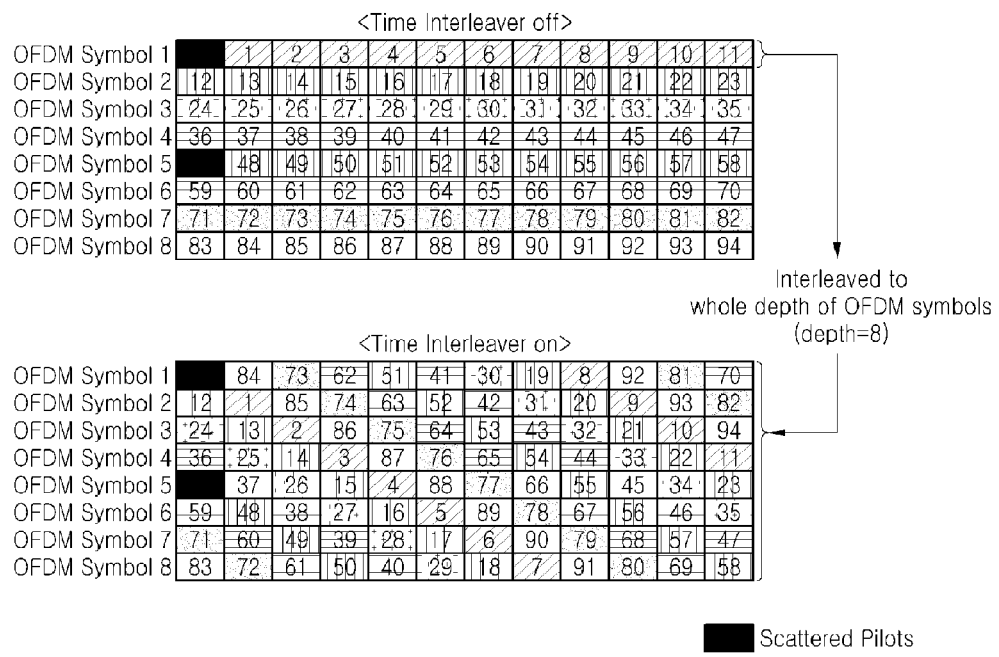

while I<nCELL loop

If addr = pilot position
    RA = [RA+1] mod NT;
    CA = [CA+1] mod ND;
    end if   ;

WRITE;

RA = [RA+1] mod NT;
CA = [CA+1] mod ND;

if CA = 0
    RA = RA+1;
    end if   ;

end loop;
```

■ Scattered Pilot
▨ Continual Pilot

RA = Row Address
CA = Column Address
nCell = # of cells within TI block

Memory overhead = 2%

After applying Time interleaving

Before applying Time interleaving

[Fig. 107]
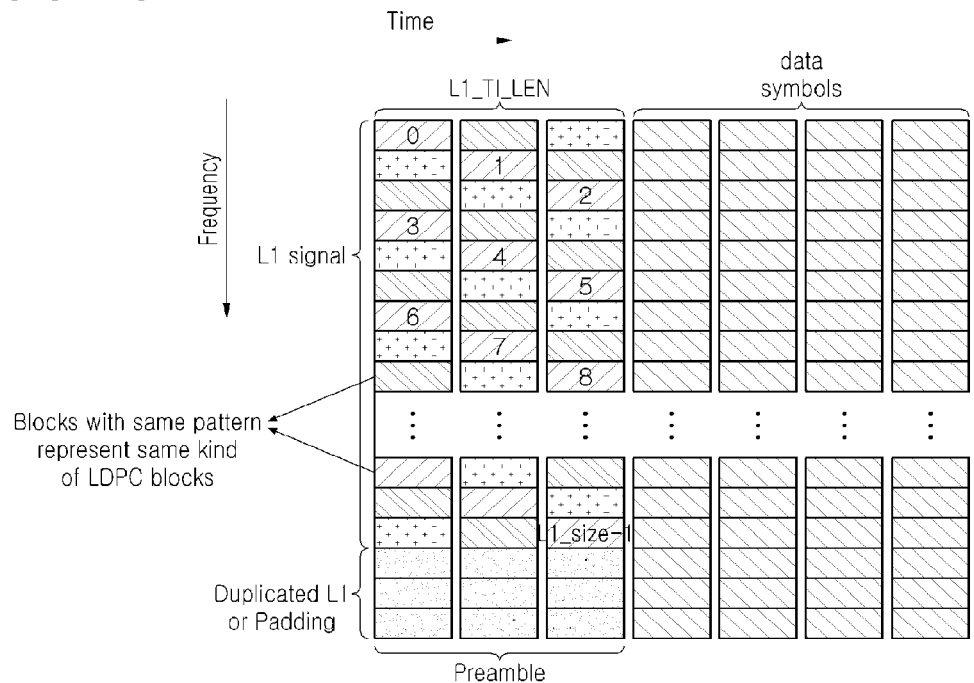
[Fig. 108]
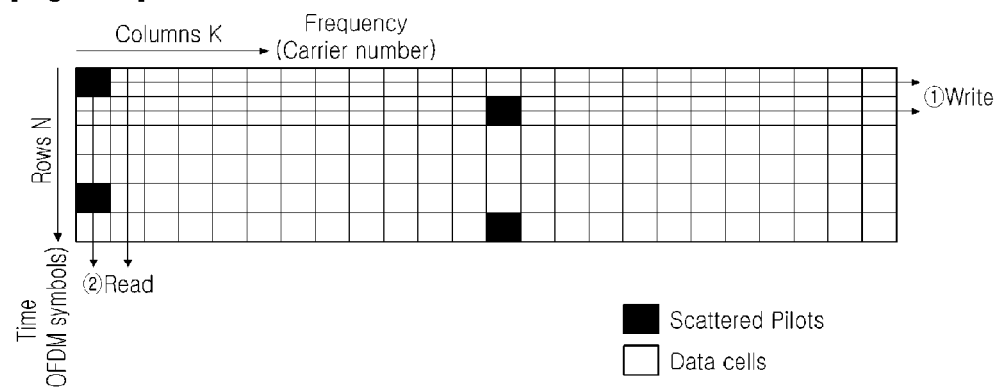
[Fig. 109]
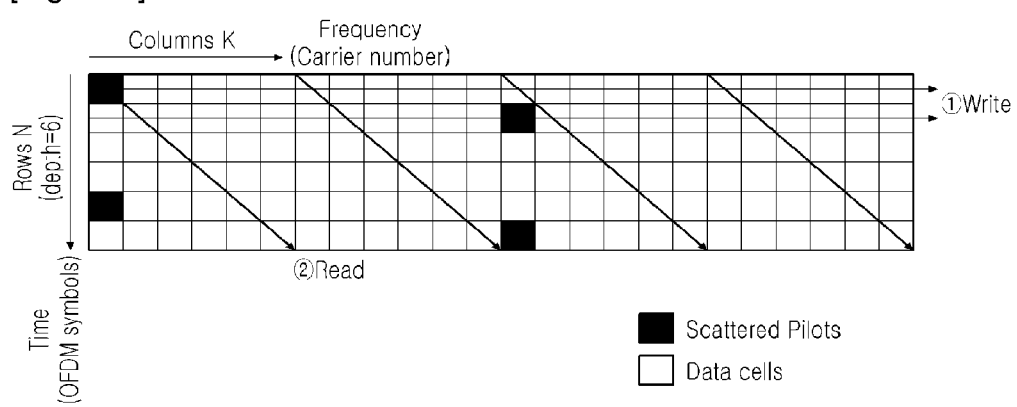

[Fig. 110]
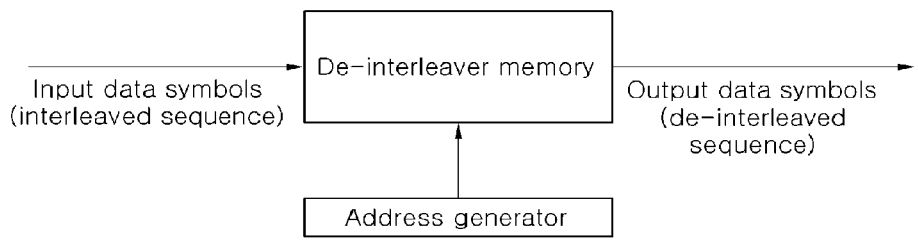
[Fig. 111]

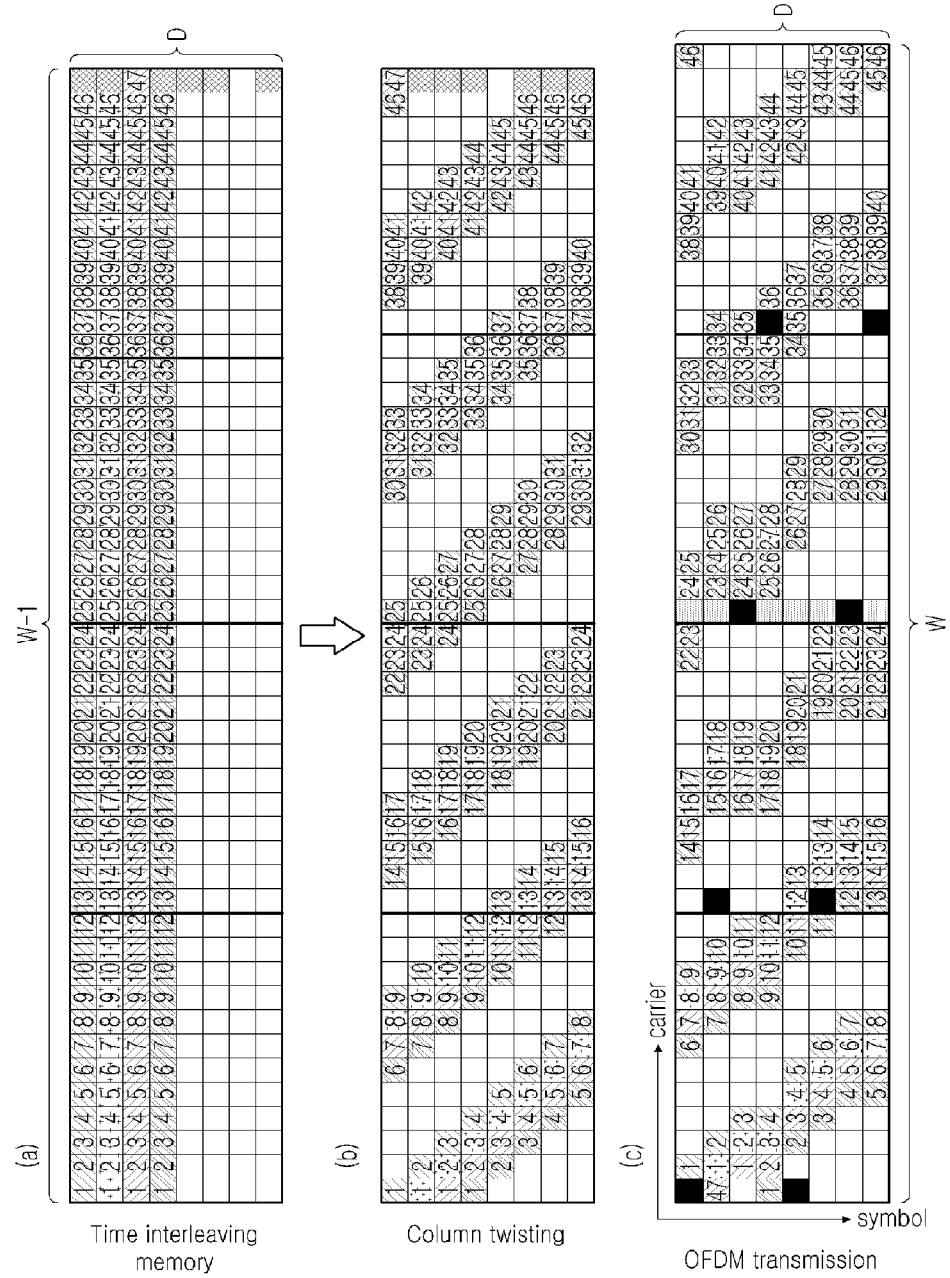
[Fig. 112]

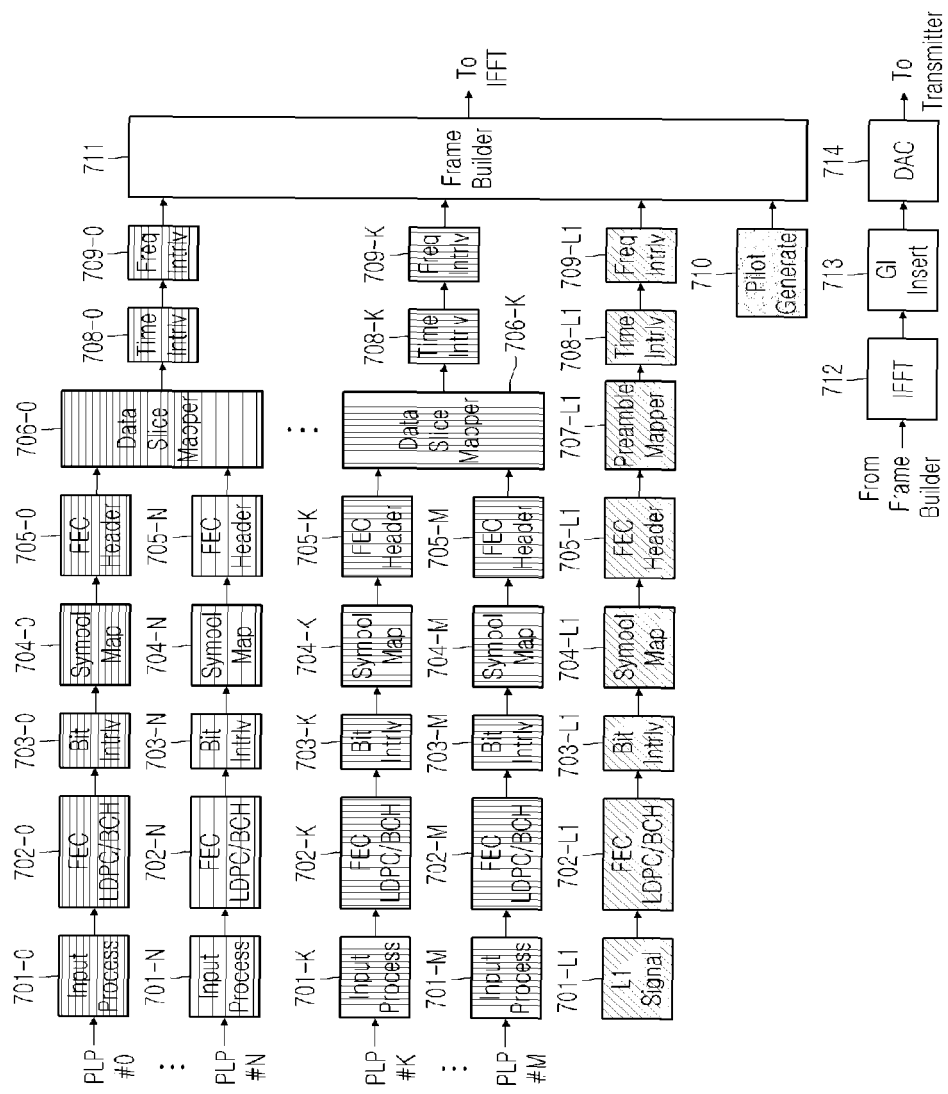
[Fig. 113]

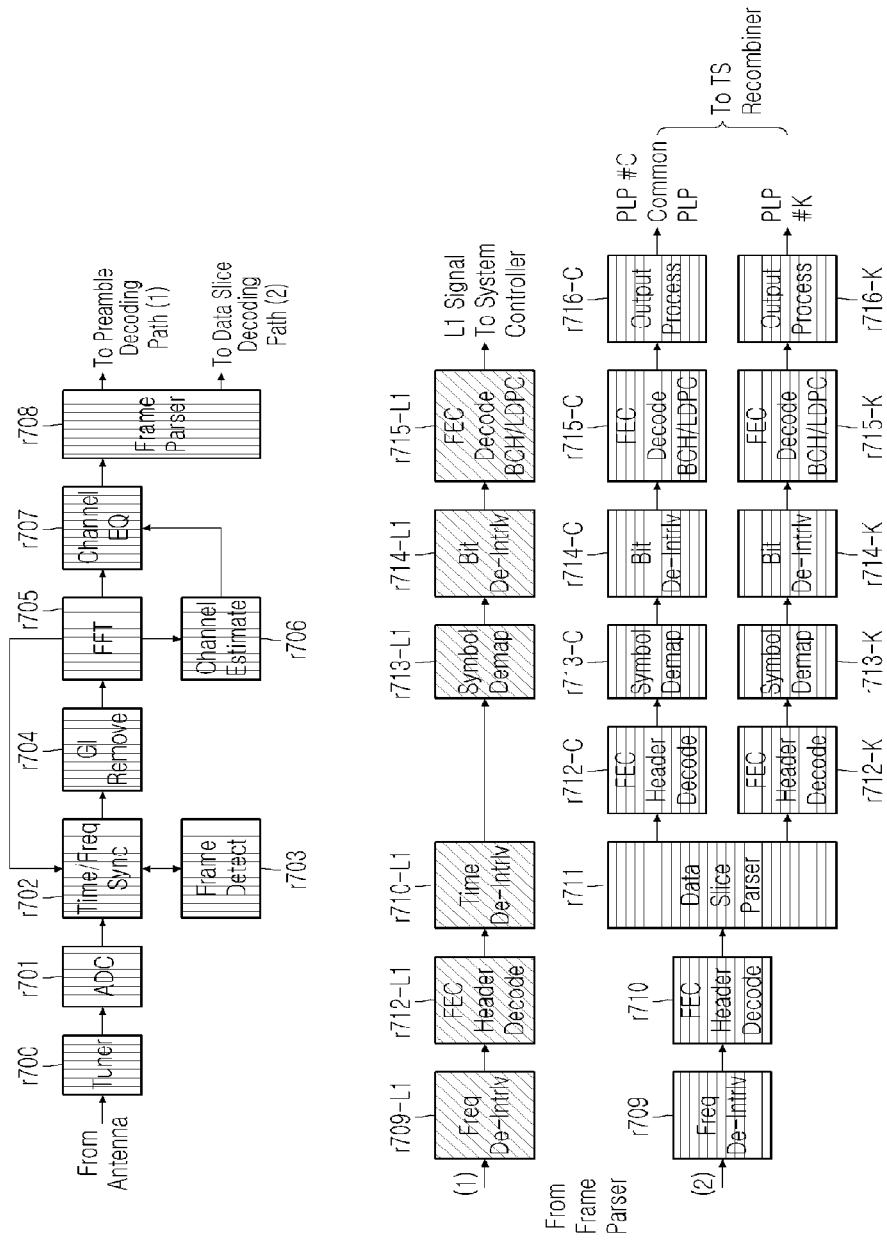
[Fig. 114]

… # APPARATUS FOR TRANSMITTING AND RECEIVING A SIGNAL AND METHOD OF TRANSMITTING AND RECEIVING A SIGNAL

This application is a continuation application of U.S. application Ser. No. 14/141,333 filed Dec. 26, 2013, now allowed, which is a continuation of U.S. application Ser. No. 13/143,906 filed Jul. 8, 2011, now U.S. Pat. No. 8,644,406, which is the National Stage Entry of International Application No. PCT/KR2009/002512 filed May 12, 2009, which claims priority to U.S. Patent Application No. 61/143,423 filed Jan. 9, 2009, all of which are incorporated by reference for all purposes as if fully set forth herein.

TECHNICAL FIELD

The present invention relates to a method for transmitting and receiving a signal and an apparatus for transmitting and receiving a signal, and more particularly, to a method for transmitting and receiving a signal and an apparatus for transmitting and receiving a signal, which are capable of improving data transmission efficiency.

BACKGROUND ART

As a digital broadcasting technology has been developed, users have received a high definition (HD) moving image. With continuous development of a compression algorithm and high performance of hardware, a better environment will be provided to the users in the future. A digital television (DTV) system can receive a digital broadcasting signal and provide a variety of supplementary services to users as well as a video signal and an audio signal.

Digital Video Broadcasting (DVB)-C2 is the third specification to join DVB s family of second generation transmission systems. Developed in 1994, today DVB-C is deployed in more than 50 million cable tuners worldwide. In line with the other DVB second generation systems, DVB-C2 uses a combination of Low-density parity-check (LDPC) and BCH codes. This powerful Forward Error correction (FEC) provides about 5 dB improvement of carrier-to-noise ratio over DVB-C. Appropriate bit-interleaving schemes optimize the overall robustness of the FEC system. Extended by a header, these frames are called Physical Layer Pipes (PLP). One or more of these PLPs are multiplexed into a data slice. Two dimensional interleaving (in the time and frequency domains) is applied to each slice enabling the receiver to eliminate the impact of burst impairments and frequency selective interference such as single frequency ingress.

DISCLOSURE OF INVENTION

Technical Problem

With the development of these digital broadcasting technologies, a requirement for a service such as a video signal and an audio signal increased and the size of data desired by users or the number of broadcasting channels gradually increased.

Technical Solution

Accordingly, the present invention is directed to a method for transmitting and receiving a signal and an apparatus for transmitting and receiving a signal that substantially obviate one or more problems due to limitations and disadvantages of the related art.

An object of the present invention is to provide a transmitter of transmitting at least one broadcasting signal having PLP (Physical Layer Pipe) data to a receiver, comprising: an LDPC FEC Encoder configured to LDPC encode the PLP data and output FECFrame; a mapper configured to convert the FECFrame to XFECFrame by QAM constellation; a FEC-Frame-Header-Insertion configured to insert FEC-Frame header in front of the XFECFrame; a data slice builder configured to output at least one data slice based on the XFECFrame and the FECFrame header; a time-interleaver configured to perform time-interleaving at a level of the data slice; and a frequency-interleaver configured to frequency-interleave the time-interleaved data slice.

Another aspect of the present invention provides a receiver of receiving at least one broadcasting signal having PLP (Physical Layer Pipe), comprising: a frequency-deinterleaver configured to frequency-deinterleave the received signal; a time-deinterleaver configured to time-deinterleave the frequency-deinterleaved signal at a level of the data slice; a data slice parser configured to output data slice packets of PLP from the data slice, the data slice packet including header; a FEC-Frame-Header-Extractor configured to obtain the header from the data slice packet; and a decoder configured to decode the data slice packets by LDPC (low density parity check) scheme.

Yet another aspect of the present invention provides a method of transmitting at least one broadcasting signal having PLP (Physical Layer Pipe) data to a receiver, comprising: LDPC-encoding the PLP data and outputting FEC-Frame; mapping the FECFrame to XFECFrame by QAM constellation; inserting FECFrame header in front of the XFECFrame; building at least one data slice based on the XFECFrame and the FECFrame header; time-interleaving at a level of the data slice; and frequency-interleaving the time-interleaved data slice.

Yet another aspect of the present invention provides a method of receiving at least one broadcasting signal having PLP (Physical Layer Pipe), comprising: frequency-deinterleaving the received signal; time-deinterleaving the frequency-deinterleaved signal at a level of the data slice; outputting data slice packets of PLP from the data slice, the data slice packet including header; obtaining the header from the data slice packet; decoding the data slice packets by LDPC (low density parity check) decoding scheme.

BRIEF DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is an example of 64-Quadrature amplitude modulation (QAM) used in European DVB-T.

FIG. 2 is a method of Binary Reflected Gray Code (BRGC).

FIG. 3 is an output close to Gaussian by modifying 64-QAM used in DVB-T.

FIG. 4 is Hamming distance between Reflected pair in BRGC.

FIG. 5 is characteristics in QAM where Reflected pair exists for each I axis and Q axis.

FIG. 6 is a method of modifying QAM using Reflected pair of BRGC.

FIG. 7 is an example of modified 64/256/1024/4096-QAM.

FIGS. 8-9 are an example of modified 64-QAM using Reflected Pair of BRGC.

FIGS. 10-11 are an example of modified 256-QAM using Reflected Pair of BRGC.

FIGS. 12-13 are an example of modified 1024-QAM using Reflected Pair of BRGC(0~511).

FIGS. 14-15 are an example of modified 1024-QAM using Reflected Pair of BRGC(512~1023).

FIGS. 16-17 are an example of modified 4096-QAM using Reflected Pair of BRGC(0~511).

FIGS. 18-19 are an example of modified 4096-QAM using Reflected Pair of BRGC(512~1023).

FIGS. 20-21 are an example of modified 4096-QAM using Reflected Pair of BRGC(1024~1535).

FIGS. 22-23 are an example of modified 4096-QAM using Reflected Pair of BRGC(1536~2047).

FIGS. 24-25 are an example of modified 4096-QAM using Reflected Pair of BRGC(2048~2559).

FIGS. 26-27 are an example of modified 4096-QAM using Reflected Pair of BRGC(2560~3071).

FIGS. 28-29 are an example of modified 4096-QAM using Reflected Pair of BRGC(3072~3583).

FIGS. 30-31 are an example of modified 4096-QAM using Reflected Pair of BRGC(3584~4095).

FIG. 32 is an example of Bit mapping of Modified-QAM where 256-QAM is modified using BRGC.

FIG. 33 is an example of transformation of MQAM into Non-uniform constellation.

FIG. 34 is an example of digital transmission system.

FIG. 35 is an example of an input processor.

FIG. 36 is an information that can be included in Base band (BB).

FIG. 37 is an example of BICM.

FIG. 38 is an example of shortened/punctured encoder.

FIG. 39 is an example of applying various constellations.

FIG. 40 is another example of cases where compatibility between conventional systems is considered.

FIG. 41 is a frame structure which comprises preamble for L1 signaling and data symbol for PLP data.

FIG. 42 is an example of frame builder.

FIG. 43 is an example of pilot insert (404) shown in FIG. 4.

FIG. 44 is a structure of SP.

FIG. 45 is a new SP structure or Pilot Pattern (PP) 5.

FIG. 46 is a suggested PP5' structure.

FIG. 47 is a relationship between data symbol and preamble.

FIG. 48 is another relationship between data symbol and preamble.

FIG. 49 is an example of cable channel delay profile.

FIG. 50 is scattered pilot structure that uses z=56 and z=112.

FIG. 51 is an example of modulator based on OFDM.

FIG. 52 is an example of preamble structure.

FIG. 53 is an example of Preamble decoding.

FIG. 54 is a process for designing more optimized preamble.

FIG. 55 is another example of preamble structure

FIG. 56 is another example of Preamble decoding.

FIG. 57 is an example of Preamble structure.

FIG. 58 is an example of L1 decoding.

FIG. 59 is an example of analog processor.

FIG. 60 is an example of digital receiver system.

FIG. 61 is an example of analog processor used at receiver.

FIG. 62 is an example of demodulator.

FIG. 63 is an example of frame parser.

FIG. 64 is an example of BICM demodulator.

FIG. 65 is an example of LDPC decoding using shortening/puncturing.

FIG. 66 is an example of output processor.

FIG. 67 is an example of L1 block repetition rate of 8 MHz.

FIG. 68 is an example of L1 block repetition rate of 8 MHz.

FIG. 69 is a new L1 block repetition rate of 7.61 MHz.

FIG. 70 is an example of L1 signaling which is transmitted in frame header.

FIG. 71 is preamble and L1 Structure simulation result.

FIG. 72 is an example of symbol interleaver.

FIG. 73 is an example of an L1 block transmission.

FIG. 74 is another example of L1 signaling transmitted within a frame header.

FIG. 75 is an example of frequency or time interleaving/deinterleaving.

FIG. 76 is a table analyzing overhead of L1 signaling which is transmitted in FECFRAME header at ModCod Header Insert (307) on data path of BICM module shown in FIG. 3.

FIG. 77 is showing a structure for FECFRAME header for minimizing overhead.

FIG. 78 is showing a bit error rate (BER) performance of the aforementioned L1 protection.

FIG. 79 is showing examples of a transmission frame and FEC frame structure.

FIG. 80 is showing an example of L1 signaling.

FIG. 81 is showing an example of L1-pre signaling.

FIG. 82 is showing a structure of L1 signaling block.

FIG. 83 is showing an L1 time interleaving.

FIG. 84 is showing an example of extracting modulation and code information.

FIG. 85 is showing another example of L1-pre signaling.

FIG. 86 is showing an example of scheduling of L1 signaling block that is transmitted in preamble.

FIG. 87 is showing an example of L1-pre signaling where power boosting is considered.

FIG. 88 is showing an example of L1 signaling.

FIG. 89 is showing another example of extracting modulation and code information.

FIG. 90 is showing another example of extracting modulation and code information.

FIG. 91 is showing an example of L1-pre synchronization.

FIG. 92 is showing an example of L1-pre signaling.

FIG. 93 is showing an example of L1 signaling.

FIG. 94 is showing an example of L1 signalling path.

FIG. 95 is another example of L1 signaling transmitted within a frame header.

FIG. 96 is another example of L1 signaling transmitted within a frame header.

FIG. 97 is another example of L1 signaling transmitted within a frame header.

FIG. 98 is showing an example of L1 signaling.

FIG. 99 is an example of symbol interleaver.

FIG. 100 is showing an interleaving performance of time interleaver of FIG. 99.

FIG. 101 is an example of symbol interleaver.

FIG. 102 is showing an interleaving performance of time interleaver of FIG. 101.

FIG. 103 is an example of symbol deinterleaver.

FIG. 104 is another example of time interleaving.
FIG. 105 is a result of interleaving using method shown in FIG. 104.
FIG. 106 is an example of addressing method of FIG. 105.
FIG. 107 is another example of L1 time interleaving.
FIG. 108 is an example of symbol deinterleaver.
FIG. 109 is another example of deinterleaver.
FIG. 110 is an example of symbol deinterleaver.
FIG. 111 is an example of row and column addresses for time deinterleaving.
FIG. 112 shows an example of general block interleaving in a data symbol domain where pilots are not used.
FIG. 113 is an example of an OFDM transmitter which uses data slices.
FIG. 114 is an example of an OFDM receiver which uses data slice.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the following description, the term "service" is indicative of either broadcast contents which can be transmitted/received by the signal transmission/reception apparatus.

Quadrature amplitude modulation (QAM) using Binary Reflected Gray Code (BRGC) is used as modulation in a broadcasting transmission environment where conventional Bit Interleaved Coded Modulation (BICM) is used. FIG. 1 shows an example of 64-QAM used in European DVB-T.

BRGC can be made using the method shown in FIG. 2. An n bit BRGC can be made by adding a reverse code of (n−1) bit BRGC (i.e., reflected code) to a back of (n−1) bit, by adding 0s to a front of original (n−1) bit BRGC, and by adding 1s to a front of reflected code. The BRGC code made by this method has a Hamming distance between adjacent codes of one (1). In addition, when BRGC is applied to QAM, the Hamming distance between a point and the four points which are most closely adjacent to the point, is one (1) and the Hamming distance between the point and another four points which are second most closely adjacent to the point, is two (2). Such characteristics of Hamming distances between a specific constellation point and other adjacent points can be dubbed as Gray mapping rule in QAM.

To make a system robust against Additive White Gaussian Noise (AWGN), distribution of signals transmitted from a transmitter can be made close to Gaussian distribution. To be able to do that, locations of points in constellation can be modified. FIG. 3 shows an output close to Gaussian by modifying 64-QAM used in DVB-T. Such constellation can be dubbed as Non-uniform QAM (NU-QAM).

To make a constellation of Non-uniform QAM, Gaussian Cumulative Distribution Function (CDF) can be used. In case of 64, 256, or 1024 QAM, i.e., 2^N AMs, QAM can be divided into two independent N-PAM. By dividing Gaussian CDF into N sections of identical probability and by allowing a signal point in each section to represent the section, a constellation having Gaussian distribution can be made. In other words, coordinate xj of newly defined non-uniform N-PAM can be defined as follows:

$$\int_{-\infty}^{x_j} \frac{1}{\sqrt{2\pi}} e^{-\frac{x^2}{2}} dx = p_j, \quad P_j \in \left\{ \frac{1}{2N}, \frac{3}{2N}, \ldots, \frac{2N-1}{2N} \right\} \quad \text{(Eq. 1)}$$

FIG. 3 is an example of transforming 64 QAM of DVB-T into NU-64 QAM using the above methods. FIG. 3 represents a result of modifying coordinates of each axis and Q axis using the above methods and mapping the previous constellation points to newly defined coordinates. In case of 32, 128, or 512 QAM, i.e., cross QAM, which is not 2^N QAM, by modifying Pj appropriately, a new coordinate can be found.

One embodiment of the present invention can modify QAM using BRGC by using characteristics of BRGC. As shown in FIG. 4, the Hamming distance between Reflected pair in BRGC is one because it differs only in one bit which is added to the front of each code. FIG. 5 shows the characteristics in QAM where Reflected pair exists for each 1 axis and Q axis. In this figure, Reflected pair exists on each side of the dotted black line.

By using Reflected pairs existing in QAM, an average power of a QAM constellation can be lowered while keeping Gray mapping rule in QAM. In other words, in a constellation where an average power is normalized as 1, the minimum Euclidean distance in the constellation can be increased. When this modified QAM is applied to broadcasting or communication systems, it is possible to implement either a more noise-robust system using the same energy as a conventional system or a system with the same performance as a conventional system but which uses less energy.

FIG. 6 shows a method of modifying QAM using Reflected pair of BRGC. FIG. 6a shows a constellation and FIG. 6b shows a flowchart for modifying QAM using Reflected pair of BRGC. First, a target point which has the highest power among constellation points needs to be found. Candidate points are points where that target point can move and are the closest neighbor points of the target point s reflected pair. Then, an empty point (i.e., a point which is not yet taken by other points) having the smallest power needs to be found among the candidate points and the power of the target point and the power of a candidate point are compared. If the power of the candidate point is smaller, the target point moves to the candidate point. These processes are repeated until an average power of the points on constellation reaches a minimum while keeping Gray mapping rule.

FIG. 7 shows an example of modified 64/256/1024/4096-QAM. The Gray mapped values correspond to FIGS. 8~31 respectively. In addition to these examples, other types of modified QAM which enables identical power optimization can be realized. This is because a target point can move to multiple candidate points. The suggested modified QAM can be applied to, not only the 64/256/1024/4096-QAM, but also cross QAM, a bigger size QAM, or modulations using other BRGC other than QAM.

FIG. 32 shows an example of Bit mapping of Modified-QAM where 256-QAM is modified using BRGC. FIG. 32a and FIG. 32b show mapping of Most Significant Bits (MSB). Points designated as filled circles represent mappings of ones and points designated as blank circles represent mappings of zeros. In a same manner, each bit is mapped as shown in figures from (a) through (h) in FIG. 32, until Least Significant Bits (LSB) are mapped. As shown in FIG. 32, Modified-QAM can enable bit decision using only I or Q axes as conventional QAM, except for a bit which is next to MSB (FIG. 32c and FIG. 32d). By using these characteristics, a simple receiver can be made by partially modifying a receiver for QAM. An efficient receiver can be implemented by checking both I and Q values only when determining bit next to MSB and by calculating only I or Q for the rest of bits. This method can be applied to Approximate LLR, Exact LLR, or Hard decision.

By using the Modified-QAM or MQAM, which uses the characteristics of above BRGC, Non-uniform constellation or NU-MQAM can be made. In the above equation where Gaussian CDF is used, Pj can be modified to fit MQAM. Just like QAM, in MQAM, two PAMs having I axis and Q axis can be considered. However, unlike QAM where a number of points corresponding to a value of each PAM axis are identical, the number of points changes in MQAM. If a number of points that corresponds to jth value of PAM is defined as nj in a MQAM where a total of M constellation points exist, then Pj can be defined as follows:

$$\int_{-\infty}^{x_j} \frac{1}{\sqrt{2\pi}} e^{-\frac{x^2}{2}} dx = P_j \quad P_j = \frac{\sum_{i=0}^{i=j-1} n_i + \frac{n_j}{2N}}{M}, n_0 = 0 \quad \text{(Eg. 2)}$$

By using the newly defined Pj, MQAM can be transformed into Non-uniform constellation. Pj can be defined as follows for the example of 256-MQAM.

$$P_j \in \left\{ \frac{2.5}{256}, \frac{10}{256}, \frac{22}{256}, \frac{36}{256}, \frac{51}{256}, \frac{67}{256}, \frac{84}{256}, \frac{102}{256}, \frac{119.5}{256}, \right.$$
$$\left. \frac{136.5}{256}, \frac{154}{256}, \frac{172}{256}, \frac{189}{256}, \frac{205}{256}, \frac{220}{256}, \frac{234}{256}, \frac{246}{256}, \frac{253.5}{256} \right\}$$

FIG. 33 is an example of transformation of MQAM into Non-uniform constellation. The NU-MQAM made using these methods can retain characteristics of MQAM receivers with modified coordinates of each PAM. Thus, an efficient receiver can be implemented. In addition, a more noise-robust system than the previous NU-QAM can be implemented. For a more efficient broadcasting transmission system, hybridizing MQAM and NU-MQAM is possible. In other words, a more noise-robust system can be implemented by using MQAM for an environment where an error correction code with high code rate is used and by using NU-MQAM otherwise. For such a case, a transmitter can let a receiver have information of code rate of an error correction code currently used and a kind of modulation currently used such that the receiver can demodulate according to the modulation currently used.

FIG. 34 shows an example of digital transmission system. Inputs can comprise a number of MPEG-TS streams or GSE (General Stream Encapsulation) streams. An input processor module 101 can add transmission parameters to input stream and perform scheduling for a BICM module 102. The BICM module 102 can add redundancy and interleave data for transmission channel error correction. A frame builder 103 can build frames by adding physical layer signaling information and pilots. A modulator 104 can perform modulation on input symbols in efficient methods. An analog processor 105 can perform various processes for converting input digital signals into output analog signals.

FIG. 35 shows an example of an input processor. Input MPEG-TS or GSE stream can be transformed by input preprocessor into a total of n streams which will be independently processed. Each of those streams can be either a complete TS frame which includes multiple service components or a minimum TS frame which includes service component (i.e., video or audio). In addition, each of those streams can be a GSE stream which transmits either multiple services or a single service.

Input interface module 202-1 can allocate a number of input bits equal to the maximum data field capacity of a Baseband (BB) frame. A padding may be inserted to complete the LDPC/BCH code block capacity. The input stream sync module 203-1 can provide a mechanism to regenerate, in the receiver, the clock of the Transport Stream (or packetized Generic Stream), in order to guarantee end-to-end constant bit rates and delay.

In order to allow the Transport Stream recombining without requiring additional memory in the receiver, the input Transport Streams are delayed by delay compensators 204-1~n considering interleaving parameters of the data PLPs in a group and the corresponding common PLP. Null packet deleting modules 205-1~n can increase transmission efficiency by removing inserted null packet for a case of VBR (variable bit rate) service. Cyclic Redundancy Check (CRC) encoder modules 206-1~n can add CRC parity to increase transmission reliability of BB frame. BB header inserting modules 207-1~n can add BB frame header at a beginning portion of BB frame. Information that can be included in BB header is shown in FIG. 36.

A Merger/slicer module 208 can perform BB frame slicing from each PLP, merging BB frames from multiple PLPs, and scheduling each BB frame within a transmission frame. Therefore, the merger/slicer module 208 can output L1 signaling information which relates to allocation of PLP in frame. Lastly, a BB scrambler module 209 can randomize input bitstreams to minimize correlation between bits within bitstreams. The modules in shadow in FIG. 35 are modules used when transmission system uses a single PLP, the other modules in FIG. 35 are modules used when the transmission device uses multiple PLPs.

FIG. 37 shows an example of BICM module. FIG. 37a shows data path and FIG. 37b shows L1 path of BICM module. An outer coder module 301 and an inner coder module 303 can add redundancy to input bitstreams for error correction. An outer interleaver module 302 and an inner interleaver module 304 can interleave bits to prevent burst error. The Outer interleaver module 302 can be omitted if the BICM is specifically for DVB-C2. A bit demux module 305 can control reliability of each bit output from the inner interleaver module 304. A symbol mapper module 306 can map input bitstreams into symbol streams. At this time, it is possible to use any of a conventional QAM, an MQAM which uses the aforementioned BRGC for performance improvement, an NU-QAM which uses Non-uniform modulation, or an NU-MQAM which uses Non-uniform modulation applied BRGC for performance improvement. To construct a system which is more robust against noise, combinations of modulations using MQAM and/or NU-MQAM depending on the code rate of the error correction code and the constellation capacity can be considered. At this time, the Symbol mapper module 306 can use a proper constellation according to the code rate and constellation capacity. FIG. 39 shows an example of such combinations.

Case 1 shows an example of using only NU-MQAM at low code rate for simplified system implementation. Case 2 shows an example of using optimized constellation at each code rate. The transmitter can send information about the code rate of the error correction code and the constellation capacity to the receiver such that the receiver can use an appropriate constellation. FIG. 40 shows another example of cases where compatibility between conventional systems is considered. In addition to the examples, further combinations for optimizing the system are possible.

The ModCod Header inserting module 307 shown in FIG. 37 can take Adaptive coding and modulation (ACM)/Variable coding and modulation (VCM) feedback information and add parameter information used in coding and modulation to a FEC block as header. The Modulation type/Coderate (ModCod) header can include the following information:

* FEC type (1 bits) long or short LDPC
* Coderate (3 bits)
* Modulation (3 bits) up-to 64K QAM
* PLP identifier (8 bits)

The Symbol interleaver module 308 can perform interleaving in symbol domain to obtain additional interleaving effects. Similar processes performed on data path can be performed on L1 signaling path but with possibly different parameters (301-1~308-1). At this point, a shortened/punctured code module (303-1) can be used for inner code.

FIG. 38 shows an example of LDPC encoding using shortening/puncturing. Shortening process can be performed on input blocks which have less bits than a required number of bits for LDPC encoding as many zero bits required for LDPC encoding can be padded (301*c*). Zero Padded input bitstreams can have parity bits through LDPC encoding (302*c*). At this time, for bitstreams that correspond to original bitstreams, zeros can be removed (303*c*) and for parity bitstreams, puncturing (304*c*) can be performed according to code-rates. These processed information bitstreams and parity bitstreams can be multiplexed into original sequences and outputted (305*c*).

FIG. 41 shows a frame structure which comprises preamble for L1 signaling and data symbol for PLP data. It can be seen that preamble and data symbols are cyclically generated, using one frame as a unit. Data symbols comprise PLP type 0 which is transmitted using a fixed modulation/coding and PLP type 1 which is transmitted using a variable modulation/coding. For PLP type 0, information such as modulation, FEC type, and FEC code rate are transmitted in preamble (see FIG. 42 Frame header insert 401). For PLP type 1, corresponding information can be transmitted in FEC block header of a data symbol (see FIG. 37 ModCod header insert 307). By the separation of PLP types, ModCod overhead can be reduced by 3~4% from a total transmission rate, for PLP type 0 which is transmitted at a fixed bit rate. At a receiver, for fixed modulation/coding PLP of PLP type 0, Frame header remover r401 shown in FIG. 63 can extract information on Modulation and FEC code rate and provide the extracted information to a BICM decoding module. For variable modulation/coding PLP of PLP type 1, ModCod extracting modules, r307 and r307-1 shown in FIG. 64 can extract and provide the parameters necessary for BICM decoding.

FIG. 42 shows an example of a frame builder. A frame header inserting module 401 can form a frame from input symbol streams and can add frame header at front of each transmitted frame. The frame header can include the following information:

* Number of bonded channels (4 bits)
* Guard interval (2 bits)
* PAPR (2 bits)
* Pilot pattern (2 bits)
* Digital System identification (16 bits)
* Frame identification (16 bits)
* Frame length (16 bits) number of Orthogonal Frequency Division Multiplexing (OFDM) symbols per frame
    * Superframe length (16 bits) number of frames per superframe
    * number of PLPs (8 bits)
    * for each PLP
    PLP identification (8 bits)
    Channel bonding id (4 bits)
    PLP start (9 bits)
    PLP type (2 bits) common PLP or others
    PLP payload type (5 bits)
    MC type (1 bit) -fixed/variable modulation & coding
    if MC type == fixed modulation & coding
    FEC type (1 bits) -long or short LDPC
    Coderate (3 bits)
    Modulation (3 bits) -up-to 64K QAM
    end if;
    Number of notch channels (2 bits)
    for each notch
    Notch start (9 bits)
    Notch width (9 bits)
    end for;
    PLP width (9 bits) -max number of FEC blocks of PLP
    PLP time interleaving type (2 bits)
end for;
* CRC-32 (32 bits)

Channel bonding environment is assumed for L1 information transmitted in Frame header and data that correspond to each data slice is defined as PLP. Therefore, information such as PLP identifier, channel bonding identifier, and PLP start address are required for each channel used in bonding. One embodiment of this invention suggests transmitting ModCod field in FEC frame header if PLP type supports variable modulation/coding and transmitting ModCod field in Frame header if PLP type supports fixed modulation/coding to reduce signaling overhead. In addition, if a Notch band exists for each PLP, by transmitting the start address of the Notch and its width, decoding corresponding carriers at the receiver can become unnecessary.

FIG. 43 shows an example of Pilot Pattern 5 (PP5) applied in a channel bonding environment. As shown, if SP positions are coincident with preamble pilot positions, irregular pilot structure can occur.

FIG. 43*a* shows an example of pilot inserting module 404 as shown in FIG. 42. As represented in FIG. 43, if a single frequency band (for example, 8 MHz) is used, the available bandwidth is 7.61 MHz, but if multiple frequency bands are bonded, guard bands can be removed, thus, frequency efficiency can increase greatly. FIG. 43*b* is an example of preamble inserting module 504 as shown in FIG. 51 that is transmitted at the front part of the frame and even with channel bonding, the preamble has repetition rate of 7.61 MHz, which is bandwidth of L1 block. This is a structure considering the bandwidth of a tuner which performs initial channel scanning.

Pilot Patterns exist for both Preamble and Data Symbols. For data symbol, scattered pilot (SP) patterns can be used. Pilot Pattern 5 (PP5) and Pilot Pattern 7 (PP7) of T2 can be good candidates for frequency-only interpolation. PP5 has x=12, y=4, z=48 for GI=1/64 and PP7 has x=24, y=4, z=96 for GI=1/128. Additional time-interpolation is also possible for a better channel estimation. Pilot patterns for preamble can cover all possible pilot positions for initial channel acquisition. In addition, preamble pilot positions should be coincident with SP positions and a single pilot pattern for both the preamble and the SP is desired. Preamble pilots could also be used for time-interpolation and every preamble could have an identical pilot pattern. These requirements are important for C2 detection in scanning and necessary for frequency offset estimation with scrambling sequence correlation. In a channel bonding environment, the coincidence in pilot positions should also be kept for channel bonding because irregular pilot structure may degrade interpolation performance.

In detail, if a distance z between scattered pilots (SPs) in an OFDM symbol is 48 and if a distance y between SPs corresponding to a specific SP carrier along the time axis is 4, an effective distance x after time interpolation becomes 12. This is when a guard interval (GI) fraction is 1/64. If GI fraction is 1/128, x=24, y=4, and z=96 can be used. If channel bonding is used, SP positions can be made coincident with preamble pilot positions by generating non-continuous points in scattered pilot structure.

At this time, preamble pilot positions can be coincident with every SP positions of data symbol. When channel bonding is used, data slice where a service is transmitted, can be determined regardless of 8 MHz bandwidth granularity. However, for reducing overhead for data slice addressing, transmission starting from SP position and ending at SP position can be chosen.

When a receiver receives such SPs, if necessary, channel estimation module r501 shown in FIG. 62 can perform time interpolation to obtain pilots shown in dotted lines in FIG. 43 and perform frequency interpolation. At this time, for non-continuous points of which intervals are designated as 32 in FIG. 43, either performing interpolations on left and right separately or performing interpolations on only one side then performing interpolation on the other side by using the already interpolated pilot positions of which interval is 12 as a reference point can be implemented. At this time, data slice width can vary within 7.61 MHz, thus, a receiver can minimize power consumption by performing channel estimation and decoding only necessary subcarriers.

FIG. 44 shows another example of PP5 applied in channel bonding environment or a structure of SP for maintaining effective distance x as 12 to avoid irregular SP structure shown in FIG. 43 when channel bonding is used. FIG. 44a is a structure of SP for data symbol and FIG. 44b is a structure of SP for preamble symbol.

As shown, if SP distance is kept consistent in case of channel bonding, there will be no problem in frequency interpolation but pilot positions between data symbol and preamble may not be coincident. In other words, this structure does not require additional channel estimation for an irregular SP structure, however, SP positions used in channel bonding and preamble pilot positions become different for each channel.

FIG. 45 shows a new SP structure or PP5 to provide a solution to the two problems aforementioned in channel bonding environment. Specifically, a pilot distance of x=16 can solve those problems. To preserve pilot density or to maintain the same overhead, a PP5' can have x=16, y=3, z=48 for GI=1/64 and a PP7' can have x=16, y=6, z=96 for GI=1/128. Frequency-only interpolation capability can still be maintained. Pilot positions are depicted in FIG. 45 for comparison with PP5 structure.

FIG. 46 shows an example of a new SP Pattern or PP5 structure in channel bonding environment. As shown in FIG. 46, whether either single channel or channel bonding is used, an effective pilot distance x=16 can be provided. In addition, because SP positions can be made coincident with preamble pilot positions, channel estimation deterioration caused by SP irregularity or non-coincident SP positions can be avoided. In other words, no irregular SP position exists for freq-interpolator and coincidence between preamble and SP positions is provided.

Consequently, the proposed new SP patterns can be advantageous in that single SP pattern can be used for both single and bonded channel; no irregular pilot structure can be caused, thus a good channel estimation is possible; both preamble and SP pilot positions can be kept coincident; pilot density can be kept the same as for PP5 and PP7 respectively; and Frequency-only interpolation capability can also be preserved.

In addition, the preamble structure can meet the requirements such as preamble pilot positions should cover all possible SP positions for initial channel acquisition; maximum number of carriers should be 3409 (7.61 MHz) for initial scanning; exactly same pilot patterns and scrambling sequence should be used for C2 detection; and no detection-specific preamble like P1 in T2 is required.

In terms of relation with frame structure, data slice position granularity may be modified to 16 carriers rather than 12, thus, less position addressing overhead can occur and no other problem regarding data slice condition, Null slot condition etc can be expected.

Therefore, at channel estimation module r501 of FIG. 62, pilots in every preamble can be used when time interpolation of SP of data symbol is performed. Therefore, channel acquisition and channel estimation at the frame boundaries can be improved.

Now, regarding requirements related to the preamble and the pilot structure, there is consensus in that positions of preamble pilots and SPs should coincide regardless of channel bonding; the number of total carriers in L1 block should be dividable by pilot distance to avoid irregular structure at band edge; L1 blocks should be repeated in frequency domain; and L1 blocks should always be decodable in arbitrary tuner window position. Additional requirements would be that pilot positions and patterns should be repeated by period of 8 MHz; correct carrier frequency offset should be estimated without channel bonding knowledge; and L1 decoding (re-ordering) is impossible before the frequency offset is compensated.

FIG. 47 shows a relationship between data symbol and preamble when preamble structures as shown in FIG. 52 and FIG. 53 are used. L1 block can be repeated by period of 6 MHz. For L1 decoding, both frequency offset and Preamble shift pattern should be found. L1 decoding is not possible in arbitrary tuner position without channel bonding information and a receiver cannot differentiate between preamble shift value and frequency offset.

Thus, a receiver, specifically for Frame header remover r401 shown in FIG. 63 to perform L1 signal decoding, channel bonding structure needs to be obtained. Because preamble shift amount expected at two vertically shadowed regions in FIG. 47 is known, time/freq synchronizing module r505 in FIG. 62 can estimate carrier frequency offset. Based on the estimation, L1 signaling path (r308-1~r301-1) in FIG. 64 can decode L1.

FIG. 48 shows a relationship between data symbol and preamble when the preamble structure as shown in FIG. 55 is used. L1 block can be repeated by period of 8 MHz. For L1 decoding, only frequency offset needs to be found and channel bonding knowledge may not be required. Frequency offset can be easily estimated by using known Pseudo Random Binary Sequence (PRBS) sequence. As shown in FIG. 48, preamble and data symbols are aligned, thus, additional sync search can become unnecessary. Therefore, for a receiver, specifically for the Frame header remover module r401 shown in FIG. 63, it is possible that only correlation peak with pilot scrambling sequence needs to be obtained to perform L1 signal decoding. The time/freq synchronizing module r505 in FIG. 62 can estimate carrier frequency offset from peak position.

FIG. 49 shows an example of cable channel delay profile.

From the point of view of pilot design, current GI already over-protects delay spread of cable channel. In the worst case, redesigning the channel model can be an option. To repeat the pattern exactly every 8 MHz, the pilot distance should be a divisor of 3584 carriers (z=32 or 56). A pilot density of z=32 can increase pilot overhead, thus, z=56 can be chosen. Slightly less delay coverage may not be an important in cable channel. For example, it can be 8 μs for PP5' and 4 μs for PP7' compared to 9.3 μs (PP5) and 4.7 μs (PP7). Meaningful delays can be covered by both pilot patterns even in a worst case. For preamble pilot position, no more than all SP positions in data symbol are necessary.

If the −40 dB delay path can be ignored, actual delay spread can become 2.5 us, 1/64 GI=7 μs, or 1/128 GI=3.5 μs. This shows that pilot distance parameter, z=56 can be a good enough value. In addition, z=56 can be a convenient value for structuring pilot pattern that enables preamble structure shown in FIG. 48.

FIG. 50 shows scattered pilot structure that uses z=56 and z=112 which is constructed at pilot inserting module 404 in FIG. 42. PP5' (x=14, y=4, z=56) and PP7' (x=28, y=4, z=112) are proposed. Edge carriers could be inserted for closing edge.

As shown in FIG. 50, pilots are aligned at 8 MHz from each edge of the band, every pilot position and pilot structure can be repeated every 8 MHz. Thus, this structure can support the preamble structure shown in FIG. 48. In addition, a common pilot structure between preamble and data symbols can be used. Therefore, channel estimation module r501 in FIG. 62 can perform channel estimation using interpolation on preamble and data symbols because no irregular pilot pattern can occur, regardless of window position which is decided by data slice locations. At this time, using only frequency interpolation can be enough to compensate channel distortion from delay spread. If time interpolation is performed additionally, more accurate channel estimation can be performed.

Consequently, in the new proposed pilot pattern, pilot position and pattern can be repeated based on a period of 8 MHz. A single pilot pattern can be used for both preamble and data symbols. L1 decoding can always be possible without channel bonding knowledge. In addition, the proposed pilot pattern may not affect commonality with T2 because the same pilot strategy of scattered pilot pattern can be used; T2 already uses 8 different pilot patterns; and no significant receiver complexity can be increased by modified pilot patterns. For a pilot scrambling sequence, the period of PRBS can be 2047 (m-sequence); PRBS generation can be reset every 8 MHz, of which the period is 3584; pilot repetition rate of 56 can be also co-prime with 2047; and no PAPR issue can be expected.

FIG. 51 shows an example of a modulator based on OFDM. Input symbol streams can be transformed into time domain by IFFT module 501. If necessary, peak-to-average power ratio (PAPR) can be reduced at PAPR reducing module 502. For PAPR methods, Active constellation extension (ACE) or tone reservation can be used. GI inserting module 503 can copy a last part of effective OFDM symbol to fill guard interval in a form of cyclic prefix.

Preamble inserting module 504 can insert preamble at the front of each transmitted frame such that a receiver can detect digital signal, frame and acquire time/freq offset acquisition. At this time, the preamble signal can perform physical layer signaling such as FFT size (3 bits) and Guard interval size (3 bits). The Preamble inserting module 504 can be omitted if the modulator is specifically for DVB-C2.

FIG. 52 shows an example of a preamble structure for channel bonding, generated at preamble inserting module 504 in FIG. 51. One complete L1 block should be "always decodable" in any arbitrary 7.61 MHz tuning window position and no loss of L1 signaling regardless of tuner window position should occur. As shown, L1 blocks can be repeated in frequency domain by period of 6 MHz. Data symbol can be channel bonded for every 8 MHz. If, for L1 decoding, a receiver uses a tuner such as the tuner r603 represented in FIG. 61 which uses a bandwidth of 7.61 MHz, the Frame header remover r401 in FIG. 63 needs to rearrange the received cyclic shifted L1 block (FIG. 53) to its original form. This rearrangement is possible because L1 block is repeated for every 6 MHz block. FIG. 53a can be reordered into FIG. 53b.

FIG. 54 shows a process for designing a more optimized preamble. The preamble structure of FIG. 52 uses only 6 MHz of total tuner bandwidth 7.61 MHz for L1 decoding. In terms of spectrum efficiency, tuner bandwidth of 7.61 MHz is not fully utilized. Therefore, there can be further optimization in spectrum efficiency.

FIG. 55 shows another example of preamble structure or preamble symbols structure for full spectrum efficiency, generated at Frame Header Inserting module 401 in FIG. 42. Just like data symbol, L1 blocks can be repeated in frequency domain by period of 8 MHz. One complete L1 block is still "always decodable" in any arbitrary 7.61 MHz tuning window position. After tuning, the 7.61 MHz data can be regarded as a virtually punctured code. Having exactly the same bandwidth for both the preamble and data symbols and exactly the same pilot structure for both the preamble and data symbols can maximize spectrum efficiency. Other features such as cyclic shifted property and not sending L1 block in case of no data slice can be kept unchanged. In other words, the bandwidth of preamble symbols can be identical with the bandwidth of data symbols or, as shown in FIG. 57, the bandwidth of the preamble symbols can be the bandwidth of the tuner (here, it's 7.61 MHz). The tuner bandwidth can be defined as a bandwidth that corresponds to a number of total active carriers when a single channel is used. That is, the bandwidth of the preamble symbol can correspond to the number of total active carriers (here, it's 7.61 MHz).

FIG. 56 shows a virtually punctured code. The 7.61 MHz data among the 8 MHz L1 block can be considered as punctured coded. When a tuner r603 shown in FIG. 61 uses 7.61 MHz bandwidth for L1 decoding, Frame header remover r401 in FIG. 63 needs to rearrange received, cyclic shifted L1 block into original form as shown in FIG. 56. At this time, L1 decoding is performed using the entire bandwidth of the tuner. Once the L1 block is rearranged, a spectrum of the rearranged L1 block can have a blank region within the spectrum as shown in upper right side of FIG. 56 because an original size of L1 block is 8 MHz bandwidth.

Once the blank region is zero padded, either after deinterleaving in symbol domain by the freq. deinterleaver r403 in FIG. 63 or by the symbol deinterleaver r308-1 in FIG. 64 or after deinterleaving in bit domain by the symbol demapper r306-1, bit mux r305-1, and inner deinterleaver r304-1 in FIG. 64, the block can have a form which appears to be punctured as shown in lower right side of FIG. 56.

This L1 block can be decoded at the punctured/shortened decode module r303-1 in FIG. 64. By using these preamble structure, the entire tuner bandwidth can be utilized, thus spectrum efficiency and coding gain can be increased. In addition, an identical bandwidth and pilot structure can be used for the preamble and data symbols.

In addition, if the preamble bandwidth or the preamble symbols bandwidth is set as a tuner bandwidth as shown in FIG. 58, (it's 7.61 MHz in the example), a complete L1 block can be obtained after rearrangement even without puncturing. In other words, for a frame having preamble symbols, wherein the preamble symbols have at least one layer 1 (L1) block, it can be said, the L1 block has 3408 active subcarriers and the 3408 active subcarriers correspond to 7.61 MHz of 8 MHz Radio Frequency (RF) band.

Thus, spectrum efficiency and L1 decoding performance can be maximized. In other words, at a receiver, decoding can be performed at punctured/shortened decode module r303-1 in FIG. 64, after performing only deinterleaving in the symbol domain.

Consequently, the proposed new preamble structure can be advantageous in that it s fully compatible with previously used preamble except that the bandwidth is different; L1 blocks are repeated by period of 8 MHz; L1 block can be always decodable regardless of tuner window position; Full tuner bandwidth can be used for L1 decoding; maximum spectrum efficiency can guarantee more coding gain; incomplete L1 block can be considered as punctured coded; simple and same pilot structure can be used for both preamble and data; and identical bandwidth can be used for both preamble and data.

FIG. 59 shows an example of an analog processor. A DAC module 601 can convert digital signal input into analog signal. After transmission frequency bandwidth is upconverted (602) and analog filtered (603) signal can be transmitted.

FIG. 60 shows an example of a digital receiver system. Received signal is converted into digital signal at an analog process module r105. A demodulator r104 can convert the signal into data in frequency domain. A frame parser r103 can remove pilots and headers and enable selection of service information that needs to be decoded. A BICM demodulator r102 can correct errors in the transmission channel. An output processor r101 can restore the originally transmitted service stream and timing information.

FIG. 61 shows an example of analog processor used at the receiver. A Tuner/AGC module r603 can select desired frequency bandwidth from received signal. A down converting module r602 can restore baseband. An ADC module r601 can convert analog signal into digital signal.

FIG. 62 shows an example of demodulator. A frame detecting module r506 can detect the preamble, check if a corresponding digital signal exists, and detect a start of a frame. A time/freq synchronizing module r505 can perform synchronization in time and frequency domains. At this time, for time domain synchronization, a guard interval correlation can be used. For frequency domain synchronization, correlation can be used or offset can be estimated from phase information of a subcarrier that is transmitted in the frequency domain. A preamble removing module r504 can remove preamble from the front of detected frame. A GI removing module r503 can remove guard interval. A FFT module r501 can transform signal in the time domain into signal in the frequency domain. A channel estimation/equalization module r501 can compensate errors by estimating distortion in transmission channel using pilot symbol. The Preamble removing module r504 can be omitted if the demodulator is specifically for DVB-C2.

FIG. 63 shows an example of frame parser. A pilot removing module r404 can remove pilot symbol. A freq deinterleaving module r403 can perform deinterleaving in the frequency domain. An OFDM symbol merger r402 can restore data frame from symbol streams transmitted in OFDM symbols. A frame header removing module r401 can extract physical layer signaling from header of each transmitted frame and remove header. Extracted information can be used as parameters for following processes in the receiver.

FIG. 64 shows an example of a BICM demodulator. FIG. 64a shows a data path and FIG. 64b shows a L1 signaling path. A symbol deinterleaver r308 can perform deinterleaving in the symbol domain. A ModCod extract r307 can extract ModCod parameters from front of each BB frame and make the parameters available for following adaptive/variable demodulation and decoding processes. A Symbol demapper r306 can demap input symbol streams into bit Log-Likelyhood Ratio (LLR) streams. The Output bit LLR streams can be calculated by using a constellation used in a Symbol mapper 306 of the transmitter as reference point. At this point, when the aforementioned MQAM or NU-MQAM is used, by calculating both I axis and Q axis when calculating bit nearest from MSB and by calculating either I axis or Q axis when calculating the rest bits, an efficient symbol demapper can be implemented. This method can be applied to, for example, Approximate LLR, Exact LLR, or Hard decision.

When an optimized constellation according to constellation capacity and code rate of error correction code at the Symbol mapper 306 of the transmitter is used, the Symbol demapper r306 of the receiver can obtain a constellation using the code rate and constellation capacity information transmitted from the transmitter. The bit mux r305 of the receiver can perform an inverse function of the bit demux 305 of the transmitter. The Inner deinterleaver r304 and outer deinterleaver r302 of the receiver can perform inverse functions of the inner interleaver 304 and outer interleaver 302 of the transmitter, respectively to get the bitstream in its original sequence. The outer deinterleaver r302 can be omitted if the BICM demodulator is specifically for DVB-C2.

The inner decoder r303 and outer decoder r301 of the receiver can perform corresponding decoding processes to the inner coder 303 and outer code 301 of the transmitter, respectively, to correct errors in the transmission channel. Similar processes performed on data path can be performed on L1 signaling path, but with different parameters (r308-1~r301-1). At this point, as explained in the preamble part, a shortened/punctured code module r303-1 can be used for L1 signal decoding.

FIG. 65 shows an example of LDPC decoding using shortening/puncturing. A demux r301 a can separately output information part and parity part of systematic code from input bit streams. For the information part, a zero padding (r302a) can be performed according to a number of input bit streams of LDPC decoder, for the parity part, input bit streams for (r303a) the LDPC decoder can be generated by depuncturing punctured part. LDPC decoding (r304a) can be performed on generated bit streams, zeros in information part can be removed and output (r305a).

FIG. 66 shows an example of output processor. A BB descrambler r209 can restore scrambled (209) bit streams at the transmitter. A Splitter r208 can restore BB frames that correspond to multiple PLP that are multiplexed and transmitted from the transmitter according to PLP path. For each PLP path, a BB header remover r207-1~n can remove the header that is transmitted at the front of the BB frame. A CRC decoder r206-1~n can perform CRC decoding and make reliable BB frames available for selection. A Null packet inserting modules r205-1~n can restore null packets which were removed for higher transmission efficiency in their original location. A Delay recovering modules r204-1~n can restore a delay that exists between each PLP path.

An output clock recovering modules r203-1~n can restore the original timing of the service stream from timing information transmitted from the input stream synchronization modules 203-1~n. An output interface modules r202-1~n can restore data in TS/GS packet from input bit streams that are sliced in BB frame. An output postprocess modules r201-1~n can restore multiple TS/GS streams into a complete TS/GS stream, if necessary. The shaded blocks shown in FIG. 66 represent modules that can be used when a single PLP is processed at a time and the rest of the blocks represent modules that can be used when multiple PLPs are processed at the same time.

Preamble pilot patterns were carefully designed to avoid PAPR increase, thus, whether L1 repetition rate may increase PAPR needs to be considered. The number of L1 information bits varies dynamically according to the channel bonding, the number of PLPs, etc. In detail, it is necessary to consider things such as fixed L1 block size may introduce unnecessary overhead; L1 signaling should be protected more strongly than data symbols; and time interleaving of L1 block can improve robustness over channel impairment such as impulsive noise need.

For a L1 block repetition rate of 8 MHz, as shown in FIG. 67, full spectrum efficiency (26.8% BW increase) is exhibited with virtual puncturing but the PAPR may be increased since L1 bandwidth is the same as that of the data symbols. For the repetition rate of 8 MHz, 4K-FFT DVB-T2 frequency interleaving can be used for commonality and the same pattern can repeat itself at a 8 MHz period after interleaving.

For a L1 block repetition rate of 6 MHz, as shown in FIG. 68, reduced spectrum efficiency can be exhibited with no virtual puncturing. A similar problem of PAPR as for the 8 MHz case can occur since the L1 and data symbol bandwidths share LCM=24 MHz. For the repetition rate of 6 MHz, 4K-FFT DVB-T2 frequency interleaving can be used for commonality and the same pattern can repeat itself at a period of 24 MHz after interleaving.

FIG. 69 shows a new L1 block repetition rate of 7.61 MHz or full tuner bandwidth. A full spectrum efficiency (26.8% BW increase) can be obtained with no virtual puncturing. There can be no PAPR issue since L1 and data symbol bandwidths share LCM≈1704 MHz. For the repetition rate of 7.61 MHz, 4K-FFT DVB-T2 frequency interleaving can be used for commonality and the same pattern can repeat itself by period of about 1704 MHz after interleaving.

FIG. 70 is an example of L1 signaling which is transmitted in the frame header. Each information in L1 signaling can be transmitted to the receiver and can be used as a decoding parameter. Especially, the information can be used in L1 signal path shown in FIG. 64 and PLPs can be transmitted in each data slice. An increased robustness for each PLP can be obtained.

FIG. 72 is an example of a symbol interleaver 308-1 as shown in L1 signaling path in FIG. 37 and also can be an example of its corresponding symbol deinterleaver r308-1 as shown in L1 signaling path in FIG. 64. Blocks with tilted lines represent L1 blocks and solid blocks represent data carriers. L1 blocks can be transmitted not only within a single preamble, but also can be transmitted within multiple OFDM blocks. Depending on a size of L1 block, the size of the interleaving block can vary. In other words, num_L1_sym and L1 span can be different from each other. To minimize unnecessary overhead, data can be transmitted within the rest of the carriers of the OFDM symbols where the L1 block is transmitted. At this point, full spectrum efficiency can be guaranteed because the repeating cycle of L1 block is still a full tuner bandwidth. In FIG. 72, the numbers in blocks with tilted lines represent the bit order within a single LDPC block.

Consequently, when bits are written in an interleaving memory in the row direction according to a symbol index as shown in FIG. 72 and read in the column direction according to a carrier index, a block interleaving effect can be obtained. In other words, one LDPC block can be interleaved in the time domain and the frequency domain and then can be transmitted. Num_L1_sym can be a predetermined value, for example, a number between 2~4 can be set as a number of OFDM symbols. At this point, to increase the granularity of the L1 block size, a punctured/shortened LDPC code having a minimum length of the codeword can be used for L1 protection.

FIG. 73 is an example of an L1 block transmission. FIG. 73 illustrates FIG. 72 in frame domain. As shown on FIG. 73a, L1 blocks can be spanning in full tuner bandwidth or as shown on FIG. 73b, L1 blocks can be partially spanned and the rest of the carriers can be used for data carrier. In either case, it can be seen that the repetition rate of L1 block can be identical to a full tuner bandwidth. In addition, for OFDM symbols which uses L1 signaling including preamble, only symbol interleaving can be performed while not allowing data transmission in that OFDM symbols. Consequently, for OFDM symbol used for L1 signaling, a receiver can decode L1 by performing deinterleaving without data decoding. At this point, the L1 block can transmit L1 signaling of current frame or L1 signaling of a subsequent frame. At the receiver side, L1 parameters decoded from L1 signaling decoding path shown in FIG. 64 can be used for decoding process for data path from frame parser of subsequent frame.

In summary, at a transmitter, interleaving blocks of L1 region can be performed by writing blocks to a memory in a row direction and reading the written blocks from the memory in a column direction. At a receiver, deinterleaving blocks of L1 region can be performed by writing blocks to a memory in a column direction and reading the written blocks from the memory in a row direction. The reading and writing directions of transmitter and receiver can be interchanged.

When simulation is performed with assumptions such as CR=½ for L1 protection and for T2 commonality; 16-QAM symbol mapping; pilot density of 6 in the Preamble; number of short LDPC implies required amount of puncturing/shortening are made, results or conclusions such as only preamble for L1 transmission may not be sufficient; the number of OFDM symbols depends on the amount of L1 block size; shortest LDPC codeword (e.g. 192 bits information) among shortened/punctured code may be used for flexibility and fine granularity; and Padding may be added if required with negligible overhead, can be obtained. The result is summarized in FIG. 71.

Consequently, for a L1 block repetition rate, full tuner bandwidth with no virtual puncturing can be a good solution and still no PAPR issue can arise with full spectrum efficiency. For L1 signaling, efficient signaling structure can allow maximum configuration in an environment of 8 channels bonding, 32 notches, 256 data slices, and 256 PLPs. For L1 block structure, flexible L1 signaling can be implemented according to L1 block size. Time interleaving can be performed for better robustness for T2 commonality. Less overhead can allow data transmission in preamble.

Block interleaving of L1 block can be performed for better robustness. The interleaving can be performed with fixed pre-defined number of L1 symbols (num_L1_sym) and a number of carriers spanned by L1 as a parameter (L1_span). The same technique is used for P2 preamble interleaving in DVB-T2.

L1 block of variable size can be used. Size can be adaptable to the amount of L1 signaling bits, resulting in a reduced overhead. Full spectrum efficiency can be obtained with no PAPR issue. Less than 7.61 MHz repetition can mean that more redundancy can be sent but unused. No PAPR issue can arise because of 7.61 MHz repetition rate for L1 block.

FIG. 74 is another example of L1 signaling transmitted within a frame header. This FIG. 74 is different from FIG. 70 in that the L1_span field having 12 bits it is divided into two fields. In other words, the L1_span field is divided into a L1_column having 9 bits and a L1_row having 3 bits. The L1_column represents the carrier index that L1 spans. Because data slice starts and ends at every 12 carriers, which is the pilot density, the 12 bits of overhead can be reduced by 3 bits to reach 9 bits.

L1_row represents the number of OFDM symbols where L1 is spanning when time interleaving is applied. Consequently, time interleaving can be performed within an area of L1_columns multiplied by L1_rows. Alternatively, a total size of L1 blocks can be transmitted such that L1_span shown in FIG. 70 can be used when time interleaving is not performed. For such a case, L1 block size is 11,776×2 bits in the example, thus 15 bits is enough. Consequently, the L1_span field can be made up of 15 bits.

FIG. 75 is an example of frequency or time interleaving/deinterleaving. The FIG. 75 shows a part of a whole transmission frame. The FIG. 75 also shows bonding of multiple 8 MHz bandwidths. A frame can consist of a preamble which transmits L1 blocks and a data symbol which transmits data. The different kinds of data symbols represent data slices for different services. As shown in FIG. 75, the preamble transmits L1 blocks for every 7.61 MHz.

For the preamble, frequency or time interleaving is performed within L1 blocks and not performed between L1 blocks. That is, for the preamble, it can be said that interleaving is performed at L1 block level. This allows decoding the L1 blocks by transmitting L1 blocks within a tuner window bandwidth even when the tuner window has moved to a random location within a channel bonding system.

For decoding data symbol at a random tuner window bandwidth, interleaving between data slices should not occur. That is, for data slices, it can be said that interleaving is performed at data slice level. Consequently, frequency interleaving and time interleaving should be performed within a data slice. Therefore, a symbol interleaver 308 in a data path of a BICM module of transmitter as shown in FIG. 37 can perform symbol interleaving for each data slice. A symbol interleaver 308-1 in an L1 signal path can perform symbol interleaving for each L1 block.

A frequency interleaver 403 shown in FIG. 42 needs to perform interleaving on the preamble and data symbols separately. Specifically, for the preamble, frequency interleaving can be performed for each L1 block and for data symbol, frequency interleaving can be performed for each data slice. At this point, time interleaving in data path or L1 signal path may not be performed considering low latency mode.

FIG. 76 is a table analyzing overhead of L1 signaling which is transmitted in a FECFRAME header at the ModCod Header Inserting module 307 on the data path of the BICM module as shown in FIG. 37. As seen in FIG. 76, for short LDPC block (size=16200), a maximum overhead of 3.3% can occur which may not be negligible. In the analysis, 45 symbols are assumed for FECFRAME protection and the preamble is a C2 frame specific L1 signaling and FECFRAME header is FECFRAME specific L1 signaling i.e., Mod, Cod, and PLP identifier.

To reduce L1 overhead, approaches according to two Data-slice types can be considered. For ACM/VCM type and multiple PLP cases, frame can be kept same as for the FECFRAME header. For ACM/VCM type and single PLP cases, the PLP identifier can be removed from the FECFRAME header, resulting in up to 1.8% overhead reduction. For CCM type and multiple PLP cases, the Mod/Cod field can be removed from the FECFRAME header, resulting in up to 1.5% overhead reduction. For CCM type and single PLP cases, no FECFRAME header is required, thus, up to 3.3% of overhead reduction can be obtained.

In a shortened L1 signaling, either Mod/Cod (7 bits) or PLP identifier (8 bits) can be transmitted, but it can be too short to get any coding gain. However, it is possible not to require synchronization because PLPs can be aligned with the C2 transmission frame; every ModCod of each PLP can be known from the preamble; and a simple calculation can enable synchronization with the specific FECFRAME.

FIG. 77 is showing a structure for a FECFRAME header for minimizing the overhead. In FIG. 77, the blocks with tilted lines and the FECFRAME Builder represent a detail block diagram of the ModCod Header Inserting module 307 on data path of the BICM module as shown in FIG. 37. The solid blocks represent an example of inner coding module 303, inner interleaver 304, bit demux 305, and symbol mapper 306 on the data path of the BICM module as shown in FIG. 37. At this point, shortened L1 signaling can be performed because CCM does not require a Mod/Cod field and single PLP does not require a PLP identifier. On this L1 signal with a reduced number of bits, the L1 signal can be repeated three times in the preamble and BPSK modulation can be performed, thus, a very robust signaling is possible. Finally, the ModCod Header Inserting module 307 can insert the generated header into each FEC frame. FIG. 84 is showing an example of the ModCod extracting module r307 on the data path of BICM demod module shown in FIG. 64.

As shown in FIG. 84, the FECFRAME header can be parsed (r301b), then symbols which transmit identical information in repeated symbols can be delayed, aligned, and then combined (Rake combining r302b). Finally, when BPSK demodulation (r303b) is performed, received L1 signal field can be restored and this restored L1 signal field can be sent to the system controller to be used as parameters for decoding. Parsed FECFRAME can be sent to the symbol demapper.

FIG. 78 is showing a bit error rate (BER) performance of the aforementioned L1 protection. It can be seen that about 4.8 dB of SNR gain is obtained through the a three time repetition. Required SNR is 8.7 dB at BER=1E-11.

FIG. 79 is showing examples of transmission frames and FEC frame structures. The FEC frame structures shown on the upper right side of the FIG. 79 represent FECFRAME header inserted by the ModCod Header Inserting module 307 in FIG. 37. It can be seen that depending on various combinations of conditions i.e., CCM or ACM/VCM type and single or multiple PLP, different size of headers can be inserted. Or, no header can be inserted. Transmission frames formed according to data slice types and shown on the lower left side of the FIG. 79 can be formed by the Frame header inserting module 401 of the Frame builder as shown in FIG. 42 and the merger/slicer module 208 of the input processor shown in FIG. 35. At this point, the FECFRAME can be transmitted according to different types of data slice. Using this method, a maximum of 3.3% of overhead can be reduced. In the upper right side of the FIG. 79, four different types of structures are shown, but a skilled person in the art would understand that these are only examples, and any of these types or their combinations can be used for the data slice.

At the receiver side, the Frame header removing module r401 of the Frame parser module as shown in FIG. 63 and the ModCod extracting module r307 of the BICM demod module shown in FIG. 64 can extract a ModCod field parameter which is required for decoding. At this point, according to the data slice types of transmission frame parameters can be extracted. For example, for CCM type, parameters can be extracted from L1 signaling which is transmitted in the preamble and for ACM/VCM type, parameters can be extracted from the FECFRAME header.

As shown in the upper right side of FIG. 79, the fecframe structure can be divided into two groups, in which the first group is the upper three frame structures with header and the second group is the last frame structure without header.

FIG. 80 is showing an example of L1 signaling which can be transmitted within the preamble by the Frame header inserting module 401 of the Frame builder module shown in FIG. 42. This L1 signaling is different from the previous L1 signaling in that L1 block size can be transmitted in bits (L1 size, 14 bits); turning on/off time interleaving on data slice is possible (dslice_time_intrlv, 1 bit); and by defining data slice type (dslice_type, 1 bit), L1 signaling overhead is reduced. At this point, when the data slice type is CCM, the Mod/Cod field can be transmitted within the preamble rather than within the FECFRAME header (plp_mod (3 bits), plp_fec_type (1 bit), plp_cod (3 bits)).

At the receiver side, the shortened/punctured inner decoder r303-1 of the BICM demod as shown in FIG. 64 can obtain the first LDPC block, which has a fixed L1 block size, transmitted within the preamble, through decoding. The numbers and size of the rest of the LDPC blocks can also be obtained.

Time interleaving can be used when multiple OFDM symbols are needed for L1 transmission or when there is a time-interleaved data slice. A flexible on/off of the time interleaving is possible with an interleaving flag. For preamble time interleaving, a time interleaving flag (1 bit) and a number of OFDM symbols interleaved (3 bits) may be required, thus, a total of 4 bits can be protected by a way similar to a shortened FECFRAME header.

FIG. 81 is showing an example of L1-pre signaling that can be performed at the ModCod Header Inserting module 307-1 on the data path of BICM module shown in FIG. 37. The blocks with tilted lines and Preamble Builder are examples of the ModCod Header Inserting module 307-1 on the L1 signaling path of the BICM module shown in FIG. 37. The solid blocks are examples of the Frame header inserting module 401 of the Frame builder as shown in FIG. 42.

Also, the solid blocks can be examples of shortened/punctured inner code module 303-1, inner interleaver 304-1, bit demux 305-1, and symbol mapper 306-1 on L1 signaling path of BICM module shown in FIG. 37.

As seen in FIG. 81, the L1 signal that is transmitted in the preamble can be protected using shortened/punctured LDPC encoding. Related parameters can be inserted into the Header in a form of L1-pre. At this point, only time interleaving parameters can be transmitted in the Header of the preamble. To ensure more robustness, a four times repetition can be performed. At the receiver side, to be able to decode the L1 signal that is transmitted in the preamble, the ModCod extracting module r307-1 on the L1 signaling path of BICM demod as shown in FIG. 64 needs to use the decoding module shown in FIG. 84. At this point, because there is a four times repetition unlike the previous decoding FECFRAME header, a Rake receiving process which synchronizes the four times repeated symbols and adding the symbols, is required.

FIG. 82 shows a structure of L1 the signaling block that is transmitted from the Frame header inserting module 401 of the Frame builder module as shown in FIG. 42. It is showing a case where no time interleaving is used in a preamble. As shown in FIG. 82, different kind of LDPC blocks can be transmitted in the order of the carriers. Once an OFDM symbol is formed and transmitted then a following OFDM symbol is formed and transmitted. For the last OFDM symbol to be transmitted, if there is any carrier left, that carriers can be used for data transmission or can be dummy padded. The example in FIG. 82 shows a preamble that comprises three OFDM symbol. At a receiver side, for this non-interleaving case, the symbol deinterleaver r308-1 on the L1 signaling path of BICM demodulator as shown in FIG. 64 can be skipped.

FIG. 83 shows a case where L1 time interleaving is performed. As shown in FIG. 83, block interleaving can be performed in a fashion of forming an OFDM symbol for identical carrier indices then forming an OFDM symbols for the next carrier indices. As in the case where no interleaving is performed, if there is any carrier left, that carriers can be used for data transmission or can be dummy padded. At a receiver side, for this non-interleaving case, the symbol deinterleaver r308-1 on the L1 signaling path of the BICM demodulator shown in FIG. 64 can perform block deinterleaving by reading LDPC blocks in increasing order of numbers of the LDPC blocks.

In addition, there can be at least two types of data slices. Data slice type 1 has dslice_type=0 in L1 signaling fields. This type of data slice has no XFECFrame header and has its mod/cod values in L1 signaling fields. Data slice type 2 has dslice_type=1 in L1 signaling fields. This type of data slice has XFECFrame header and has its mod/cod values in XFECFrame header.

XFECFrame means XFEC (compleX Forward Error Correction)Frame and mod/cod means modulation type/coderate.

At a receiver, a frame parser can form a frame from demodulated signals. The frame has data symbols and the data symbols can have a first type of data slice which has an XFECFrame and an XFECFrame header and a second type of data slice which has XFECFrame without XFECFrame header. Also, a receiver can extract a field for indicating whether to perform time de-interleaving on the preamble symbols or not to perform time de-interleaving on the preamble symbols, from the L1 of the preamble symbols.

At a transmitter, a frame builder can build a frame. Data symbols of the frame comprise a first type of data slice which has an XFECFrame and an XFECFrame header and a second type of data slice which has XFECFrame without XFECFrame header. In addition, a field for indicating whether to perform time interleaving on preamble symbols or not to perform time interleaving on preamble symbols can be inserted in L1 of the preamble symbols.

Lastly, for shortened/punctured code for the Frame header inserting module 401 of the Frame builder shown in FIG. 42, a minimum size of codeword that can obtain coding gain can be determined and can be transmitted in a first LDPC block. In this manner, for the rest of LDPC block sizes can be obtained from that transmitted L1 block size.

FIG. 85 is showing another example of L1-pre signaling that can be transmitted from ModCod Header Inserting module 307-1 on L1 signaling path of BICM module shown in FIG. 37. FIG. 85 is different from FIG. 81 in that Header part protection mechanism has been modified. As seen in FIG. 85, L1 block size information L1_size (14 bits) is not transmitted in L1 block, but transmitted in Header. In the Header, time interleaving information of 4 bits can be transmitted too. For total of 18 bits of input, BCH (45, 18) code which outputs 45 bits are used and copied to the two paths and finally, QPSK mapped. For the Q-path, 1 bit cyclic shift can be performed for diversity gain and PRBS modulation according to sync word can be performed. Total of 45 QPSK symbols can be output from these I/Q path inputs. At this point, if time interleaving depth is set as a number of preambles that is required to transmit L1 block, L1_span (3 bits) that indicates time interleaving depth may not need to be transmitted. In other words, only time interleaving on/off flag (1 bit) can be transmitted. At a receiver side, by checking only a number of transmitted preambles, without using L1_span, time deinterleaving depth can be obtained.

FIG. 86 is showing an example of scheduling of L1 signaling block that is transmitted in preamble. If a size of L1 information that can be transmitted in a preamble is Nmax, when L1 size is smaller than Nmax, one preamble can transmit the information. However, when L1 size is bigger than Nmax, L1 information can be equally divided such that the divided L1 sub-block is smaller than Nmax, then the divided L1 sub-block can be transmitted in a preamble. At this point, for a carrier that is not used because of L1 information being smaller than Nmax, no data are transmitted.

Instead, as shown in FIG. 88, power of carriers where L1 block are transmitted can be boosted up to maintain a total preamble signal power equal to data symbol power. Power boosting factor can be varied depending on transmitted L1 size and a transmitter and a receiver can have a set value of this power boosting factor. For example, if only a half of total carriers are used, power boosting factor can be two.

FIG. 87 is showing an example of L1-pre signaling where power boosting is considered. When compared to FIG. 85, it can be seen that power of QPSK symbol can be boosted and sent to preamble builder.

FIG. 89 is showing another example of ModCod extracting module r307-1 on L1 signaling path of BICM demod module shown in FIG. 64. From input preamble symbol, L1 signaling FECFRAME can be output into symbol demapper and only header part can be decoded.

For input header symbol, QPSK demapping can be performed and Log-Likelihood Ratio (LLR) value can be obtained. For Q-path, PRBS demodulation according to sync word can be performed and a reverse process of the 1-bit cyclic shift can be performed for restoration.

These aligned two I/Q path values can be combined and SNR gain can be obtained. Output of hard decision can be input into BCH decoder. The BCH decoder can restore 18 bits of L1-pre from the input 45 bits.

FIG. 90 is showing a counterpart, ModCod extractor of a receiver. When compared to FIG. 89, power control can be performed on QPSK demapper input symbols to restore from power level boosted by transmitter to its original value. At this point, power control can be performed by considering a number of carriers used for L1 signaling in a preamble and by taking an inverse of obtained power boosting factor of a transmitter. The power boosting factor sets preamble power and data symbol power identical to each other.

FIG. 91 is showing an example of L1-pre synchronization that can be performed at ModCod extracting module r307-1 on L1 signaling path of BICM demod module shown in FIG. 64. This is a synchronizing process to obtain a start position of Header in a preamble. Input symbols can be QPSK demapped then for the output Q-path, an inverse of 1 bit cyclic shift can be performed and alignment can be performed. Two I/Q paths values can be multiplied and modulated values by L1-pre signaling can be demodulated. Thus, output of multiplier can express only PRBS which is a sync word. When the output is correlated with a known sequence PRBS, a correlation peak at Header can be obtained. Thus, a start position of Header in a preamble can be obtained. If necessary, power control which is performed to restore original power level, as shown in FIG. 90, can be performed on input of QPSK demapper.

FIG. 92 is showing another example of L1 block header field which is sent to the Header Inserting module 307-1 on the L1 signaling path of the BICM module as shown in FIG. 37. This FIG. 92 is different from FIG. 85 in that L1_span which represents the time interleaving depth is reduced to 2 bits and reserved bits are increased by 1 bit. A receiver can obtain time interleaving parameter of L1 block from the transmitted L1_span.

FIG. 93 is showing processes of equally dividing a L1 block into as many portions as a number of preambles then inserting a header into each of the divided L1 blocks and then assigning the header inserted L1 blocks into a preamble. This can be performed when a time interleaving is performed with a number of preambles where the number of preambles is greater than a minimum number of preambles that is required for transmitting L1 block. This can be performed at the L1 block on the L1 signaling path of the BICM module as shown in FIG. 37. The rest of the carriers, after transmitting L1 blocks can have cyclic repetition patterns instead of being zero padded.

FIG. 94 is showing an example of the Symbol Demapper r306-1 of the BICM demod module as shown in FIG. 64. For a case where L1 FEC blocks are repeated as shown in FIG. 93, each starting point of L1 FEC block can be aligned, combined (r301f), and then QAM demapped (r302f) to obtain diversity gain and SNR gain. At this point, the combiner can include processes of aligning and adding each L1 FEC block and dividing the added L1 FEC block. For a case where only part of the last FEC block is repeated as shown in FIG. 93, only the repeated part can be divided into as many as a number of FEC block header and the other part can be divided by a value which is one less than a number of FEC block header. In other words, the dividing number corresponds to a number of carriers that is added to each carrier.

FIG. 98 is showing another example of L1 block scheduling. FIG. 98 is different from FIG. 93 in that, instead of performing zero padding or repetition when L1 blocks don t fill one OFDM symbol, OFDM symbol can be filled with parity redundancy by performing less puncturing on shortened/punctured code at the transmitter. In other words, when parity puncturing (304c) is performed at FIG. 38, the effective coderate can be determined according to the puncturing ratio, thus, by puncturing as less bits have to be zero padded, the effective coderate can be lowered and a better coding gain can be obtained. The Parity de-puncturing module r303a of a receiver as shown in FIG. 65 can perform de-puncturing considering the less punctured parity redundancy. At this point, because a receiver and a transmitter can have information of the total L1 block size, the puncturing ratio can be calculated.

FIG. 95 is showing another example of L1 signaling field. FIG. 95 is different from FIG. 74 in that, for a case where the data slice type is CCM, a start address (21 bits) of the PLP can be transmitted. This can enable FECFRAME of each PLP to form a transmission frame, without the FECFRAME being aligned with a start position of a transmission frame. Thus, padding overhead, which can occur when a data slice width is narrow, can be eliminated. A receiver, when a data slice type is CCM, can obtain ModCod information from the preamble at the L1 signaling path of the BICM demodulator as shown in FIG. 64, instead of obtaining it from FECFRAME header. In addition, even when a zapping occurs at a random location of transmission frame, FECFRAME synchronization can be performed without delay because the start address of PLP can be already obtained from the preamble.

FIG. 96 is showing another example of L1 signaling fields which can reduce the PLP addressing overhead.

FIG. 97 is showing the numbers of QAM symbols that corresponds to a FECFRAME depending on the modulation types. At this point, a greatest common divisor of QAM symbol is 135, thus, an overhead of log 2(135)≈7 bits can be reduced. Thus, FIG. 96 is different from FIG. 95 in that a number of PLP_start field bits can be reduced from 21 bits to 14 bits. This is a result of considering 135 symbols as a single group and addressing the group. A receiver can obtain an OFDM carrier index where the PLP starts in a transmission frame after obtaining the PLP_start field value and multiplying it by 135.

FIG. 99 and FIG. 101 show examples of symbol interleaver 308 which can time interleave data symbols which are sent from the ModCod Header Inserting module 307 on the data path of BICM module as shown in FIG. 37.

FIG. 99 is an example of Block interleaver which can operate on a data-slice basis. The row value means a number of payload cells in four of the OFDM symbols within one data-slice. Interleaving on OFDM symbol basis may not be possible because the number of cells may change between adjacent OFDM cells. The column value K means a time interleaving depth, which can be 1, 2, 4, 8, or 16 . . . . Signaling of K for each data-slice can be performed within the L1 signaling. Frequency interleaver 403 as shown in FIG. 42 can be performed prior to time interleaver 308 as shown in FIG. 37.

FIG. 100 shows an interleaving performance of the time interleaver as shown in FIG. 99. It is assumed that a column value is 2, a row value is 8, a data-slice width is 12 data cells, and that no continual pilots are in the data-slice. The top figure of FIG. 100 is an OFDM symbol structure when time interleaving is not performed and the bottom figure of FIG. 100 is an OFDM symbol structure when time interleaving is performed. The black cells represent scattered pilot and the non-black cells represent data cells. The same kind of data cells represents an OFDM symbol. In FIG. 100, data cells that correspond to a single OFDM symbol are interleaved into two symbols. An interleaving memory that corresponds to eight OFDM symbols is used but the interleaving depth corresponds to only two OFDM symbols, thus, full interleaving depth is not obtained.

FIG. 101 is suggested for achieving full interleaving depth. In FIG. 101, the black cells represent scattered pilots and the non-black cells represent data cells. Time interleaver as shown in FIG. 101 can be implemented in a form of block interleaver and can interleave data-slices. In FIG. 101, a number of column, K represents a data-slice width, a number of row, N represents time interleaving depth and the value, K can be random values i.e., K=1, 2, 3, . . . . The interleaving process includes writing data cell in a column twist fashion and reading in a column direction, excluding pilot positions. That is, it can be said that the interleaving is performed in a row-column twisted fashion.

In addition, at a transmitter, the cells which are read in a column twisted fashion of the interleaving memory correspond to a single OFDM symbol and the pilot positions of the OFDM symbols can be maintained while interleaving the cells.

Also, at a receiver, the cells which are read in a column twisted fashion of the deinterleaving memory correspond to a single OFDM symbol and the pilot positions of the OFDM symbols can be maintained while time de-interleaving the cells.

FIG. 102 shows time interleaving performance of FIG. 101. For comparison with FIG. 99, it is assumed that a number of rows is 8, a data-slice width is 12 data cells, and that no continual pilots are in the data-slice. In FIG. 102, data cells correspond to a single OFDM symbol are interleaved into eight OFDM symbols. As shown in FIG. 102, an interleaving memory that corresponds to eight OFDM symbols is used and the resulting interleaving depth corresponds to eight OFDM symbols, thus, full interleaving depth is obtained.

The time interleaver as shown in FIG. 101 can be advantageous in that full interleaving depth can be obtained using identical memory; interleaving depth can be flexible, as opposed to FIG. 99; consequently, a length of transmission frame can be flexible too, i.e., rows need not be multiples of four. Additionally, the time interleaver used for data slice, can be identical to the interleaving method used for the preamble and also can have commonality with a digital transmission system which uses general OFDM. Specifically, the time interleaver 308 as shown in FIG. 37 can be used before the frequency interleaver 403 as shown in FIG. 42 is used. Regarding a receiver complexity, no additional memory can be required other than additional address control logic which can require very small complexity.

FIG. 103 shows a corresponding symbol deinterleaver r308 in a receiver. It can perform deinterleaving after receiving output from the Frame Header Removing module r401. In the deinterleaving processes, compared to FIG. 99, the writing and reading processes of block interleaving are inverted. By using pilot position information, time deinterleaver can perform virtual deinterleaving by not writing to or reading from a pilot position in the interleaver memory and by writing to or reading from a data cell position in the interleaver memory. Deinterleaved information can be output into the ModCod Extracting module r307.

FIG. 104 shows another example of time interleaving. Writing in diagonal direction and reading row-by-row can be performed. As in FIG. 101, interleaving is performed taking into account the pilot positions. Reading and writing is not performed for pilot positions but interleaving memory is accessed by considering only data cell positions.

FIG. 105 shows a result of interleaving using the method shown in FIG. 104. When compared to FIG. 102, cells with the same patterns are dispersed not only in time domain, but also in the frequency domain. In other words, full interleaving depth can be obtained in both time and frequency domains.

FIG. 108 shows a symbol deinterleaver r308 of a corresponding receiver. The output of Frame Header Removing module r401 can be deinterleaved. When compared to FIG. 99, deinterleaving has switched the order of reading and writing. Time deinterleaver can use pilot position information to perform virtual deinterleaving such that no reading or writing is performed on pilot positions but so that reading or writing can be performed only on data cell positions. Deinterleaved data can be output into the ModCod Extracting module r307.

FIG. 106 shows an example of the addressing method of FIG. 105. NT means time interleaving depth and ND means data slice width. It is assumed that a row value, N is 8, a data-slice width is 12 data cells, and no continual pilots are in data-slice. FIG. 106 represents a method of generating addresses for writing data on a time interleaving memory, when a transmitter performs time interleaving. Addressing starts from a first address with Row Address (RA)=0 and Column Address (CA)=0. At each occurrence of addressing, RA and CA are incremented. For RA, a modulo operation with the OFDM symbols used in time interleaver can be performed. For CA, a modulo operation with a number of carriers that corresponds to a data slice width can be performed. RA can be incremented by 1 when carriers that correspond to a data slice are written on a memory. Writing on a memory can be performed only when a current address location is not a location of a pilot. If the current address location is a location of a pilot, only the address value can be increased.

In FIG. 106, a number of column, K represents the data-slice width, a number of row, N represents the time interleaving depth and the value. K can be a random values i.e., K=1, 2, 3, . . . . The interleaving process can include writing data cells in a column twist fashion and reading in column direction, excluding pilot positions. In other words, virtual interleaving memory can include pilot positions but pilot positions can be excluded in actual interleaving.

FIG. 109 shows deinterleaving, an inverse process of time interleaving as shown in FIG. 104. Writing row-by-row and reading in diagonal direction can restore cells in original sequences.

The addressing method used in a transmitter can be used in a receiver. Receiver can write received data on a time deinterleaver memory row-by-row and can read the written data using generated address values and pilot location information which can be generated in a similar manner with that of a transmitter. As an alternative manner, generated address values and pilot information that were used for writing can be used for reading row-by-row.

These methods can be applied in a preamble that transmits L1. Because each OFDM symbol which comprises preamble can have pilots in identical locations, either interleaving referring to address values taking into account the pilot locations or interleaving referring to address values without taking into account the pilot locations can be performed. For the case of referring to address values without taking into account the pilot locations, the transmitter stores data in a time interleaving memory each time. For such a case, a size of memory required to perform interleaving/deinterleaving preambles at a receiver or a transmitter becomes identical to a number of payload cells existing in the OFDM symbols used for time interleaving.

FIG. 107 is another example of L1 time interleaving. In this example, time interleaving can place carriers to all OFDM symbols while the carriers would all be located in a single OFDM symbol if no time interleaving was performed. For example, for data located in a first OFDM symbol, the first carrier of the first OFDM symbol will be located in its original location. The second carrier of the first OFDM symbol will be located in a second carrier index of the second OFDM symbol. In other words, i-th data carrier that is located in n-th OFDM symbol will be located in an i-th carrier index of (i+n) mod N th OFDM symbol, where i=0, 1, 2 number of carrier-1, n=0, 1, 2, N-1, and N is a number of OFDM symbols used in L1 time interleaving. In this L1 time interleaving method, it can be said that interleaving for all the OFDM symbols are performed a twisted fashion as shown in FIG. 107. Even though pilot positions are not illustrated in FIG. 107, as mentioned above, interleaving can be applied to all the OFDM symbols including pilot symbols. That is, it can be said that interleaving can be performed for all the OFDM symbols without considering pilot positions or regardless of whether the OFDM symbols are pilot symbols or not.

If a size of a LDPC block used in L1 is smaller than a size of a single OFDM symbol, the remaining carriers can have copies of parts of the LDPC block or can be zero padded. At this point, a same time interleaving as above can be performed. Similarly, in FIG. 107, a receiver can perform deinterleaving by storing all the blocks used in L1 time interleaving in a memory and by reading the blocks in the order in which they have been interleaved, i.e., in order of numbers written in blocks shown in FIG. 107.

When a block interleaver as shown in FIG. 106 is used, two buffers are used. Specifically, while one buffer is storing input symbols, previously input symbols can be read from the other buffer. Once these processes are performed for one symbol interleaving block, deinterleaving can be performed by switching order of reading and writing, to avoid memory access conflict. This ping-pong style deinterleaving can have a simple address generation logic. However, hardware complexity can be increased when using two symbol interleaving buffers.

FIG. 110 shows an example of a symbol deinterleaver r308 or r308-1 as shown in FIG. 64. This proposed embodiment of the invention can use only a single buffer to perform deinterleaving. Once an address value is generated by the address generation logic, the address value can be output from the buffer memory and in-placement operation can be performed by storing a symbol that is input into the same address. By these processes, a memory access conflict can be avoided while reading and writing. In addition, symbol deinterleaving can be performed using only a single buffer. Parameters can be defined to explain this address generation rule. As shown in FIG. 106, a number of rows of a deinterleaving memory can be defined as time interleaving depth, D and a number of columns of the deinterleaving memory can be defined as data slice width, W. Then the address generator can generate the following addresses.

i-th sample on j-th block, including pilot
$i = 0, 1, 2, \ldots, N-1$;
$N = D \cdot W$;
$C_{i,j} = i \bmod W$;
$T_w = ((C_{i,j} \bmod D) \cdot j) \bmod D$;

-continued $R_{i,j} = ((i \text{ div } W) + Tw) \mod D;$
$L_{i,j}(1) = R_{i,j} * W + C_{i,j};$
Or
$L_{i,j}(2) = C_{i,j} * D + R_{i,j};$ The addresses include pilot positions, thus, input symbols are assumed to include pilot positions. If input symbols that include only data symbols need to be processed, additional control logic which skips the corresponding addresses can be required. At this point, i represents an input symbol index, j represents an input interleaving block index, and N=D*W represents an interleaving block length. Mod operation represents modulo operation which outputs remainder after division. Div operation represents division operation which outputs quotient after division. R$_{i,j}$ and C$_{i,j}$ represent row address and column address of i-th symbol input of j-th interleaving block, respectively. Tw represents column twisting value for addresses where symbols are located. In other words, each column can be considered as a buffer where independent twisting is performed according to Tw values. L$_{i,j}$ represents an address when single buffer is implemented in an one dimension sequential memory, not in two dimension. L$_{i,j}$ can have values from 0 to (N−1). Two different methods are possible. L$_{i,j}$(1) is used when the memory matrix is connected row-by-row and L$_{i,j}$(2) is used when the memory matrix is connected in column-by-column.

FIG. 111 shows an example of row and column addresses for time deinterleaving when D is 8 and W is 12. J starts from j=0 and for each j value, a first row can represent the row address and a second row can represent the column address. The FIG. 111 shows only addresses of the first 24 symbols. Each column index can be identical to the input symbol index i.

FIG. 113 shows an example of an OFDM transmitter using a data slice. As shown in FIG. 113, the transmitter can comprise a data PLP path, an L1 signaling path, a frame builder, and an OFDM modulation part. The data PLP path is indicated by blocks with horizontal lines and vertical lines. The L1 signaling path is indicated by blocks with tilted lines. Input process modules 701-0, 701-N, 701-K, and 701-M can comprise blocks and sequences of input interface module 202-1, input stream synchronizing module 203-1, delay compensation module 204-1, null packet deletion module 205-1, CRC encoder 206-1, BB header inserting module 207-1, and BB scrambler 209 performed for each PLP as shown in FIG. 35. FEC modules 702-0, 702-N, 702-K, and 702-M can comprise blocks and sequences of outer coder 301 and inner coder 303 as shown in FIG. 37. An FEC modules 702-L1 used on the L1 path can comprise blocks and sequences of outer coder 301-1 and shortened/punctured inner coder 303-1 as shown in FIG. 37. L1 signal module 700-L1 can generate L1 information required to comprise a frame.

Bit interleave modules 703-0, 703-N, 703-K, and 703-M can comprise blocks and sequences of inner interleaver 304 and bit demux 305 as shown in FIG. 37. Bit interleaver 703-L1 used on the L1 path can comprise blocks and sequences of inner interleaver 304-1 and bit demux 305-1 as shown in FIG. 37. Symbol mapper modules 704-0, 704-N, 704-K, and 704-M can perform functions identical with the functions of the symbol mapper 306 shown in FIG. 37. The symbol mapper module 704-L1 used on L1 path can perform functions identical with the functions of the symbol mapper 306-1 shown in FIG. 37. FEC header modules 705-0, 705-N, 705-K, and 705-M can perform functions identical with the functions of the ModCod Header inserting module 307 shown in FIG. 37. FEC header module 705-L1 for the L1 path can perform functions identical with the functions of the ModCod Header inserting module 307-1 shown in FIG. 37.

Data slice mapper modules 706-0 and 706-K can schedule FEC blocks to corresponding data slices and can transmit the scheduled FEC blocks, where the FEC blocks correspond to PLPs that are assigned to each data slice. Preamble mapper 707-L1 block can schedule L1 signaling FEC blocks to preambles. L1 signaling FEC blocks are transmitted in preambles. Time interleaver modules 708-0 and 708-K can perform functions identical with the functions of the symbol interleaver 308 shown in FIG. 37 which can interleave data slices. Time interleaver 708-L1 used on L1 path can perform functions identical with the functions of the symbol interleaver 308-1 shown in FIG. 37.

Alternatively, time interleaver 708-L1 used on L1 path can perform identical functions with symbol interleaver 308-1 shown in FIG. 37, but only on preamble symbols.

Frequency interleavers 709-0 and 709-K can perform frequency interleaving on data slices. Frequency interleaver 709-L1 used on L1 path can perform frequency interleaving according to preamble bandwidth.

Pilot generating module 710 can generate pilots that are suitable for continuous pilot (CP), scattered pilot (SP), data slice edge, and preamble. A frame can be built (711) from scheduling the data slice, preamble, and pilot. The IFFT module 712 and GI inserting module 713 blocks can perform functions identical with the functions of the IFFT module 501 and the GI inserting module 503 blocks shown in FIG. 51, respectively. Lastly, DAC module 714 can convert digital signals into analog signals and the converted signals can be transmitted.

FIG. 114 shows an example of an OFDM receiver which uses data slice. In FIG. 114, tuner r700 can perform the functions of the tuner/AGC module r603 and the functions of the down converting module r602 shown in FIG. 61. ADC r701 can convert received analog signals into digital signals. Time/freq synchronizing module r702 can perform functions identical with the functions of the time/freq synchronizing module r505 shown in FIG. 62. Frame detecting module r703 can perform functions identical with the functions of the frame detecting module r506 shown in FIG. 62.

At this point, after time/frequency synchronization are performed, synchronization can be improved by using preamble in each frame that is sent from frame detecting module r703 during tracking process.

GI removing module r704 and FFT module r705 can perform functions identical with the functions of the GI removing module r503 and the FFT module r502 shown in FIG. 62, respectively.

Channel estimation module r706 and channel Equalization module r707 can perform a channel estimation part and a channel equalization part of the channel Est/Eq module r501 as shown in FIG. 62. Frame parser r708 can output a data slice and preamble where services selected by a user are transmitted. Blocks indicated by tilted lines process a preamble. Blocks indicated by horizontal lines which can include common PLP, process data slices. Frequency deinterleaver r709-L1 used on the L1 path can perform frequency deinterleaving within the preamble bandwidth. Frequency deinterleaver r709 used on the data slice path can perform frequency deinterleaving within data slice. FEC header decoder r712-L1, time deinterleaver r710-L1, and symbol demapper r713-L1 used on the L1 path can perform functions identical with the functions of the ModCod extracting module r307-1, symbol deinterleaver r308-1, and symbol demapper r306-1 shown in FIG. 64.

Bit deinterleaver r714-L1 can comprise blocks and sequences of bit demux r305-1 and inner deinterleaver r304-1 as shown in FIG. 64. FEC decoder r715-L1 can comprise blocks and sequences of shortened/punctured inner coder r303-1 and outer decoder r301-1 shown in FIG. 64. At this point, the output of the L1 path can be L1 signaling information and can be sent to a system controller for restoring PLP data that are transmitted in data slices.

Time deinterleaver r710 used on the data slice path can perform functions identical with the functions of the symbol deinterleaver r308 shown in FIG. 64. Data slice parser r711 can output user selected PLP from the data slices and, if necessary, common PLP associated with the user selected PLP. FEC header decoders r712-C and r712-K can perform functions identical with the functions of the ModCod extracting module r307 shown in FIG. 64. Symbol demappers r713-C and r713-K can perform functions identical with the functions of the symbol demapper r306 shown in FIG. 64.

Bit deinterleaver r714-C and r714-K can comprise blocks and sequences of bit demux r305 and inner deinterleaver r304 as shown in FIG. 64. FEC decoders r715-C and r715-K can comprise blocks and sequences of inner decoder r303 and outer decoder r301 as shown in FIG. 64. Lastly, output process modules r716-C and r716-K can comprise blocks and sequences of BB descrambler r209, BB header removing module r207-1, CRC decoder r206-1, null packet inserting module r205-1, delay recover r204-1, output clock recover r203-1, and an output interface r202-1 which are performed for each PLP in FIG. 35. If a common PLP is used, the common PLP and data PLP associated with the common PLP can be transmitted to a TS recombiner and can be transformed into a user selected PLP.

It should be noted from FIG. 114, that in a receiver, the blocks on the L1 path are not symmetrically sequenced to a transmitter as opposed to the data path where the blocks are symmetrically positioned or in opposite sequence of a transmitter. In other words, for the data path, Frequency deinterleaver r709, Time deinterleaver r710, Data slice parser r711, and FEC header decoder r712-C and r712-K are positioned. However, for the L1 path, Frequency deinterleaver r709-L1, FEC header decoder r712-L1, and time deinterleaver r710-L1 are positioned.

FIG. 112 shows an example of general block interleaving in a data symbol domain where pilots are not used. As seen from FIG. 112*a*, interleaving memory can be filled without black pilots. To form a rectangular memory, padding cells can be used if necessary. In FIG. 112*a*, padding cells are indicated as cells with tilted lines. In the example, because one continual pilot can overlap with one kind of scattered pilot pattern, a total of three padding cells are required during four of OFDM symbol duration. Finally, in FIG. 112*b*, interleaved memory contents are shown.

As in FIG. 112*a*, either writing row-by-row and performing column twisting; or writing in a twisted fashion from the beginning, can be performed. Output of the interleaver can comprise reading row-by-row from memory. The output data that has been read can be placed as shown in FIG. 112*c* when OFDM transmission is considered. At this time, for simplicity, frequency interleaving can be ignored. As seen in FIG. 112, frequency diversity is not as high as that of FIG. 106, but is maintained at a similar level. Most of all, it can be advantageous in that the memory required to perform interleaving and deinterleaving can be optimized. In the example, memory size can be reduced from W*D to (W−1)*D. As the data slice width becomes bigger, the memory size can be further reduced.

For time deinterleaver inputs, a receiver should restore memory buffer contents in a form of the middle figure of FIG. 112 while considering padding cells. Basically, OFDM symbols can be read symbol-by-symbol and can be saved row-by-row. Detwisting corresponding to column twisting can then be performed. The output of the deinterleaver can be output in a form of reading row-by-row from the memory of the FIG. 112*a*. In this fashion, when compared to the method shown in FIG. 106, pilot overhead can be minimized, and consequently interleaving/deinterleaving memory can be minimized.

Using the suggested methods and devices, among others advantages it is possible to implement an efficient digital transmitter, receiver and structure of physical layer signaling.

By transmitting ModCod information in each BB frame header that is necessary for ACM/VCM and transmitting the rest of the physical layer signaling in a frame header, signaling overhead can be minimized.

Modified QAM for a more energy efficient transmission or a more noise-robust digital broadcasting system can be implemented. The system can include transmitter and receiver for each example disclosed and the combinations thereof.

An Improved Non-uniform QAM for a more energy efficient transmission or a more noise-robust digital broadcasting system can be implemented. A method of using code rate of error correction code of NU-MQAM and MQAM is also described. The system can include transmitter and receiver for each example disclosed and the combinations thereof.

The suggested L1 signaling method can reduce overhead by 3~4% by minimizing signaling overhead during channel bonding.

It will be apparent to those skilled in the art that various modifications and variations can be made in the present invention without departing from the invention.

What is claimed is:

1. A transmitter for transmitting at least one broadcast signal having Physical Layer Pipe (PLP) data, the transmitter comprising:
   a Bose-Chadhuri-Hocquenghem (BCH) encoder to BCH encode the PLP data;
   a Low Density Parity Check (LDPC) encoder to LDPC encode the BCH encoded PLP data and output Forward Error Correction Frames (FECFrames);
   a bit interleaver to bit interleave data in the FECFrames;
   a mapper to map the bit interleaved data in the FECFrames onto constellations;
   an outer encoder to outer encode signaling information;
   a zero-padding module to insert zeros into the outer encoded signaling information;
   an inner encoder to inner encode the zero-inserted signaling information;
   a parity puncturing module to puncture parity bits of the inner encoded signaling information;
   a zero-removing module to remove the inserted zeros from the signaling information on which the parity puncturing is performed;
   a time-interleaver to perform time-interleaving the mapped data based on a skip operation, wherein the time-interleaver writes the mapped data into an interleaving block and reads out the written data from the interleaving block excluding cells which are skipped according to the skip operation, wherein the time-interleaving is performed by calculating positions for cells having the mapped data and the cells to be skipped based on a row index and a column index;
a frame builder to build a signal frame including preamble symbols and data symbols, wherein the preamble symbols include the zero-removed signaling information for the time interleaved data and the data symbols include the time interleaved data; and
a modulator to modulate data in the signal frame by an Orthogonal Frequency Division Multiplexing (OFDM) scheme, wherein the signaling information includes channel bonding information for the at least one broadcast signal.

2. The transmitter of claim 1, wherein the signaling information is repeated in the preamble symbols.

3. The transmitter of claim 1, wherein the signaling information include PLP ID information identifying each of the PLP data and FEC type information indicating the LDPC scheme for the long LDPC FECframe or the short LDPC FECframe.

4. The transmitter of claim 1, further comprising:
a second BCH encoder to BCH encode the signaling information; and
a second LDPC encoder to LDPC encode the BCH encoded signaling information.

5. A method of transmitting at least one broadcast signal having Physical Layer Pipe (PLP) data, the method comprising:
Bose-Chadhuri-Hocquenghem (BCH) encoding the PLP data;
Low Density Parity Check (LDPC) encoding the BCH encoded PLP data to output Forward Error Correction Frames (FECFrames);
bit interleaving data in the FECFrames;
mapping the bit interleaved data in the FECFrames onto constellations;
outer encoding signaling information;
zero-padding the outer encoded signaling information;
inner encoding the zero-padded signaling information;
parity puncturing the inner encoded signaling information;
zero-removing the signaling information on which the parity puncturing is performed;
performing time-interleaving the mapped data based on a skip operation, wherein the time-interleaving includes writing the mapped data into an interleaving block and reading out the written data from the interleaving block excluding cells which are skipped according to the skip operation, wherein the time-interleaving is performed by calculating positions for cells having the mapped data and the cells to be skipped based on a row index and a column index;
building a signal frame including preamble symbols and data symbols, wherein the preamble symbols include the zero-removed signaling information for the time interleaved data, and wherein the data symbols include the time interleaved data; and
modulating data in the signal frame by an Orthogonal Frequency Division Multiplexing (OFDM) scheme, wherein the signaling information includes channel bonding information for the at least one broadcast signal.

6. The method of claim 5, wherein the signaling information is repeated in the preamble symbols.

7. The method of claim 5, wherein the signaling information include PLP ID information identifying each of the PLP data and FEC type information indicating the LDPC scheme for the long LDPC FECframe or the short LDPC FECframe.

8. The method of claim 5, further comprising:
BCH encoding the signaling information; and
LDPC encoding the BCH encoded signaling information.

9. A receiver for receiving at least one broadcast signal having Physical Layer Pipe (PLP) data, the receiver comprising:
a demodulator to demodulate the at least one broadcast signal by an Orthogonal Frequency Division Multiplexing (OFDM) scheme;
a frame parser to parse a signal frame in the demodulated broadcast signal, wherein the signal frame includes preamble symbols and data symbols, wherein the data symbols include data on which a time interleaving is performed, wherein the time-interleaving includes writing the mapped data into an interleaving block and reading out the written data from the interleaving block excluding cells which are skipped according to a skip operation, wherein the time-interleaving is performed by calculating positions for cells having the mapped data and the cells to be skipped based on a row index and a column index;
a time-deinterleaver to time-deinterleave the data in the data symbols;
a zero-padding module to insert zeros into signaling information in the preamble symbols;
an inner decoder to inner decode the zero-inserted signaling information;
a zero-removing module to remove the inserted zeros from the inner decoded signaling information;
an outer decoder to outer decode the zero-removed signaling information;
a demapper to demap the time-deinterleaved data to output Forward Error Correction Frames (FECFrames);
a bit deinterleaver to bit deinterleave data in the FEC-Frames;
a Low Density Parity Check (LDPC) decoder to LDPC decode the bit deinterleaved data in the FECFrames; and
a Bose-Chadhuri-Hocquenghem (BCH) decoder to BCH decode the LDPC decoded data to output PLP data, wherein the preamble symbols include the signaling information for the PLP data, wherein the signaling information includes channel bonding information for the at least one broadcast signal.

10. The receiver of claim 9, wherein the signaling information is repeated in the preamble symbols.

11. The receiver of claim 9, wherein the signaling information include PLP ID information identifying each of the PLP data and FEC type information indicating the LDPC scheme for the long LDPC FECframe or the short LDPC FECframe.

12. The receiver of claim 9, further comprising:
an LDPC decoder to LDPC decode the signaling information; and
a BCH decoder to BCH decode the LDPC decoded signaling information.

13. A method of receiving at least one broadcast signal having Physical Layer Pipe (PLP) data, the method comprising:
demodulating the at least one broadcast signal by an Orthogonal Frequency Division Multiplexing (OFDM) scheme;
parsing a signal frame in the demodulated broadcast signal, wherein the signal frame includes preamble symbols and data symbols, wherein the data symbols include data on which a time interleaving is performed, wherein the time-interleaving includes writing the mapped data into an interleaving block and reading out the written data from the interleaving block excluding cells which are skipped according to a skip operation, wherein the time-interleaving is performed by calculating positions for cells having the mapped data and the cells to be skipped based on a row index and a column index;

performing time-deinterleaving on the data in the data symbols;

zero-padding signaling information in the preamble symbols;

inner decoding the zero-padded signaling information;

zero-removing the inner decoded signaling information;

outer decoding the zero-removed signaling information;

demapping the time-deinterleaved data to output Forward Error Correction Frames (FECFrames);

bit deinterleaving data in the FECFrames

Low Density Parity Check (LDPC) decoding the bit deinterleaved data in the FECFrames; and Bose-Chadhuri-Hocquenghem (BCH) decoding the LDPC decoded data to output PLP data, wherein the preamble symbols include the signaling information for the PLP data, and wherein the signaling information includes channel bonding information for the at least one broadcast signal.

14. The method of claim 13, wherein the signaling information is repeated in the preamble symbols.

15. The method of claim 13, wherein the signaling information include PLP ID information identifying each of the PLP data and FEC type information indicating the LDPC scheme for the long LDPC FECframe or the short LDPC FECframe.

16. The method of claim 13, further comprising:

LDPC decoding the signaling information; and

BCH decoding the LDPC decoded signaling information.

* * * * *